(12) United States Patent
Nishi et al.

(10) Patent No.: US 6,400,445 B2
(45) Date of Patent: Jun. 4, 2002

(54) METHOD AND APPARATUS FOR POSITIONING SUBSTRATE

(75) Inventors: Kenji Nishi; Yoshiki Kida; Masahiko Okumura, all of Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/801,792

(22) Filed: Mar. 9, 2001

Related U.S. Application Data

(60) Division of application No. 09/500,244, filed on Feb. 8, 2000, now Pat. No. 6,225,012, which is a continuation-in-part of application No. 09/095,023, filed on Jun. 9, 1998, now abandoned, which is a continuation-in-part of application No. 08/800,390, filed on Feb. 14, 1997, now abandoned, which is a continuation-in-part of application No. 08/678,788, filed on Jul. 11, 1996, now abandoned, and a continuation-in-part of application No. 08/605,787, filed on Feb. 22, 1996, now abandoned, which is a continuation-in-part of application No. 08/391,648, filed on Feb. 2, 1995, now abandoned.

(30) Foreign Application Priority Data

| Feb. 22, 1994 | (JP) | 6-24536 |
|---|---|---|
| Feb. 24, 1995 | (JP) | 7-36432 |
| Jul. 14, 1995 | (JP) | 7-178630 |
| Dec. 28, 1995 | (JP) | 7-343247 |
| Mar. 14, 1996 | (JP) | 8-57893 |
| Feb. 8, 1999 | (JP) | 11-29918 |

(51) Int. Cl.$^7$ .......................... G03B 27/42; G03B 27/58
(52) U.S. Cl. ........................ 355/72; 355/53; 356/614
(58) Field of Search ............... 430/5, 22, 30; 355/53, 72, 77; 414/783; 250/559.29; 356/614, 620, 621

(56) References Cited

U.S. PATENT DOCUMENTS

| 4,536,470 A | 8/1985 | Amendola et al. ............ 430/314 |
|---|---|---|
| 4,547,446 A | 10/1985 | Tam ............................. 430/22 |
| 4,699,515 A | 10/1987 | Tanimoto et al. ............. 356/401 |
| 4,887,904 A | * 12/1989 | Nakazato et al. ............. 356/621 |
| 4,918,320 A | 4/1990 | Hamasaki et al. ............ 250/548 |
| 4,941,745 A | 7/1990 | Sugiyama ..................... 356/401 |
| 5,142,156 A | 8/1992 | Ozawa et al. ................ 250/548 |
| 5,168,021 A | 12/1992 | Arai et al. ...................... 430/22 |
| 5,194,743 A | 3/1993 | Aoyama et al. .............. 250/548 |
| 5,243,195 A | 9/1993 | Nishi ........................... 250/548 |
| 5,420,663 A | * 5/1995 | Nakajima et al. ............. 355/50 |
| 5,438,209 A | * 8/1995 | Yamamoto et al. ..... 250/559.29 |
| 5,511,934 A | * 4/1996 | Bacchi et al. ................ 414/783 |
| 5,513,948 A | * 5/1996 | Bacchi et al. ................ 414/783 |

FOREIGN PATENT DOCUMENTS

| JP | 63-107139 | 5/1988 |
|---|---|---|
| JP | 63-280435 | 11/1988 |
| JP | 4-129209 | 4/1992 |
| JP | 7-288276 | 10/1995 |
| JP | 8-236419 | 9/1996 |

* cited by examiner

Primary Examiner—Russell Adams
Assistant Examiner—Rodney E Fuller
(74) Attorney, Agent, or Firm—Armstrong, Westerman & Hattori, LLP

(57) ABSTRACT

A method and apparatus for positioning a wafer with respect to a reticle in a projection exposure apparatus for a photolithographic process capable of high speed search alignment of a wafer without any limitation imposed on the arrangement of the search marks on the wafer. For the first wafer in one lit, a first alignment sensor system is used to detect the positions of first and second search marks, and define a coordinate system with reference to the positions of the search marks based on the detection results. Then, while the first search mark is detected by the first alignment sensor system, the position of a street-line is detected by a second alignment sensor system and stored. For any of the second and later wafers in the lot, while the first search mark is detected by the first alignment sensor system, the position of a street-line is detected by the second alignment sensor system, and the offsets between the detected position and the stored position are used to define a coordinate system which refers to the search marks.

14 Claims, 28 Drawing Sheets

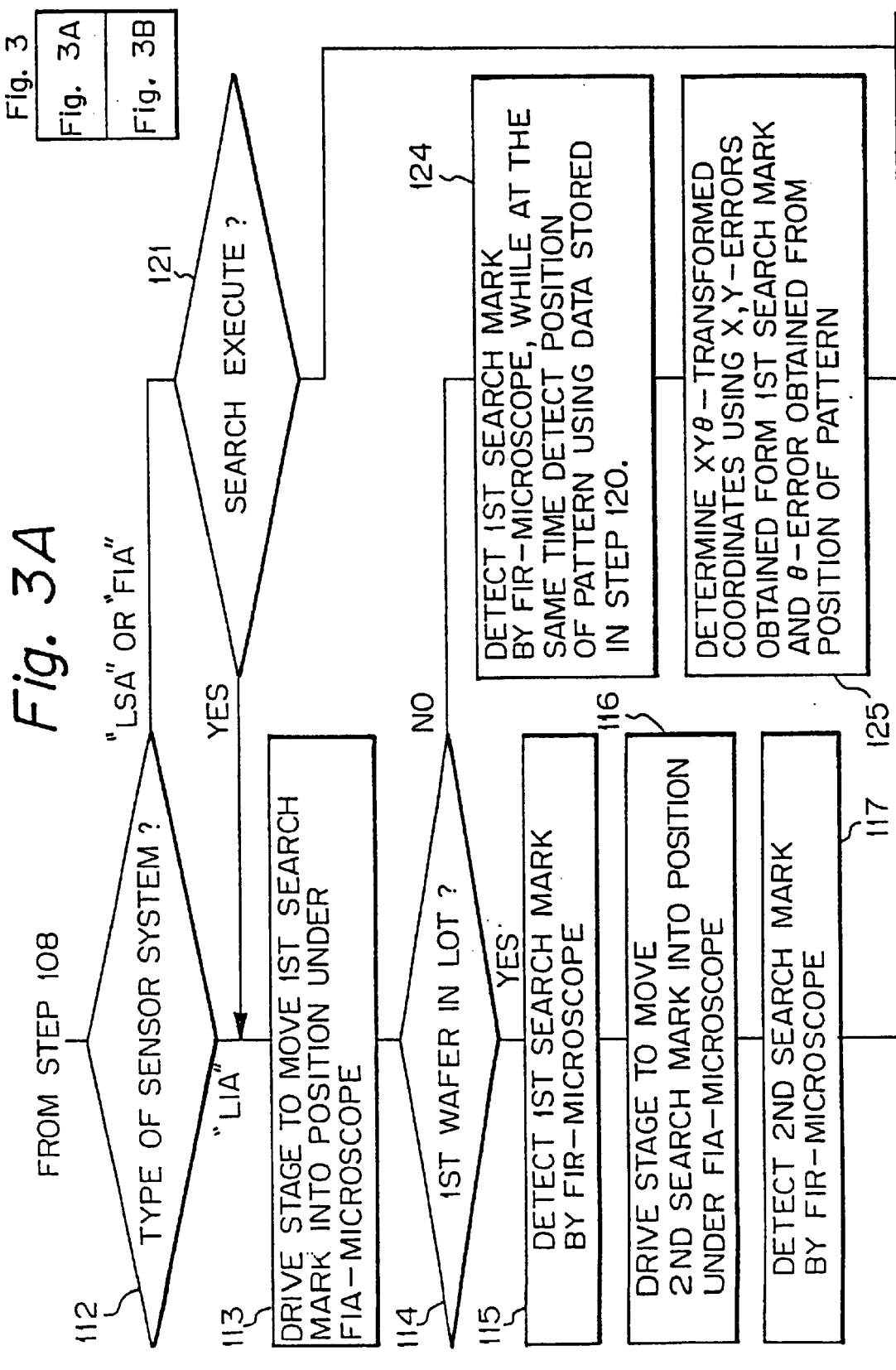

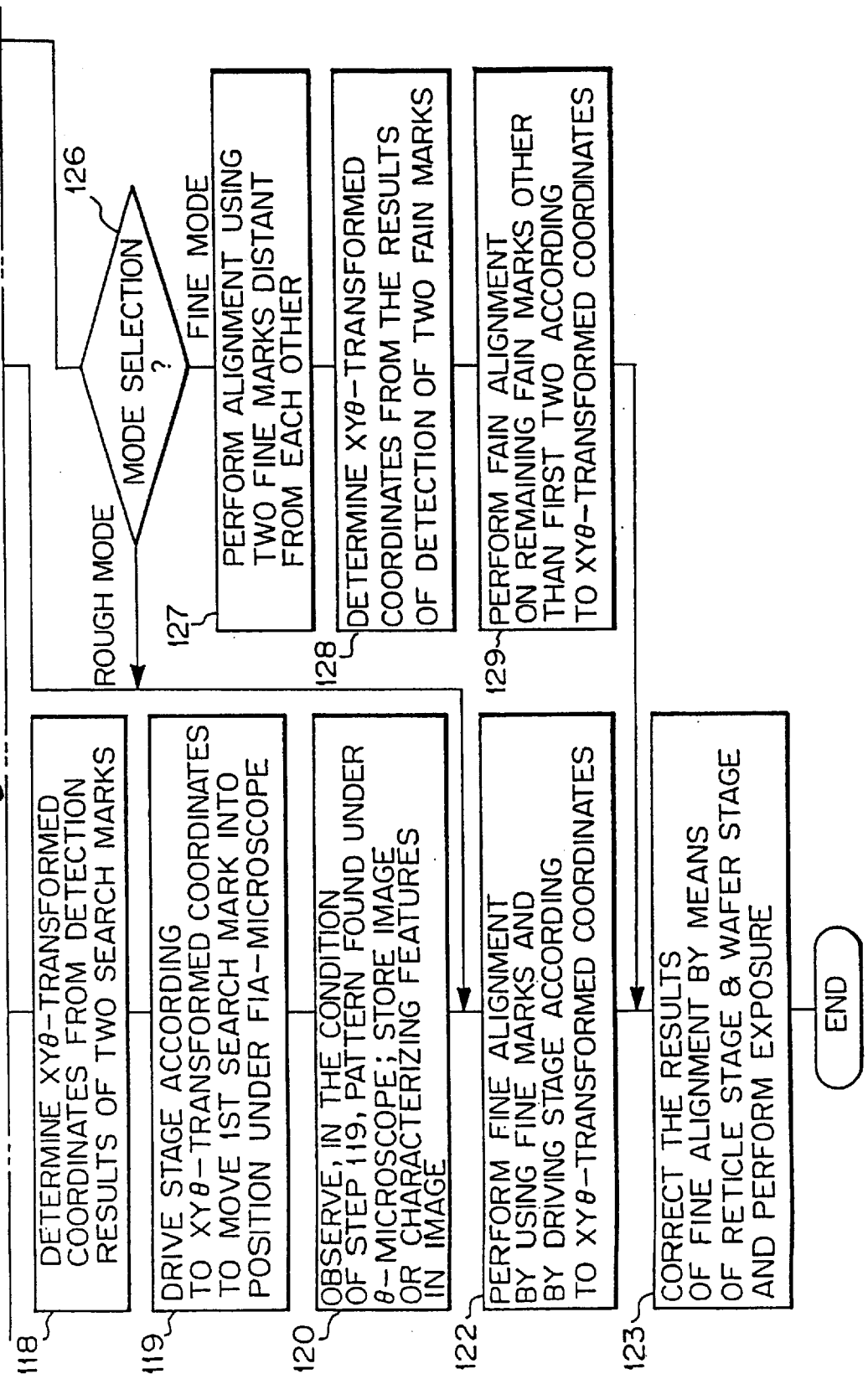

NON-MEASUREMENT DIRECTION

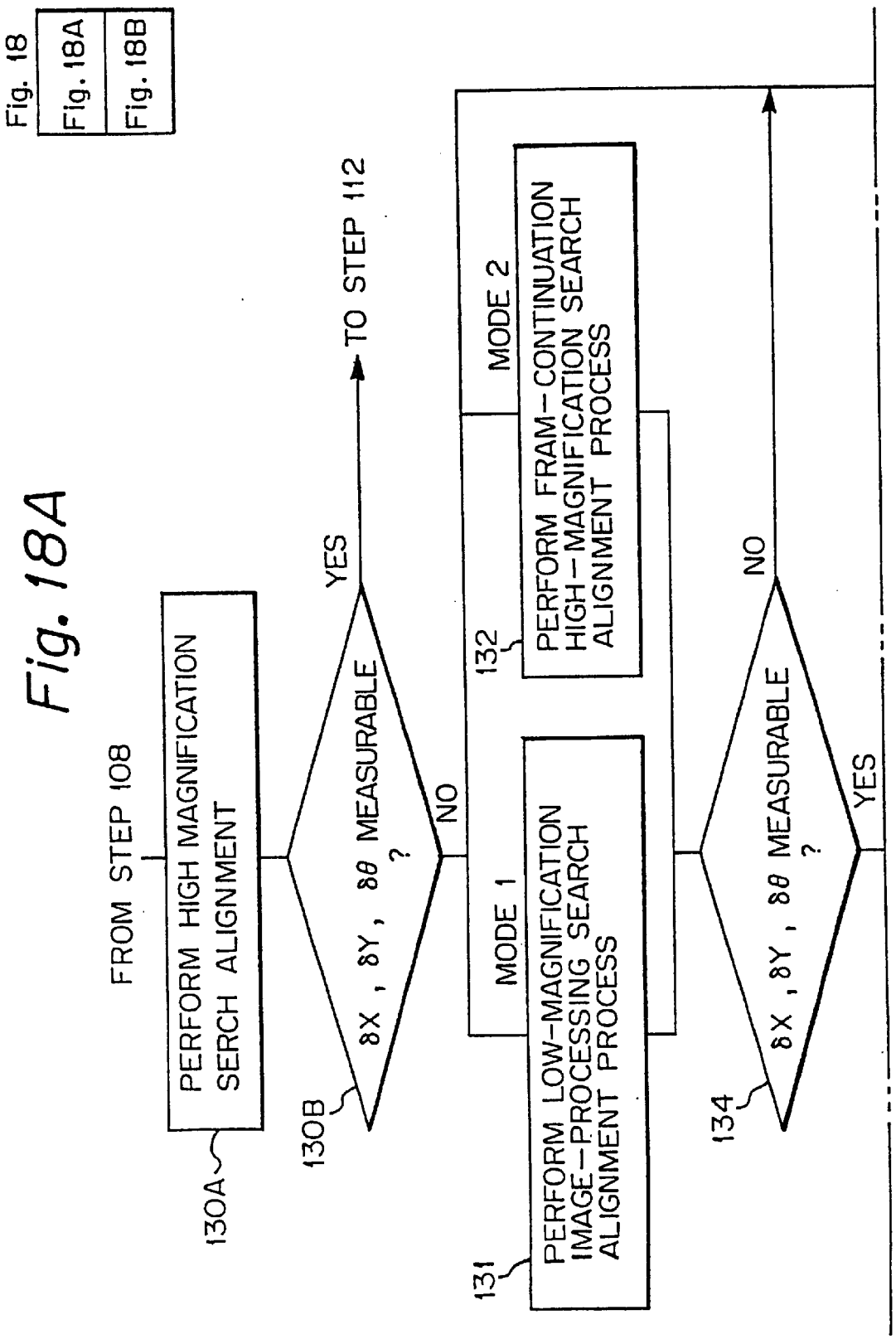

METHOD AND APPARATUS FOR POSITIONING SUBSTRATE

This application is a divisional of prior application Ser. No. 09/500,244, filed Feb. 8, 2000 is now U.S. Pat. No. 6,225,012, which is a continuation-in-part application of U.S. Continuation-in-Part Application Ser. No. (09/095,023) filed on (Jun. 9, 1998) now abandoned which is a continuation-in-part application of U.S. Continuation-in-Part Application Ser. No. (08/800,390) filed on (Feb. 14, 1997) now abandoned of U.S. patent application Ser. No. (08/678,788), filed on (Jul. 11th, 1996) now abandoned and U.S. Continuation-in-part Application Ser. No. (08/605,787) filed on (Feb. 22, 1996) now abandoned of U.S. Continuation-in-Part application Ser. No. (08/391,648), filed on (Feb. 2, 1995) now abandoned. Application Ser. No. 08/605,787 is incorporated herein by reference in its entirety.

BACKGROUND OF THE INVENTION

The present invention relates to a method for positioning a photosensitized substrate for printing a pattern on the mask onto the photosensitized substrate in an exposure apparatus used in a photolithographic process for fabricating semiconductor devices, image pick-up devices (such as charge-coupled devices), liquid crystal displays, thin film magnetic heads or the like. In particular, it relates to such a positioning method suitable for performing a coarse alignment (or prealignment) operation of a photosensitized substrate on a stage in an exposure apparatus.

In any of various exposure apparatuses used for fabrication of semiconductor devices, liquid crystal displays or the like including a projection exposure apparatus (such as a stepper) and a proximity printing exposure apparatus, in order to transfer a circuit pattern formed on a mask or reticle onto a photoresist film formed on a photosensitized substrate such as a wafer (or a glass plate, etc.) with high registration, it is required to establish alignment between the reticle and the wafer with precision.

For this purpose, there have been proposed various types of alignment sensor systems including: "laser step alignment (LSA) type" in which a wafer has an alignment mark formed thereon which comprises a linear array of dots, and a laser beam illuminates the alignment mark to produce diffracted or scattered beams, which are used to detect the position of the alignment mark (such as disclosed in U.S. Pat. No. 5,243,195); "field image alignment (FIA) type" in which an image-sensing device is used to take an image of an alignment mark which is illuminated by illumination light having a continuous spectrum of a wide wavelength range obtainable from a halogen lamp, and the picture data of the image is subjected to an image processing to measure the position of the alignment mark; and "laser interferometric alignment (LIA) type" in which a wafer has an alignment mark formed thereon which comprises a diffraction grating, two laser beams having different frequencies with a small difference between them illuminate the alignment mark from different directions to produce two diffracted beams interfering with each other, and the position of the alignment mark is determined from the phase of the interference. There have been also proposed various alignment techniques which may be categorized into three types including: "through-the-lens (TTL) type" in which the position of the wafer is measured through a projection optical system; "through-the-reticle (TTR) type" in which the relative position of a wafer with respect to a reticle is measured through both a projection optical system and the reticle; and "off-axis type" in which the position of the wafer is measured directly, or not through a projection optical system.

By using any of these alignment sensor systems to detect respective positions of two points on a wafer which is placed on a wafer stage, the rotational position (or rotational angle) of the wafer may be determined in addition to the position of the wafer with respect to the translational displacement. Alignment sensor systems usable for determining the rotational angle of a wafer include LIA-type system using TTL-type technique, LSA-type system using TTL-type technique, FIA-type system using off-axis-type technique, and others.

The exposure apparatus is required not only to have the ability of establishing alignment with precision between a reticle and a wafer by using the detection results obtained from the alignment sensor, but also to quickly establish such alignment so as to keep high throughput (the number of wafers that can be processed per unit of time). Thus, it is needed to realize highly effective operations in all the steps performed in relation to the exposure apparatus, from a transfer operation of a wafer onto the wafer stage to an exposure operation. Here, we will describe with reference to FIG. 1 the operations in the wafer loading step preceding the final wafer alignment step, as performed in a typical prior art exposure apparatus.

FIG. 1 shows a part of a wafer stage and the associated elements for a typical prior art exposure apparatus, for illustrating a wafer transfer mechanism. In FIG. 1, a lift device 19 is mounted on an X-stage 11 through a linear actuator 20. A substrate or wafer 6 has been loaded onto the lift device 19 from a wafer transfer unit (not shown). The lift device 19 has three support pins (of which only two support pins 19a and 19b are shown in FIG. 1) extending vertically through openings formed in a material support 9, a θ-rotation correction mechanism 8 and a wafer holder 7. The linear actuator 20 acts on the lift device 19 to lower/raise the three support pins, so as to lift down/up the wafer 6 for placing it onto and removing it from the wafer holder 7. Each support pin has at its tip end a hole selectively communicable with a vacuum source, which sucks the bottom surface of the wafer 6 to hold it, so as to prevent the wafer 6 from displacing horizontally upon vertical movements of the lift device 19.

Conventionally, a contact-prealignment process is used in which the peripheral edge of the wafer 6 is pressed against and engaged with a plurality of pins after the lift device 19 is lowered to place the wafer 6 onto the wafer holder 7. This prealignment process establish coarse alignment of the wafer 6 with respect to the rotational and translational offsets before the wafer 6 is held by vacuum suction to the wafer holder 7.

After the wafer 6 is held by vacuum suction and fixed to the wafer holder 7 in this manner, an alignment sensor system of a suitable type, such as the LSA type or the FIA type, is used to detect the alignment marks (search marks) formed on the wafer 6 at positions diametrically opposite to each other and produce detection signals. A movable mirror 13 mounted on the material support 9 and the associated laser interferometer disposed outside of the material support 9 together serve to measure the coordinates of the position of the material support 9. By determining such coordinates when the detection signals is at a peak, the translational errors and the rotational error of the wafer in terms of the wafer stage coordinate system are determined. The θ-rotation correction mechanism (or θ-table) is driven to vanish the rotational error of the wafer 6, so that the alignment in the rotational direction between the reticle and the wafer 6 (search alignment) is performed.

In this prior art technique, the θ-rotation correction mechanism 8 for rotating the wafer is disposed between material support 9 and the wafer 6, while the wafer stage coordinate system is defined with reference to the material support 9. Thus, there have been many problems including unwanted horizontal displacements of the wafer 6 which may occur due to insufficient suction for the vacuum-holding of the wafer by the wafer holder 7, a poor rigidity of the wafer stage due to the provision of various complicated mechanisms on the material support 9, as well as a poor controllability of the wafer stage due to the heavy weight thereof imposed by such complicated mechanisms. These problems could not be solved by disposing a θ-rotation correction mechanism under the material support 9 because the incident angle of the laser beam from the laser interferometer into the movable mirror 13 fixedly mounted on the material support 9 would change when the rotation angle of the wafer 6 is adjusted by driving the θ-rotation correction mechanism, so that the range of rotation angle of the θ-rotation correction mechanism would be limited, resulting in a disadvantage that errors in prealignment could not be corrected unless they are sufficiently small.

Furthermore, in this prior art exposure apparatus, the translational errors and the rotational error of the wafer 6 is detected by measuring the positions of two alignment marks (search marks) formed on the wafer 6 and distant from each other by means of a single alignment sensor system of the LSA or the FIA type, after the wafer 6 is held on the wafer holder 7. However, in order to detect two distant alignment marks by means of a single alignment sensor system, the wafer 6 has to be moved so as to position the alignment marks sequentially into the detection area of the alignment sensor system, and this operation has to be repeated for each of the wafers in one lot, resulting in low throughput of the exposure process. This problem could not be conveniently solved by providing two alignment sensor systems for simultaneous detection of the two alignment marks, because the arrangement of the two alignment sensor systems on the exposure apparatus imposes a limitation on the arrangement of the two alignment marks on the wafer 6, so that it would be difficult for such exposure apparatus to accommodate wafers of different sizes, for example.

In this relation, the last problem could not be conveniently solved by providing an adjustor mechanism for adjusting the distance between the two alignment sensor systems because such adjustor mechanism has to be inherently complicated, is difficult to dispose in the space around the wafer stage where various sensors and other components are closely disposed, and tends to increase the manufacture costs.

Also, various contact-prealignment mechanisms have been used to establish coarse alignment after the wafer has been placed on the wafer holder 7. However, there is an disadvantage that high throughput can not be obtained when the prealignment operation has to be performed after the wafer has been placed on the wafer holder. Nevertheless, it is desirable that any exposure apparatus having a newly proposed prealignment mechanism which may provide high throughput, may be capable of providing the matching with another, existing exposure apparatus having a conventional contact-prealignment mechanism.

The orientation of a wafer can be corrected to meet a predefined reference by performing the prealignment process, in which a noncontact-type prealignment mechanism is used to measure the outer contour of the peripheral edge of the wafer and the orientation of the wafer is so corrected as to coincide with the reference. However, this prealignment process still suffers from a problem: in the case that the alignment marks on the surface of a wafer, which have been formed through a previous lithographic process, offset (in a rotational direction) away from the desired positions that are predefined relative to the geometrical features (such as an orientation flat and a notch) defined by the configuration of the peripheral edge of the wafer, the fine alignment process following the prealignment process may not be performed efficiently, or it may even be impossible at all to perform the fine alignment process so the wafer has to be rejected as a failure.

SUMMARY OF THE INVENTION

It is an object of the present invention to provide a method for positioning a substrate which contributes to enhance the rigidity of a wafer stage and reduce the weight of the wafer stage, resulting in that the positioning operation of a wafer upon loading of a wafer by, for example, a wafer loader system onto the wafer stage, can be quickly performed with precision.

It is another object of the present invention to provide a method for positioning a substrate by which when the positioning operation of a wafer is performed using a wafer stage and with reference to the positions of alignment marks formed on a wafer, the positioning operation can be quickly performed without any limitation imposed on the arrangement of the alignment marks.

It is a further object of the present invention to provide a method for positioning a substrate which may achieve high matching accuracy for the prealignment with other exposure apparatus in which a contact-prealignment process is utilized.

It is further object of the present invention to provide a method for positioning a substrate, such as a wafer, in which a fine alignment process may be performed with high efficiency even for such a wafer having its alignment marks the position of which are displaced or offset from the desired positions represented by the geometrical features of the wafer, so as to improve productivity of the products to be fabricated on the wafer, such as microdevices or others.

According to a first aspect of the present invention, there is provided a method for positioning a substrate on a two-dimensionally movable substrate stage, the substrate having a peripheral edge with a cutout formed therein, the method comprising the steps of: (a) transferring the substrate to a loading position above the substrate stage; (b) measuring, at the loading position, positions of a measurement point on the cutout formed in the peripheral edge of the substrate and of another measurement point on the peripheral edge of the substrate, by using a noncontact-measurement technique; and (c) determining a rotational error of the substrate based on the measurement results obtained through the step (b).

In this alignment method, if the cutout formed in the peripheral edge of the substrate comprises a notch as shown in FIG. 6(b), the measurement of the position at the measurement point on the cutout may be preferably made by a two-dimensional image processing unit. Further, for the substrate having a notch, the two-dimensional, positional offsets (translational errors) and the rotational error of the substrate may be detected by performing one-dimensional position measurement at one additional measurement point on the peripheral edge of the substrate other than the measurement point on the notch.

On the other hand, if the cutout formed in the peripheral edge of the substrate comprises an orientation flat, the position measurement may be made at any of the measurement points on the peripheral edge of the substrate by image processing units, and one-dimensional position measurement may be sufficient for the purpose. However, when one-dimensional position measurement is used, the measurement are performed at measurement points including one on the orientation flat and at least two other measurement points (hence at least three measurement points in total) in order to detect the two-dimensional offsets and the rotational error of the substrate. In either case, the two-dimensional offsets may be corrected by adding the offsets to the target position of the alignment in the subsequent search alignment process. By virtue of this method, a rotational correction mechanism on the substrate stage may be eliminated and the accuracy is improved.

According to a second aspect of the present invention, there is provided a method for positioning a substrate on a two-dimensionally movable substrate stage, comprising the steps of: (a) forming on each substrate first and second search marks each for indicating a two-dimensional position; (b) detecting two-dimensional positions of the first and second search marks on a first substrate; (c) determining a rotational error of the first substrate based on the two-dimensional positions detected through the step (b); (d) detecting and storing an at least one-dimensional position of a pattern spaced a predetermined distance from the first search mark on the first substrate, while detecting a two-dimensional position of the first search mark; (e) detecting an offset, from the position stored through the step (d), of the pattern spaced the predetermined distance from the first search mark, while detecting a two-dimensional position of the first search mark on a second substrate on the substrate stage, so as to determine from the offset positional error an offset positional error of the second substrate.

In this positioning method, for the second substrate, the first search mark is positioned in the detection area of a predetermined first alignment sensor system, and then the position of a pattern (such as a street-line) in the detection area of a second alignment sensor system spaced a predetermined distance form the first alignment sensor is compared with the stored position for the first substrate, and any alignment error may be determined form the results of this comparison. Thus, for the second substrate, it is unnecessary to perform the detection of the position of the second search mark, and the detection of the position of the pattern in the detection area under the second alignment sensor system together with the detection of the first search mark by the first alignment sensor system at the same time may be sufficient for establishing alignment of the second substrate, resulting in a reduce time required for the measurement.

According to a third aspect of the present invention, there is provided a method for positioning a substrate on a two-dimensionally movable substrate stage, the substrate having a peripheral edge with a cutout formed therein, the method comprising the steps of: (a) transferring the substrate to a loading position above the substrate stage; (b) measuring, at the loading position, positions of a measurement point on the cutout formed in the peripheral edge of the substrate and of another measurement point on the peripheral edge of the substrate, by using a two-dimensional image processing system and a noncontact-measurement technique; (c) determining, in the observation fields of the two-dimensional image processing system, imaginary points corresponding to reference points which would be used for positioning the substrate on the substrate stage by using a contact-positioning technique; and (d) using offsets, from the imaginary points, of the positions of the measurement points measured by the two-dimensional image processing systems, to make a prediction of a position of the substrate which will be found when the substrate has been placed on the substrate stage.

In this positioning method, the rotational error of the substrate is detected at the loading position of the substrate distant from the substrate stage, so that the rotational error may be corrected through the substrate lift means while the substrate is lowered from the loading position onto the substrate stage. Therefore, it is unnecessary to provide a rotation correction mechanism on the substrate stage side, and thereby the substrate stage may have a relatively simple construction, an improved rigidity and a reduced weight, resulting in that the alignment operation of the substrate may be quickly performed with precision upon loading of the substrate from a substrate transfer system (such as a wafer loader system) onto the substrate stage.

Further, the imaginary points corresponding to reference points which would be used for positioning the substrate on the substrate stage by using a contact-positioning technique, are determined in the observation fields of the two-dimensional image processing system. Also, the offsets, from the imaginary points, of the positions of the measurement points on the photosensitized substrate measured by the two-dimensional image processing system are used to establish alignment of the substrate. Therefore, a high matching accuracy for the coarse positioning (prealignment) process, with another exposure apparatus in which a contact-positioning (prealignment) process is performed, may be obtained.

Further, in this positioning method, if the cutout formed in the peripheral edge of the substrate comprises a V-shaped notch, the measurement points for the two-dimensional image processing system may preferably include one on the cutout and two on respective portions of the peripheral edge of the substrate other than the cutout. In this case, the cutout is a recess such as a notch, and thus the detection of the positions at the three measurement points enables identification of the rotational angle and the two-dimensional position of the substrate.

On the other hand, if the cutout formed in the peripheral edge of the substrate comprises a flat edge portion, the measurement points for the two-dimensional image processing system may preferably include two on the cutout and one on a portion of the peripheral edge of the substrate other than the cutout. In this case, the cutout is a flat cutout such as an orientation flat, and thus the detection of the positions at the three measurement points enables identification of the rotational angle and the two-dimensional position of the substrate.

Furthermore, it is preferable, in order to make the prediction of the position of the substrate which will be found when the substrate has been placed on the substrate stage, to obtain a rotational error and offsets between a position of the substrate which will be found when the substrate has been placed on the substrate stage through the substrate lift means without any rotation effected thereby and a position of the substrate which would be found when the substrate had been positioned by using the contact-positioning technique, to correct the rotational error when the substrate is placed onto the substrate stage through the substrate lift means, and to correct the offsets through the substrate stage after the substrate has been placed on the substrate stage. This enables simplification of the construction of the substrate stage and a quick alignment of the substrate.

BRIEF DESCRIPTION OF THE DRAWINGS

The above and other objects, features and advantages of the present invention will be apparent from the following detailed description of preferred embodiments thereof, reference being made to the accompanying drawings, in which:

FIG. 3 shows the relation between FIG. 3A and FIG. 3B: FIGS. 3A and 3B are flow charts illustrating a search alignment process and a fine alignment process in the positioning method according to the embodiment of the present invention;

FIG. 18 shows the relation between FIG. 18A and FIG. 18B: FIGS. 18A and 18B are flow charts illustrating exemplified operations for determining whether a wafer replacement is to be performed and for performing the wafer replacement;

DETAILED DESCRIPTION OF THE INVENTION

Referring now to the accompanying drawings and in particular to FIGS. 2 to 17 thereof, a positioning method according to an embodiment of the present invention will be described in detail. This embodiment is an exemplified application of the present invention to a loading and alignment processes performed in a stepper-type projection exposure apparatus in which a pattern on a reticle is projected with demagnification through a projection optical system onto each shot area on a wafer.

Figure 4:
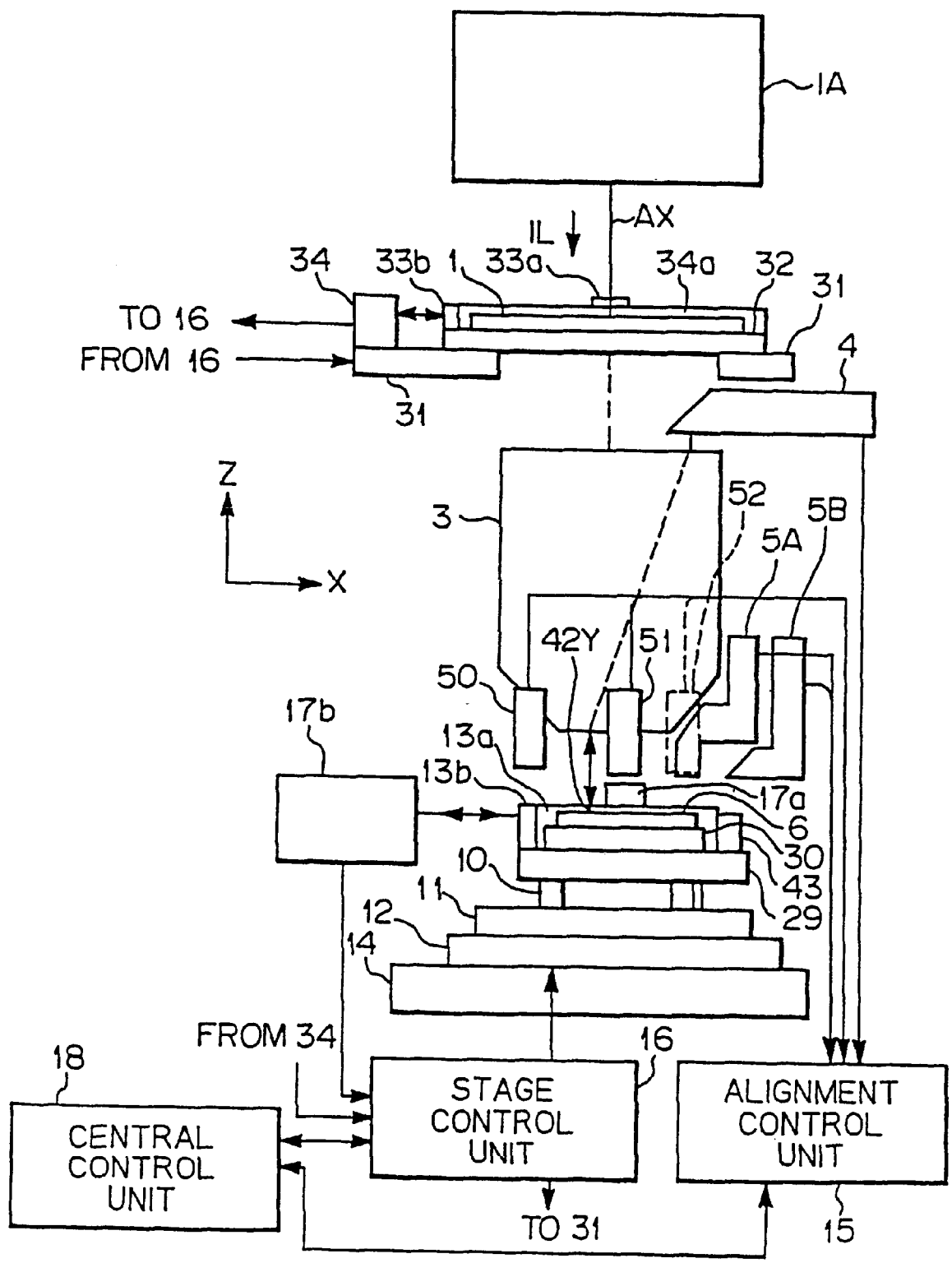
FIG. 4 is a schematic representation of a projection exposure apparatus which may be used for implementing the positioning method of FIGS. 2 and 3.

FIG. 4 shows a schematic representation of a projection exposure apparatus which may be used for implementing the alignment method of the embodiment. As shown in FIG. 4, the projection exposure apparatus includes an illumination optical system IA comprising a light source such as a mercury-vapor lamp, a fly-eye lens and a condenser lens. The illumination optical system IA emits an illumination light beam IL, with which an image of a pattern on a reticle 1 is projected through a projection optical system 3 onto a photoresist-coated wafer 6 within each of shot areas defined thereon, by projection exposure with a given demagnification ration of, for example, 4:1, 5:1, or others. In order to specify positions and directions in this arrangement, we define here a three-dimensional, rectangular, XYZ-coordinate system with the Z-axis extending parallel to the optical axis AX of the projection optical system 3 in FIG. 4, the X-axis perpendicular to the Z-axis and parallel to the paper surface of FIG. 4 and the Y-axis perpendicular to the paper surface of FIG. 4.

The reticle 1 is held on a reticle stage 32 which, in turn, is carried on a reticle support 32. The reticle stage 32 is capable of translation in the XY-plane and rotation in the XY-plane (or the rotation in the θ-direction) by means of a reticle drive system (not shown). Movable mirrors 33a and 33b for position measurement in the X- and Y-directions, respectively, are fixedly mounted on the reticle stage 32 on respective side edges thereof and associated with laser interferometers 34a and 24b, respectively, fixedly mounted on the reticle support 31. These pairs of movable mirror and laser interferometer continuously serve to detect the position of the reticle stage 32 in the X- and Y-directions with a resolution on the order of 0.01 μm, as well as the rotational angle (or rotational position in the θ-direction). The laser interferometers 34a and 34b produce data signals indicative of the measured values and supply them to a stage control system 16, which uses the supplied data signals so as to control the reticle drive system mounted on the reticle support 31. The stage control system 16 also supplies the data signals indicative of the measured values from the laser interferometers 34a and 34b to a central control system 18, which uses the supplied data signals so as to control the stage control system 16.

A wafer 6 is held on a wafer holder 30 using vacuum suction, and the wafer holder 30 is disposed on a material support 29 which, in turn, is carried on an X-stage 11 through a Z/tilt drive unit 10. The Z/tilt drive unit comprises, in this embodiment, three adjustable supports each independently extendible/contractible in the Z-direction and serves to make any necessary corrections in the position of the wafer 6 in the direction of the optical axis AX of the projection optical system 3 (i.e., the Z-direction) as well as in the tilt of the wafer 6. That is, the material support 29 is supported by the Z/tilt drive unit 10 which, in turn, is mounted on the X-stage 11. Further, the X-stage 11 is carried on a Y-stage 12, which, in turn, is carried on a wafer base 14. The X-stage 11 and the Y-stage 12 are arranged to be capable of displacement in the X- and Y-directions, respectively, through a wafer stage drive system (not shown). A movable mirror 13b is mounted on and fixed to the material support 29 along a first one of four side edges thereof, while a stationary laser interferometer 17b associated therewith is disposed facing to the reflective surface of the movable mirror 13b. The movable mirror 13b and the laser interferometer 17b cooperate to detect the X-coordinate and the rotational angle of the material support 29. Similarly, a second movable mirror 13a is mounted on and fixed to the material support 29 along a second one of the side edges and extending perpendicular to the first movable mirror 13b, while a second stationary laser interferometer 17a associated therewith is disposed facing to the reflective surface of the movable mirror 13a. The movable mirror 13a and the laser interferometer 17a cooperate to detect the Y-coordinate of the material support 29. The coordinate system defined by the coordinates (X, Y) measured through the laser interferometers 17a and 17b is called "the coordinate system of the wafer stage" (or more simply "the stage coordinate system") and expressed by (X, Y).

The interferometers 17a and 17b produce data signals indicative of the measured values and supply them to the stage control system 16, which uses the supplied data signals so as to control the wafer stage drive system. The stage control system 16 also supplies the data signals indicative of the measured values from the laser interferometers 17a and 17b to the central control system 18, which uses the supplied data signals so as to control the stage control system 16. A wafer transfer unit 39 (see FIG. 5(a)) is disposed adjacent to the wafer stage, for transferring a wafer to and from the wafer stage. The wafer stage includes therein a wafer transfer mechanism, which will be described later in detail.

The projection exposure apparatus is further provided with three alignment sensor systems for establishing alignment between a reticle 1 and a wafer 6. One is a TTL-type alignment sensor system 4, and the remaining two are FIA-type alignment sensor systems 5A and 5B. The alignment sensor 4 incorporates an LSA-type alignment sensor and an LIA-type alignment sensor disposed in parallel which are selectively used depending on the required alignment accuracy. When the alignment process is carried out, one of the three alignment sensor systems 4, 5A and 5B is used to detect the position of a certain feature formed on a wafer 6, which may be an alignment mark or a selected pattern on the wafer, and the detected position is used to establish alignment between the pattern formed in each shot area on the wafer 6 during the previous layer forming process and the pattern formed on the reticle. The detection signals from any of the alignment sensor systems 4, 5 and 5B are processed by an alignment control system 15, which is controlled by the central control system 18. A reference mark bearing plate 43 is fixedly mounted on the material support 29 and has a top surface thereof which will be level with the surface of the wafer loaded on the wafer holder. The reference mark bearing plate 43 has reference marks formed on its top surface and providing the reference for alignment operation.

In this manner, the stage control system 16 and the alignment control system 15 are controlled by the central control system 18, which also serves to generally control the operations in the entire projection exposure apparatus in order to cause the exposure operations to be carried out according to a given sequence.

Further, there are provided three off-axis-type two-dimensional image processing units 50, 51 and 52 disposed adjacent to one end of the projection optical system 3 near the wafer. The image processing units 50–52 serve to take an image of the outer peripheral edges of a wafer when the wafer is transferred to a loading position above the wafer holder 30 as described later. The image processing units 50–52 produce picture signals to be supplied to the alignment control system 15, which uses the supplied picture signals to determine by calculation the lateral shift errors and rotational position errors of the wafer in the loading position. The positioning and the arrangement of the image processing units 50–52 will be described later.

Figure 5A:
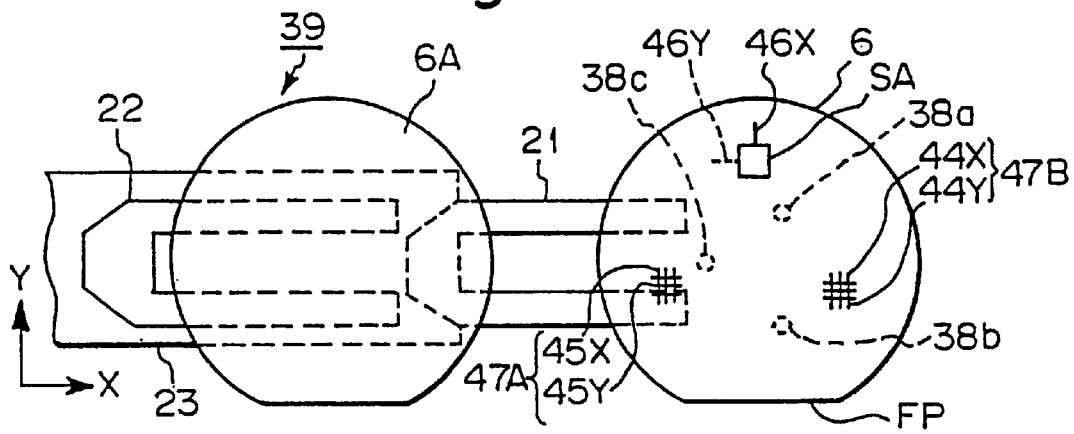
FIGS. 5(a) through 5(d) show a wafer transfer unit, a wafer loading mechanism, a turntable mechanism and other elements used in the projection exposure apparatus of FIG. 4.
Figure 5B:
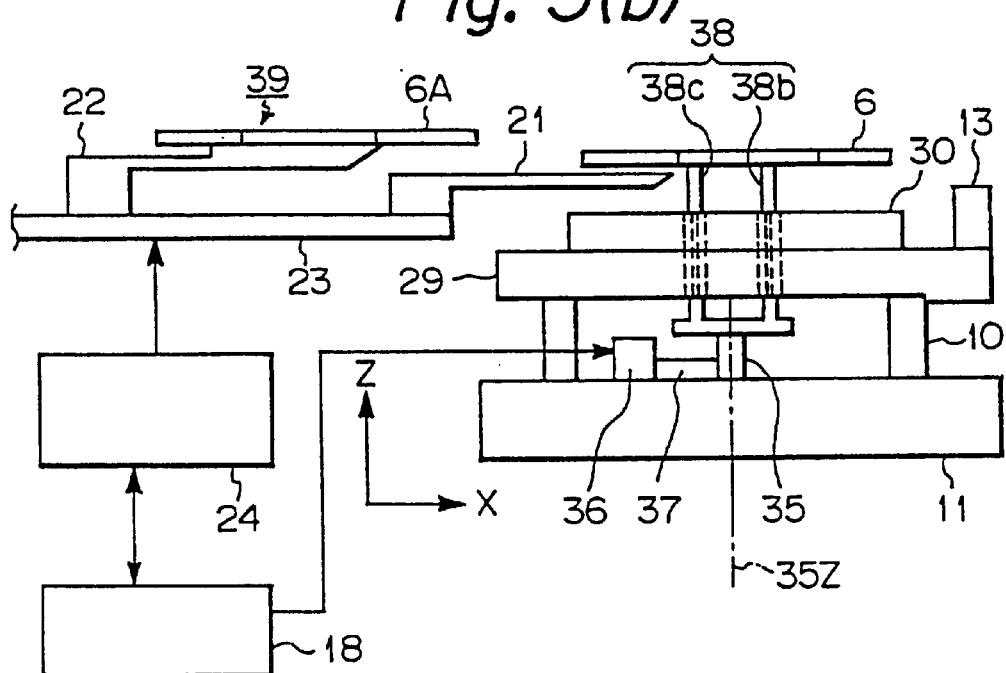

Referring next to FIGS. 5(a) and 5(b), the wafer transfer system, as well as the wafer loading mechanism on the wafer stage will be described. Here, the term "wafer stage" refers to the arrangement comprising the wafer holder 30, the material support 29, the Z/tilt drive unit 10, the X-stage 11, the Y-stage 12 and the wafer base 14.

FIG. 5(a) is a plan view showing the wafer transfer system and a part of the wafer stage, and FIG. 5(b) is a front elevation thereof. In FIGS. 5(a) and 5(b), a wafer transfer unit 39 is disposed at a position higher than and to the X-direction of the wafer stage. The wafer transfer unit 39 comprises transfer arms 21 and 22 disposed along a line extending in the X-direction, a slider 23 for sliding the transfer arms 21 and 22 to a predetermined position, and an arm drive system (not shown) for driving the transfer arms 21 and 22. The slider 23 is separated form the remaining portion of the projection exposure apparatus, so that any vibrations introduced in the slider 23 for its operation may not be transferred to the latter. Each of the transfer arms 21 and 22 has a U-shaped flat plate having a top surface for receiving a wafer thereon. The two transfer arms serve to unload an exposed wafer from and load a new wafer on the wafer stage. Since the arrangement of this type of wafer transfer unit is known, and will not be described in more detail here for simplicity.

The transfer arms 21 and 22 are moved, in accordance with instructions form a loader control unit 24, along the slider 23 to a loading position, which is the position for loading a wafer onto the wafer stage. Then, the transfer arm 22 unloads the previous, exposed wafer 6A from the wafer stage. Then, the transfer arm 21 transfers the next-to-be-exposed wafer 6 onto the wafer stage and place it on a lift support 38. FIG. 5(b) shows the exposed wafer 6A carried on the transfer arm 22 on the slider 23 and the new wafer just transferred from the transfer arm 21 onto the top end of the lift support 38.

The lift support 38 is supported by a linear actuator 35 and has three support pins 38a, 38b and 38c received in respective through holes in the material support 29 and the wafer holder 30. The linear actuator 35 is capable of producing a vertical (Z-direction) displacement of the three support pins 38a–38c, resulting in a vertical movement of the wafer placed thereon, so as to enable transfer of a wafer to and from the transfer arms 21 and 22. More specifically, each of the support pins 38a–38c has at its tip end a vacuum suction hole communicable with a vacuum source. The support pins 38a–38c are lifted up/down such that their tip ends are raised to an upper position in order to enable transfer of a wafer to and from the transfer arms 21 and 22, while lowered to a lower position below the top surface of the wafer holder 30 in order to place a wafer on the wafer holder. The hold of a wafer by vacuum suction provided by the tip ends of the support pins 38a–38c effectively prevents any displacement of the wafer relative to the tip ends upon lifting up/down of the lift support 38.

The linear actuator 35 is supported for rotation in the XY-plane about its center axis 35Z, operationally connected with a drive shaft 37 driven by a rotational drive system 36, and is rotatable to any desired angular positions in accordance with instructions from the central control system 18 controlling the rotational drive system 36. The rotary system comprising the rotation drive system 36, the drive shaft 37 and the linear actuator 35 has a sufficient resolution in angular positioning of a wafer. For example, it is capable of rotating the wafer 6 in either of the clockwise and counter-clockwise directions as viewed from above with accuracy within 20 μrad. The linear actuator 35, the rotational drive unit 36 and the drive shaft 37 together compose the drive mechanism for the lift support 38.

Figure 5C:
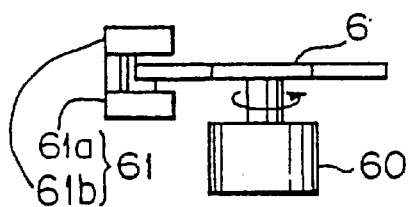

FIG. 5(c) shows a turntable 60 provided in the wafer transfer system. In FIG. 5(c) the wafer 6 on the turntable 60 is transferred to the lift support 38 through the wafer arm 21 of FIG. 5(b). There are disposed around the turntable 60 an eccentricity sensor 61 comprising a light-emitting unit 61a and a light-receiving unit 61b. The light-emitting unit 61a emits a light beam having a slit-like cross section such that a part of the light beam is blocked by the periphery of the wafer 6 and the remaining part passes by the peripheral edge of the wafer 6. The light-receiving unit 61b receives the passed-by part of light beam and converting it to an electrical detection signal S1 to be supplied to the central control system 18. The light-receiving unit 61b in this embodiment comprises a single photodiode. Alternatively, the light-receiving unit 61b may comprise other devices such as a line sensor to directly detect the position of the peripheral edge of the wafer. It is assumed that the wafer 6 is circular in shape with an flat region, or an orientation flat, FP formed on its periphery as shown in FIG. 5(a).

In this arrangement, upon rotation of the turntable 60 with the wafer 6 held thereon by vacuum suction, the amount of protrusion of the peripheral edge of the wafer into the eccentricity sensor 61 varies due to the eccentricity of the wafer 6 with respect to the turntable 60, as well as due to the existence of the orientation flat. Accordingly, the detection signal S1 from the light-receiving unit 61b, which is a function of the rotational angle $\phi$ of the turn table 60, varies as a sinusoidal curve with a local reduced level portion 62 corresponding to the orientation flat. The central control system 18 determines, from the detection signal S1 and the rotation angle $\phi$ of the turntable 60, i) the rotation angle $\phi_F$ of the turntable 60 when the orientation flat is centered to the eccentric sensor 61 and ii) the eccentricity of the wafer 6 with respect to the turntable 60, and then stop the rotation of the turntable 60 at a suitable position so as to cause the orientation flat to face a desired direction. Also, the central control system 18 uses the data indicative of the determined eccentricity so as to adjust the position of the material support 29 at which it can receive the wafer 6 which has been transferred to the loading position.

Furthermore, the central control system 18 determines and stores as digital data respective values of the detection signal S1 at four rotational angles $\phi_A$, $\phi_B$, $\phi_C$ and $\phi_D$, the first three corresponding to the measurement points for the three image processing units 50, 51 and 52, respectively, and the fourth to another predetermined angular position. In this relation, it is possible that although it is desired for the specifications of the exposure apparatus to measure the position of the edge of the wafer 6 at measurement points corresponding to the rotational angles $\phi_A$, $\phi_B$ and $\phi_C$, it is difficult to dispose the image processing unit 52 at the position corresponding to the rotational angle $\phi_C$ and it has to be disposed at the position corresponding to the rotational angle $\phi 0_D$. Further, it is even possible that not three but only two image processing units can be disposed. In the former case, the central control system 18 estimates the measurement value at the measurement point corresponding to the rotational angle $\phi_C$, from i) the values of the detection signal S1 at the rotational angles $\phi_A$, $\phi_B$, $\phi_C$ and $\phi_D$, and ii) the measurement values of the positions of the peripheral edge of the wafer 6 at the measurement points corresponding to the rotational angles $\phi_A$, $\phi_B$ and $\phi_D$, and the estimated value is used to determine the horizontal (translational) errors and the rotational error of the wafer 6. In the latter case, the central control system 18 estimates the measurement values at the measurement points corresponding to the rotational angles $\phi_A$ and $\phi_C$, for example, from i) the values of the detection signal S1 at the rotational angles $\phi_A$, $\phi_B$, $\phi_C$ and $\phi_D$ and ii) the measurement values of the positions of the peripheral edge of the wafer 6 at the measurement points corresponding to the rotational angles $\phi_B$ and $\phi_D$, and the estimated values are used to determine the hori-zontal (translational) errors and the rotational error of the wafer 6.

In general, the above position determination method is used to obtain the matching between such exposure apparatus using this method and another exposure apparatus which is provided with a mechanical prealignment arrangement using alignment pins and whose mechanical reference positions corresponds to the rotational angles $\phi_A$, $\phi_B$, $\phi_C$ and $\phi_D$. However, the exposure apparatus shown and described is capable of measuring the positions of the edge of the wafer 6 by two-dimensional image processing units 50–52 at the measurement points which correspond to measurement points of a contact-prealignment mechanism in another exposure apparatus, so that if the exposure apparatus has to use the eccentricity sensor 61 shown in FIG. 5(c) in order to obtain the matching with the contact-prealignment mechanism in that another exposure apparatus, it is mainly under the situation that the observation fields of the image processing units 50–52 can not be located to cover the regions corresponding to regions about the pins of the contact-prealignment mechanism.

Next, the arrangement and construction of the image processing units 50–52 will be described in detail.

Figure 6A:
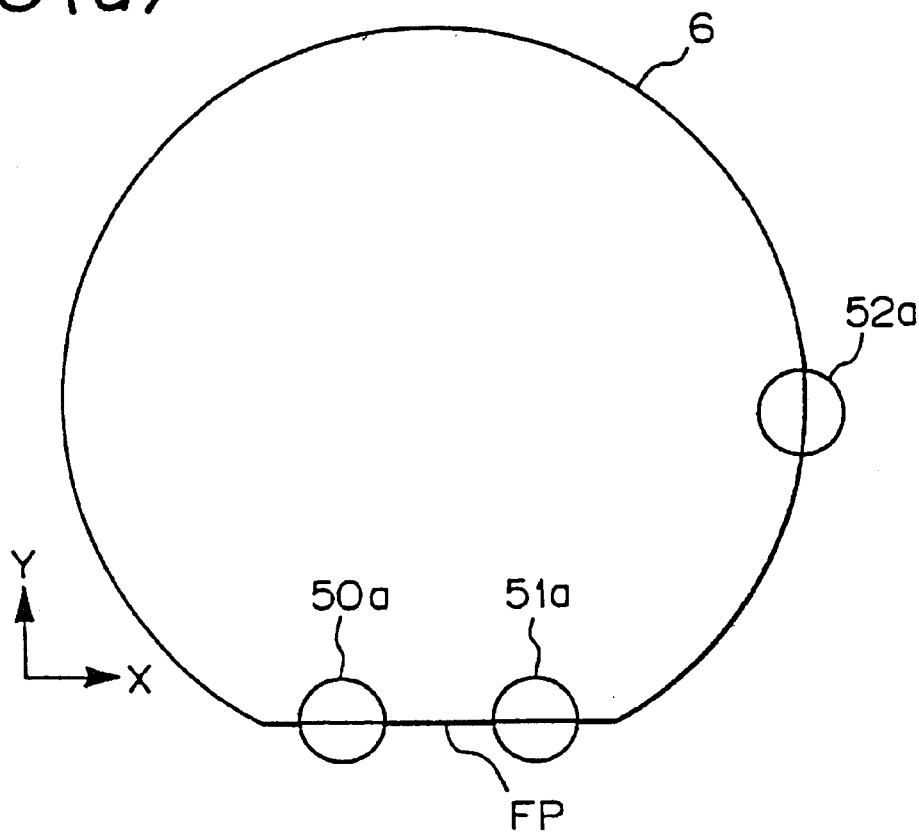
FIG. 6(a) is a plan view of a wafer having an orientation flat.
Figure 6B:
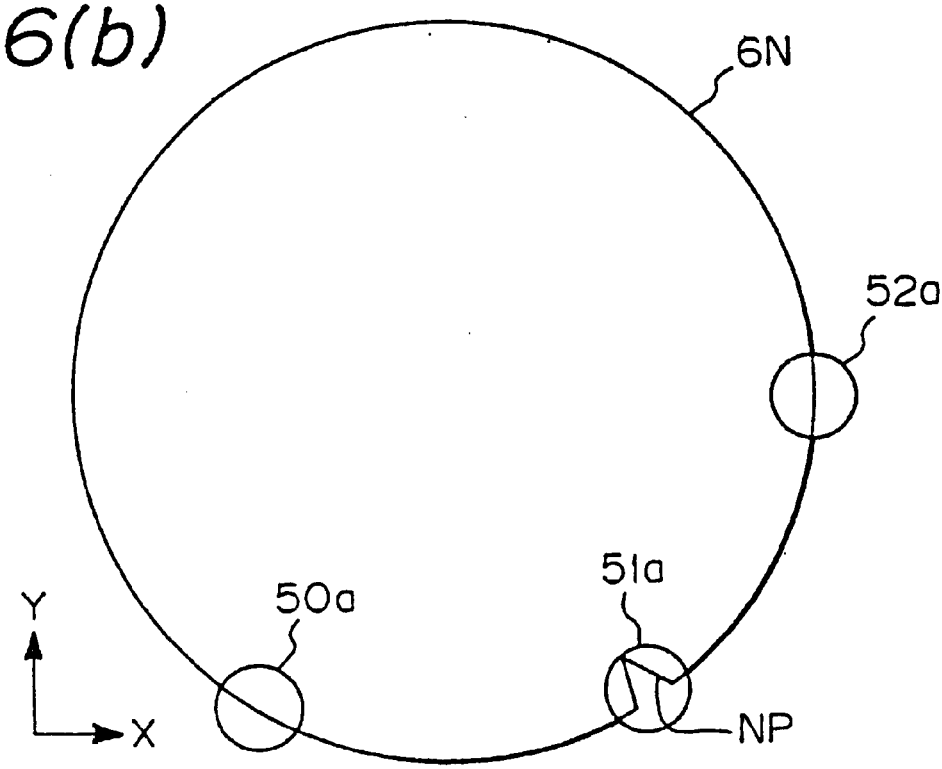
FIG. 6(b) is a plan view of a wafer having a notch.

FIG. 6(a) shows a wafer 6 located at the loading position. As shown, the three image processing units 50, 51 and 52 have respective observation or viewing fields 50a, 51a and 52a located at respective positions on the peripheral edge of the wafer 6. Note that although the actual shape of the area which is actually subjected to the image processing (i.e., observation field) is rectangular, these observation fields are illustrated in FIGS. 6(a) and 6(b) as circular areas for convenience of explanation. Among these three observation fields, two observation fields 50a and 51a are located on the orientation flat FP and the third observation field 52a is located on the circular peripheral edge of the wafer. By detecting the positions of the peripheral edge of the wafer 6 at the three measurement points, the detection of the translational or positional errors in the X- and Y-directions (horizontal offsets) and the rotational error of the wafer 6 (i.e., the detection required for the prealignment) is quickly performed when the wafer 6 is loaded.

Any detected translational errors in the X- and Y-directions are corrected by adjusting the detection positions for a search alignment operation described later, which is performed after the wafer 6 has been placed and held on the wafer holder 30. Any detected rotational error is corrected by rotating the lift support 38 through the rotational drive system 36 when the lift support 38 is lowered, and before the wafer 6 held on the lift support 38 contacts with the wafer holder 30.

Some types of wafers have no orientation flat, but instead have a V-notch NP formed in their circular peripheral edge, such as a wafer 6N shown in FIG. 6(b). For this wafer 6N, the three observation fields 50a, 51a and 52a may be located such that one observation field 51a covers the region of the V-notch NP and the remaining two observation fields 50a and 52a cover respective regions on the circular peripheral edge. By using this location of the observation fields, the horizontal offsets (translational or positional errors) and the rotational error of the wafer 6N having the V-notch NP may be quickly detected when the wafer 6N is loaded.

Figure 7:
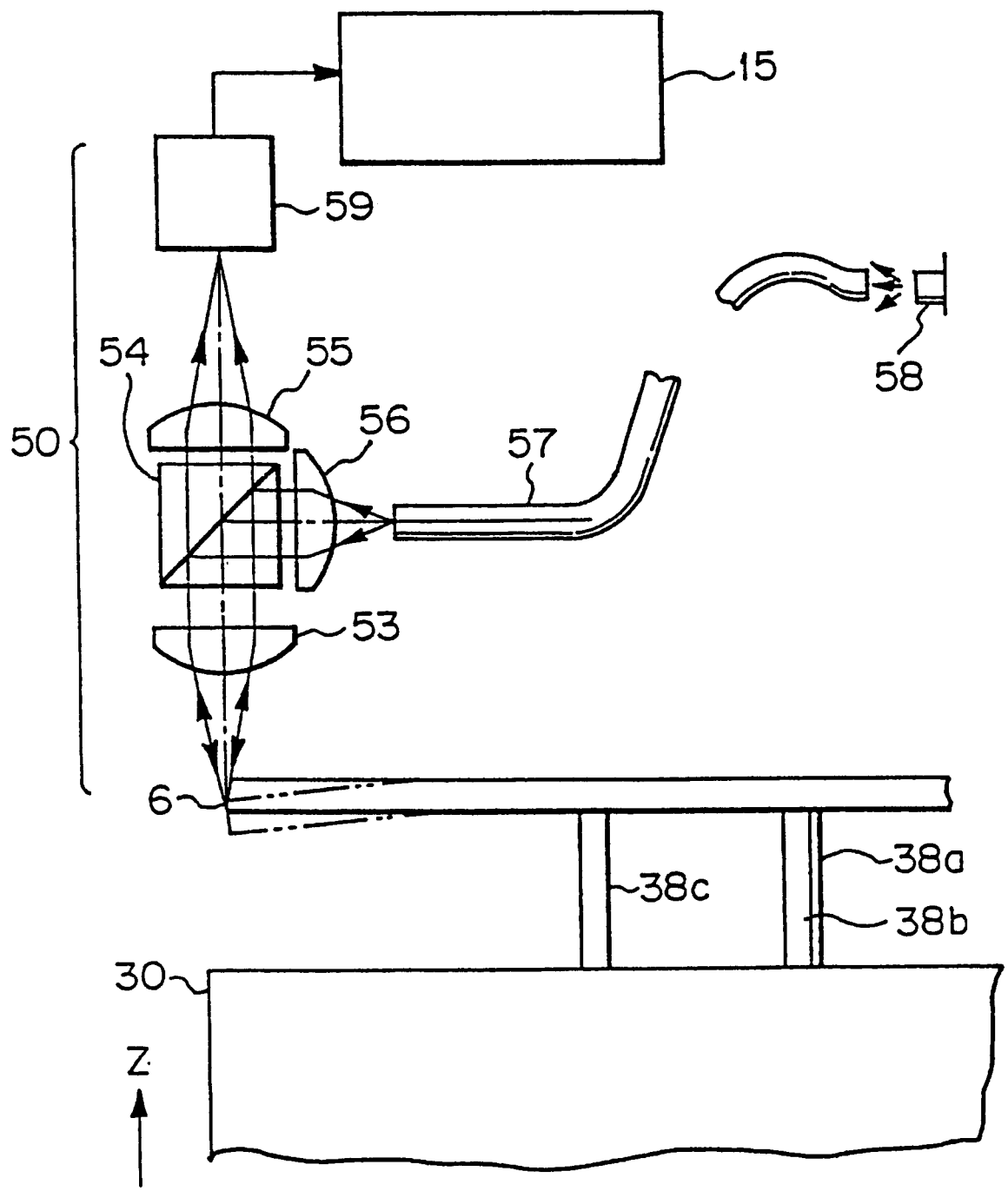
FIG. 7 is a schematic representation, partially cut out, of an exemplified arrangement for a two-dimensional image processing unit 50 for detecting the edge of a wafer.

FIG. 7 shows an exemplified structure for the image processing unit 50. As shown, the image processing unit 50 includes a light source 58, such as an electric lamp or a light-emitting diode, which emits light of a wavelength falling in a range within which the photoresist coated on the wafer has little sensitivity. The emitted light is collected into one end of a length of light guide 57, emitted from the other end of the light guide 57 into a collimator lens, reflected by a half-silvered prism 54, and illuminated through an objective lens 53 onto an region on the peripheral edge of the wafer 6 as placed on the tip ends of the three support pins 38a–38c and located at the larding position. The reflected light passes through the objective lens 53, the half-silvered prism 54 and an image-forming lens 55 to strike a photosensitive surface of an image pick-up device 59 such as a two-dimensional charge-coupled device (CCD) to form an image of the edge region on the photosensitive surface of the image pick-up device 59. The image pick-up device 59 produces a picture signal to be supplied to the alignment control system 15, which is arranged to determine the position of the detected edge of the wafer 6 from the picture signal.

Figure 13:
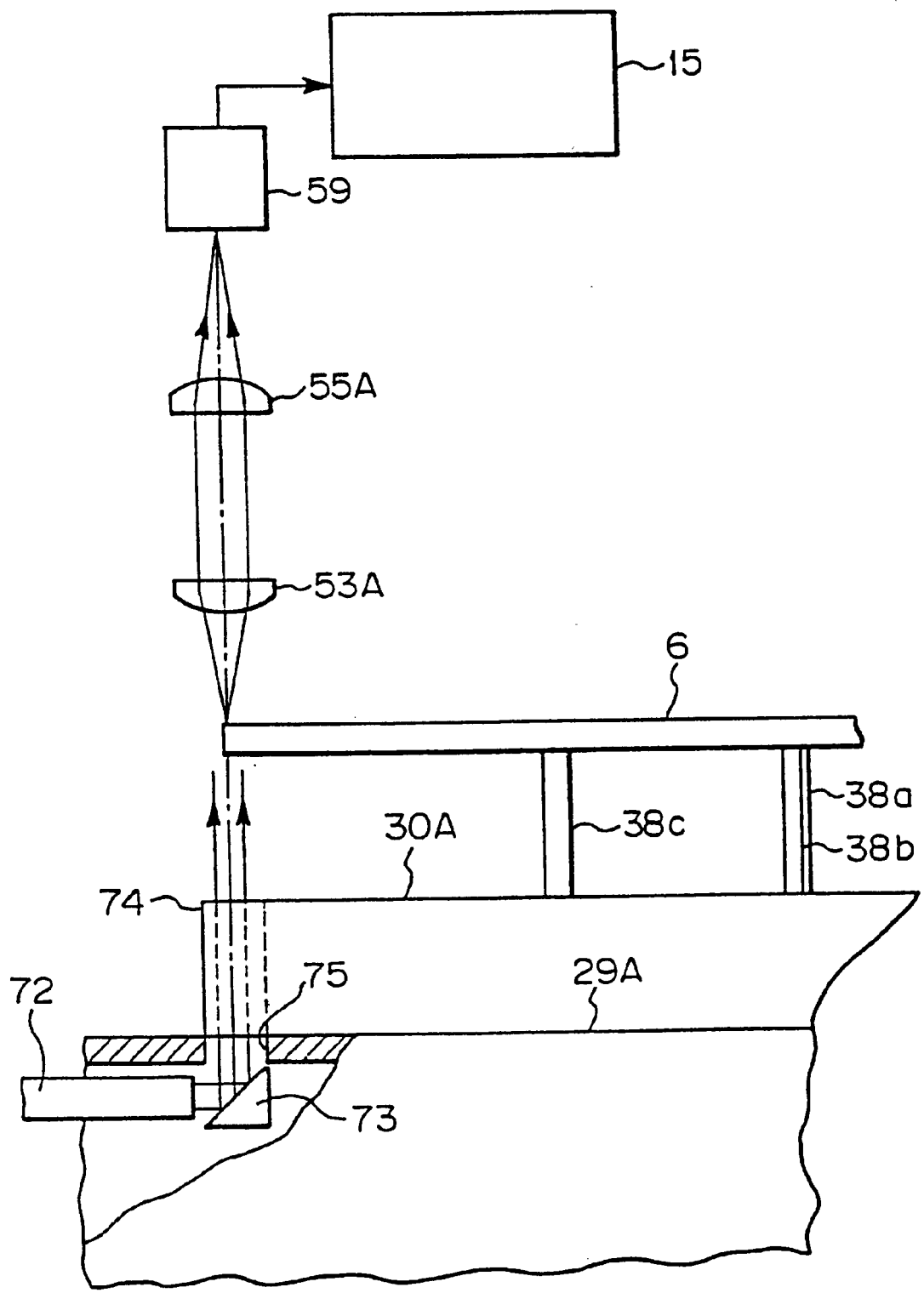
FIG. 13 is a schematic representation, partially cut out, of another exemplified arrangement for the image processing unit 50.

FIG. 13 shows another exemplified structure for the image processing unit 50. In the structure of FIG. 13, a light source (not shown), such as an electric lamp or a light-emitting diode, emits light of a wavelength falling in a range within which the photoresist coated on the wafer has little sensitivity. The emitted light is collected into one end of a length of light guide 72, emitted from the other of the light guide 72 as an illumination beam. The illumination beam is reflected by a deflection mirror 73 to pass through an aperture 75 formed in the top plate of a material support 29A, and thereby directed upwardly. A wafer holder 80A mounted on the material support 29A has a cutout 74 allowing the illumination beam passed through the aperture 75 to pass through it. The illumination beam passed through the aperture 75 and the cutout 74 is illuminated onto a region on the peripheral edge of the wafer 6 as placed on the tip ends of the three support pins 38a–38c and located at the larding position. A part of the illumination beam passes by the edge region and further passes through an objective lens 53A and an image-forming lens 55A to strike a photosensitive surface of an image pick-up device 59 such as a two-dimensional charge-coupled device (CCD) to form an image of the edge region on the photosensitive surface of the image pick-up device 59. The image pick-up device 59 produces a picture signal to be supplied to the alignment control system 15, which is arranged to determine the position of the detected edge of the wafer 6 from the picture signal.

In either of the structures of FIGS. 7 and 13 for the image processing unit, the peripheral edge of the wafer 6 is slightly deflected downwardly (i.e., to the -Z-direction) as indicated by the phantom lines in FIG. 7 with exaggeration. Also, the inevitable variation in the thickness of the wafers provides variation in the deflection, so that the image-forming optical system comprising the objective lens 53 and the image-forming lens 55 must be a telecentric optical system having a numerical aperture (NA) small enough to ensure a sufficient depth of field. Because the depth of field is substantially proportional to $\lambda/NA^2$ where $\lambda$ is the wavelength of the light of the illumination beam, smaller numerical aperture provides greater depth of field, resulting in that even an edge region with a maximum possible deflection may be detected with precision. For example, with the wavelength $\lambda$ of the light of the illumination beam being 0.633 $\mu$m, the numerical aperture NA of the order of 0.03 provides a depth of field greater than 0.5 mm and a resolution of the order of 0.5 mm. Generally, detection limit is about one tenth (1/10) of resolution, so that the above resolution provides a detection limit of the order of 2 $\mu$m, which enables precision alignment.

In FIG. 6(a), if it is not needed to achieve close matching with a prealignment mechanism of contact type in another exposure apparatus, the two-dimensional image processing is not necessarily required for detecting positions on the circular peripheral edge of the wafer or on the edge of the orientation flat NP, but a one-dimensional image pick-up device such as a line sensor disposed such that its measuring direction is normal to the corresponding edge portion of the wafer, or a camera tube for industrial television (ITV) disposed such that its scanning direction is normal to the corresponding edge portion of the wafer may be used, and the image or picture signal from such device may be processed to detect the position of the edge. This may be, because the detected position of the circular peripheral edge or the edge of the orientation flat NP is inherently of one-dimensional. For example, for the wafer 6 shown in FIG. 6(a), the translational errors in the X- and Y-directions and the rotational error of the wafer may be determined from the detected one-dimensional positions at the three measurement points.

On the other hand, if it is needed to achieve close matching with a prealignment mechanism of contact type in another exposure apparatus and line sensors are used in the image processing units for detecting the peripheral edge of the wafer, if accuracy of transfer of the wafer to the loading position is low, the matching error becomes unacceptably large since the peripheral edge of the wafer is out of the detection area of the line sensor. This will be described in more detail below with reference to FIGS. 15(a) through 15(d).

Figure 15A:
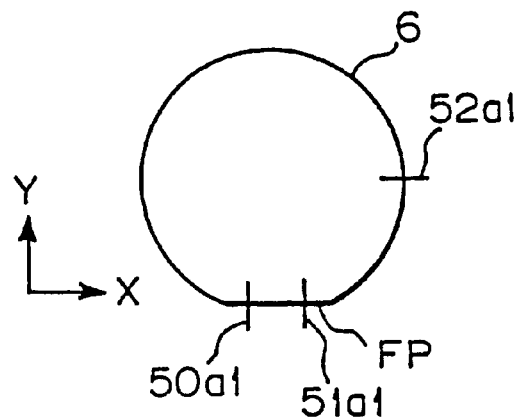
FIGS. 15(a) through 15(d) illustrate a method of detecting the positions of the peripheral edge of an wafer 6 using line sensors or two-dimensional image processing units.
Figure 15B:
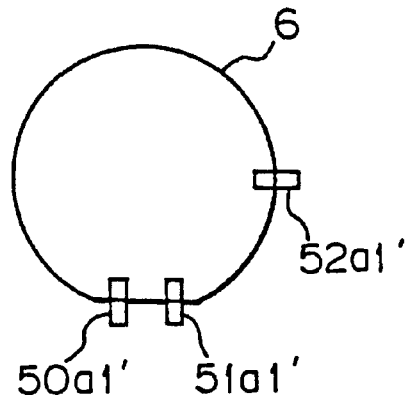
Figure 15C:
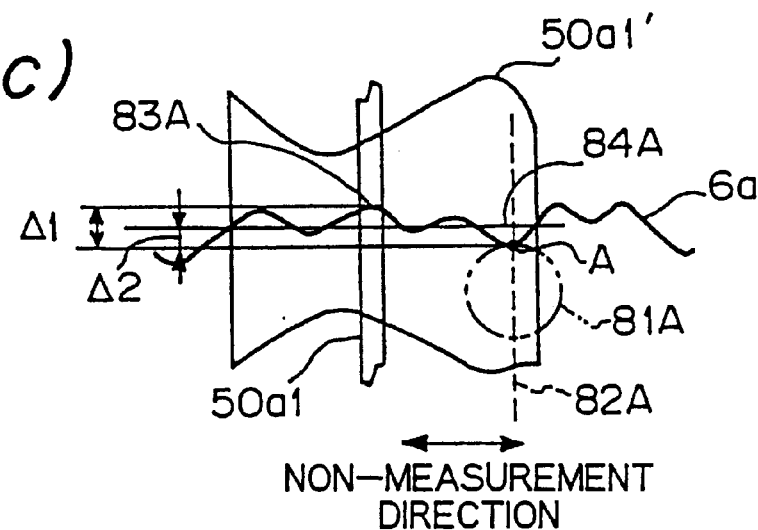

FIG. 15(a) shows a wafer 6 having an orientation flat FP and respective linear observation or viewing fields (detection areas) 50a1, 51a1 and 52a1 of three line sensors, in which two observation fields 50a1 and 51a1 are located on the orientation flat FP and the third observation field 52a1 is located on the circular peripheral edge of the wafer 6. FIG. 15(c) shows one of the observation fields, 50a1, in an enlarged plan view. As shown in FIG. 15(c), it is assumed that the observation field 50a1 located on the peripheral edge 6a of the wafer 6 is at a position away from the measurement point A to the non-measuring-direction (i.e., the horizontal direction perpendicular to the measuring direction of the line sensor). The measurement point A is a point at which a positioning reference pin 81A of a pre-alignment mechanism of contact type (which is pro-vided in another exposure apparatus used for the previous exposure process) has once contacted with the edge of the wafer in the course of the previous exposure process. Accordingly, a broken line 82A passing through the measurement point A and extending parallel to the measuring direction indicates a matching position. When the observation field 50a1 is offset from this matching position as shown in FIG. 15(c), a substantial error (matching error) Δ1 may possibly occur between the positions of the measurement point 83A in the observation field 50a1 and the measurement point A due to the irregularity in the shape of the peripheral edge 6a of the wafer 6.

Figure 5D:
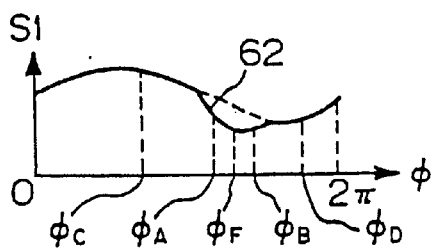

In such case, the matching error may be corrected, as previously mentioned, by using values of eccentricity of the wafer at predetermined rotational angles $\phi_A$, $\phi_B$, $\phi_C$ and $\phi_D$, which can be determined as shown in FIG. 5(d) by means of the turntable 60 and the eccentricity sensor 61 of FIG. 5(c).

Alternatively, the matching error may be reduced by widening the width (or dimension in the non-measuring-direction) of the observation field (or detection area) 50a1 of the line sensor. For this purpose, a line sensor is used whose observation field 50a1' is wide enough to cover a range in the non-measuring-direction in which the measurement point A (at which the positioning pin 81A has once contacted with the edge of the wafer) may fall, as shown in FIG. 15(c). Since the image in the observation field 50a1' is optically or electrically integrated in the non-measuring-direction, the detection signal from the line sensor will indicate that the position of the peripheral edge 6a of the wafer 6 for the observation field 50a1' is at the position designated by the average line 84A. The distance between the average line 84A and the measurement point A is smaller than the distance between the measurement point 83A for the slit-like observation field 50a1 and the measurement point A, so that the matching error Δ2 corresponding to the former distance is smaller than the above-mentioned matching error Δ1 corresponding to the latter distance. In summary, the matching error between the alignment sensor system and the prealignment mechanism of contact type may be reduced by widening the observation field (or detection area) of the line sensor in the non-measuring-direction to provide averaging effect.

The matching error may be also reduced by using the two-dimensional image processing units 50–52 in place of the line sensors, as with the arrangement of FIG. 4.

Figure 15D:
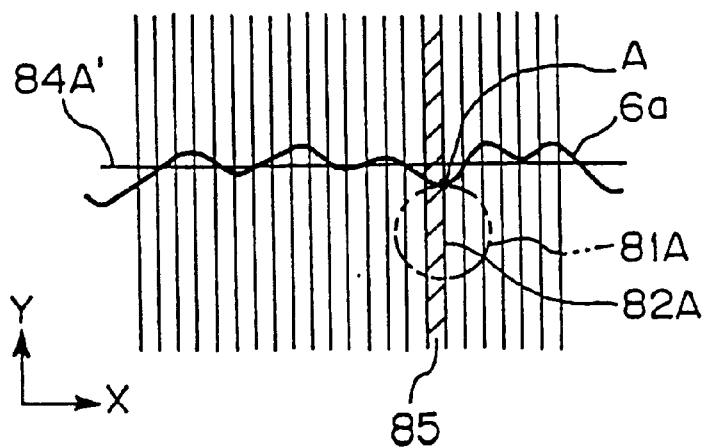

FIG. 15(d) shows the observation or viewing field of the two-dimensional image processing unit for the same wafer edge as shown in FIG. 15(c). As shown in FIG. 15(d), the image processing unit is arranged such that pixels constituting the image in the observation field are scanned in the Y-direction (or measuring-direction). The average line 84A' of the peripheral edge 6a of the wafer 6 in the observation field is determined, and the position of the average line 84A' (or average position) is determined. Similarly, an average position of the peripheral edge 6a of the wafer 6 is determined at each of the other two measurement positions. Then, the position of the wafer 6 in the X-direction, the position of the wafer 6 in the Y-direction and the rotational angle of the wafer 6 are determined from the average positions at the three measurement sites. Then, the positions and the rotational angle of the wafer 6 are used to identify, from among lines of pixels, one line 85 of pixels which includes a line 82A passing through the measurement point A (with which matching must be established) and extending in the Y-direction. The sequence of picture signals corresponding to the identified line 85 of pixels are used to determine the position of the peripheral edge 6a of the wafer 6 at a measurement point substantially coincident with the measurement point A for the prealignment mechanism of contact type. In this manner, the matching error may be reduced.

For wafers having one or more orientation flats and no notch, such as the wafer 6 with the orientation flat FP as described above, a linear (or one-dimensional) image pick-up device may be used to conduct the position detection of the wafer edge even at locations along the orientation flat FP. However, For wafers having one or more notches, such as the wafer 6N with the notch NP shown in FIG. 6(b), the position detection of the wafer edge at notch NP has to be conducted in both the X- and Y-directions, and thereby requires a two-dimensional image processing unit. The position detection at the notch NP will be described later with reference to FIGS. 8(a) and 8(b).

Figure 8A:
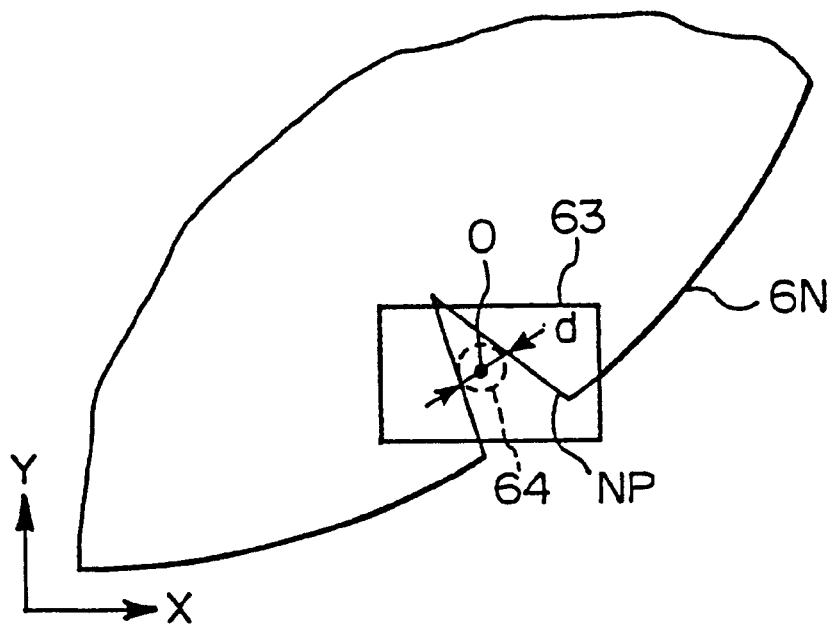
FIGS. 8(a) and 8(b) illustrate an exemplified method of detecting a notch of a wafer.

FIG. 8(a) is an enlarged plan view of the wafer 6N showing the notch NP. As shown, as a conventional way of positioning the wafer 6N with respect to the wafer holder, a cylindrical reference pin with a predetermined diameter d is used and two edges in the notch NP are engaged with the pin and pressed against the side surface of the pin. Thus, the geometry of the notch NP is selected in accordance with the geometry of the reference pin. For ensuring compatibility with this method, we use the data indicative of the image in the observation field 63, which is an area on the notch NP and conjugate to the photosensitive surface of the image-sensing device, so as to determine an imaginary reference pin 64 having a diameter d and to be engaged with the two edges in the notch NP, and then determine the X- and Y-coordinates of the center O of the imaginary reference pin 64.

Figure 8B:
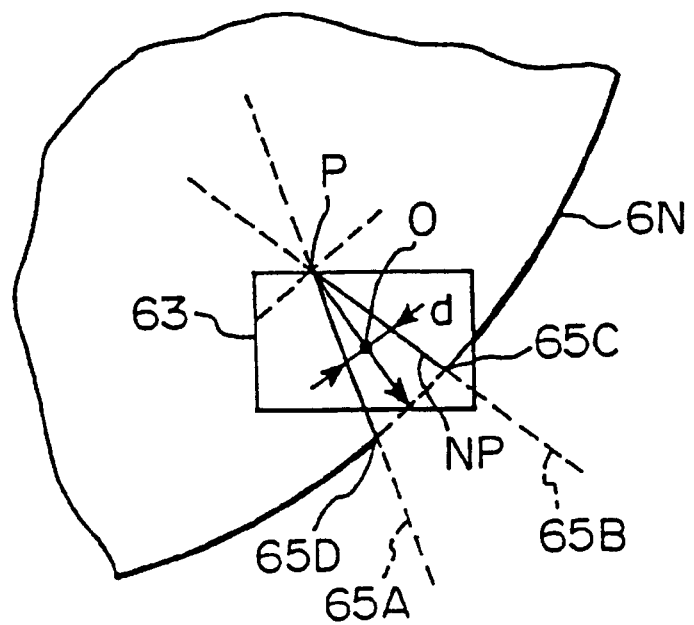

FIG. 8(b) illustrates alternative method of position detection at the location of the notch NP, in which the data indicative of the image in the observation field 63 is used to determine the coordinates of the point P at which two edges 65A and 65B of the notch NP meet each other and the coordinates of the point 65C at which one edge 65B and the circular peripheral edge of the wafer meet each other. Then, the coordinates of the point 65D at which the other edge 65A and the circular peripheral edge of the wafer meet each other are determined based on the assumption that the notch NP is symmetrical in shape. Now we have obtained the triangle defined by the three points P, 65A and 65B. Then we consider a line extending parallel to the line 65C–65D and intersecting edges 65A and 65B, and the distance between the intersections equal to the diameter d of the imaginary reference pin. Then we take the midpoint between the intersections as a center O, and the X- and Y-coordinates of the center O is determined.

Figure 14A:
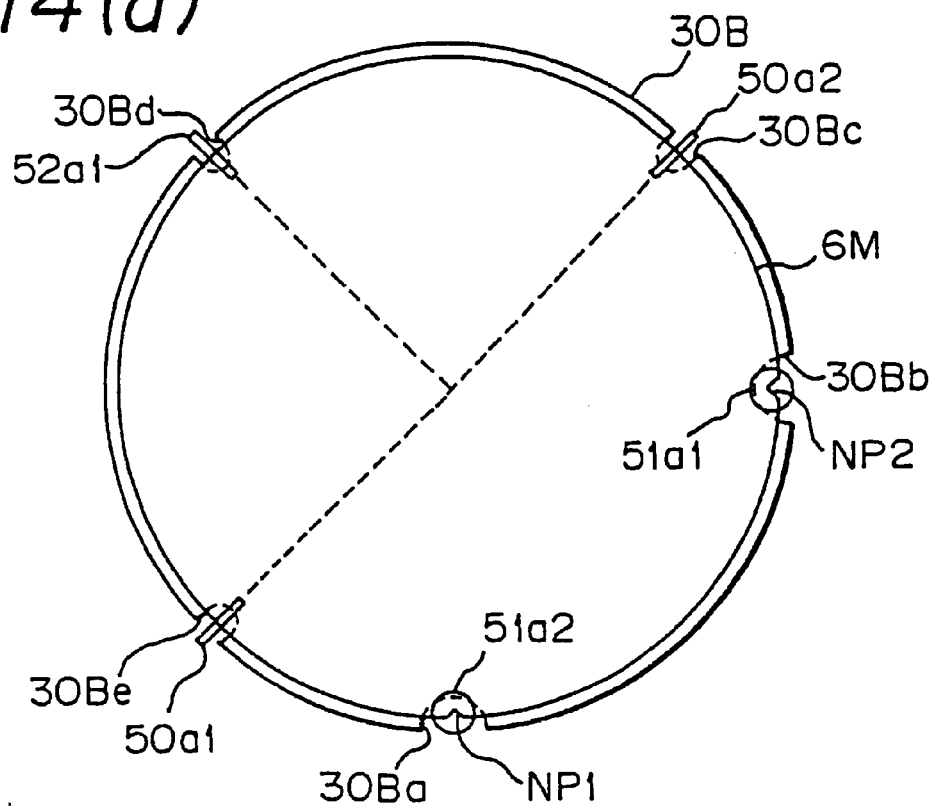
FIGS. 14(a) and 14(b) illustrate various notches and orientation flats formed in wafers.
Figure 14B:
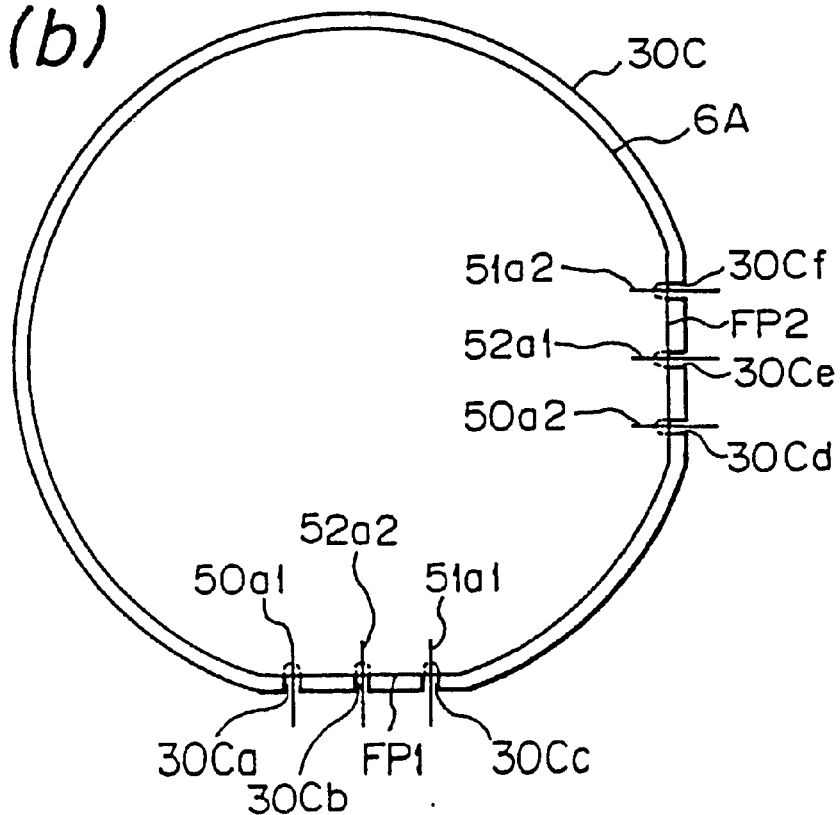

Referring next to FIGS. 14(a) and 14(b), still further forms of wafers and detections systems suitable for them will be described. With respect to variations of wafers with a notch, a wafer 6M may have either a notch NP1 at a position of six o'clock or a notch NP2 at a position of three o'clock as shown in FIG. 14(a), so that the detection system must be capable of precision detection of each of these notches. For the purpose, as shown in FIG. 14(a), a wafer holder 30B underlying the wafer 6M has two cutouts 30B$a$ and 30B$b$ allowing illumination beams to pass therethrough to illuminate the notches NP1 and NP2, respectively, as well as three cutouts 30B$c$, 30B$d$ and 30B$e$ allowing illumination beams to pass therethrough to illuminate locations of reference pins generally used for mechanical prealignment process. The latter three cutouts 30B$c$–30B$e$ are illuminated from the bottom side by means of respective image processing units of FIG. 13 described above. Where the wafer 6M has the notch NP1 at the position of six o'clock, the position and the rotation angle of the wafer is detected by means of a two-dimensional image processing system having a circular observation field 51$a$2 and first and second line sensors having linear observation fields 50$a$2 and 52$a$1, respectively. On the other hand, where the wafer 6M has the notch NP2 at the position of three o'clock, the position and the rotational angle of the wafer is detected by means of another two-dimensional image processing system having another circular observation field 51$a$1 and second and third line sensors having linear observation fields 52$a$1 and 50$a$1, respectively. That is, this arrangement has five sensors including two-dimensional image processing systems and three line sensors, and is capable of fine alignment and prealignment for both of the above two types of wafers with a notch.

With respect to variations of wafers with an orientation flat, a wafer 6A may have either an orientation flat FP1 at the position of six o'clock or an orientation flat FP2 at the position of three o'clock as shown in FIG. 14(b), so that the detection system must be capable of precision detection of each of these orientation flats. For the purpose, as shown in FIG. 14(b), a wafer holder 30C underlying the wafer 6A has three cutouts 30C$a$, 30C$b$ and 30C$c$ corresponding to one orientation flat FP1 and three cutouts 30C$d$, 30C$e$ and 30C$f$ corresponding to the other orientation flat FP2 formed therein. These six cutouts 30C$a$–30C$f$ are used for illumination from the bottom side by means of respective image processing units shown in FIG. 13 described above. Where the wafer 6A has the orientation flat FP2 at the position of three o'clock, the position and the rotation angle of the wafer is detected by means of three line sensors having observation fields 52$a$2, 51$a$2 and 50$a$2, respectively. On the other hand, where the wafer 6A has the orientation flat FP1 at the position of six o'clock, the position and the rotational angle of the wafer is detected by means of further three line sensors having linear observation fields 52$a$1, 51$a$1 and 50$a$1, respectively. This arrangement may be used in the case where optical detection systems may be disposed above the reference pins of a mechanical prealignment system on the wafer stage. However it is difficult to use such arrangement, position measurement results obtained by means of reference pins may be replaced by the determination of the contour of the wafer using the determination results on the turntable 60 shown in FIG. 5(c) as described above.

Referring next to FIGS. 16(a)–16(d) and 17(a)–17(d), an exemplified sequence of operations for conducting the detection of the position and rotational angle of the wafer while making matching with the prealignment mechanism of contact type, by using the three two-dimensional image processing units 50–52. Each of the image processing units 50–52 is of the transmitting illumination type, such as shown in FIG. 13.

Figure 16A:
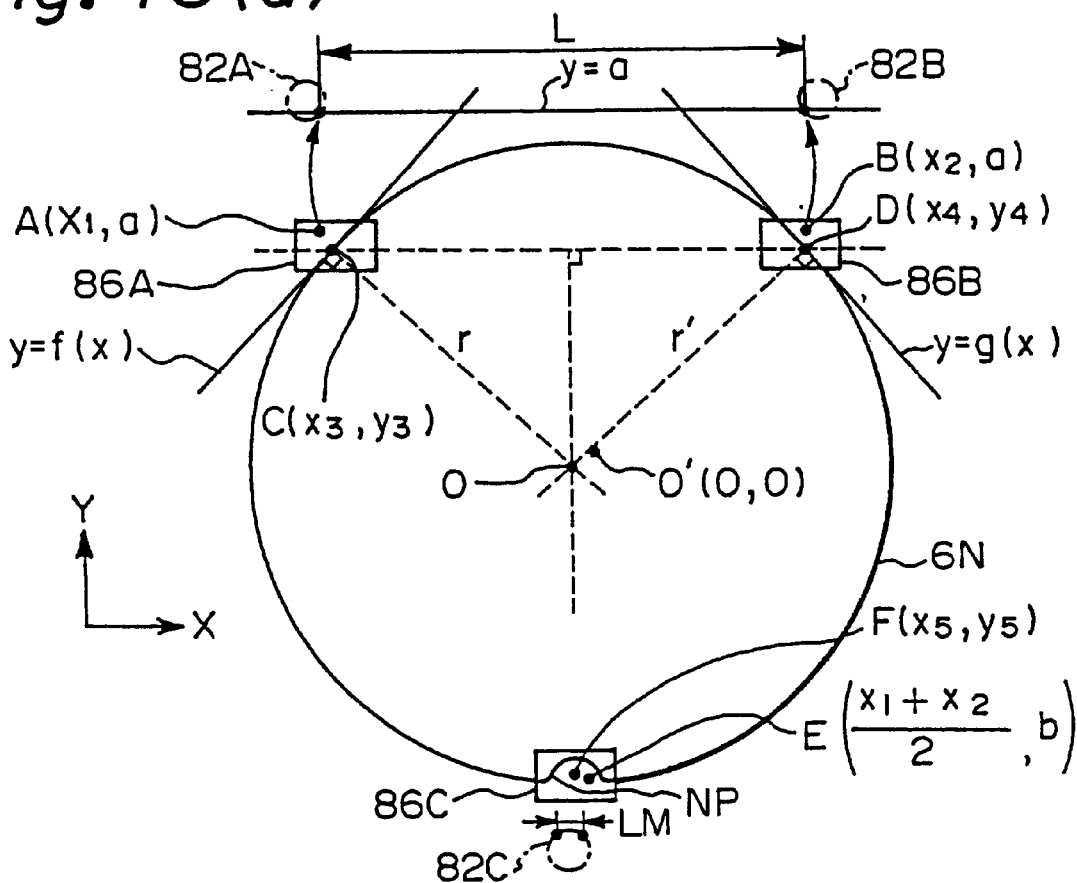
FIGS. 16(a) through 16(d) illustrate a method of detecting edge positions of an wafer 6N having a notch, while maintaining the matching with a contact-prealignment mechanism.

FIG. 16(a) shows a wafer 6N having a notch NP at a position of six o'clock which has been just transferred to the loading position. FIG. 16(a) shows the observation or viewing fields 86A, 86B and 86C of the three image processing units 50, 51 and 52, respectively, (the images in the observation fields may be subjected to the actual image processing). FIG. 16(a) also shows imaginary pins 82A, 82B and 82C (indicated by imaginary line circles) corresponding to the reference pins in the prealignment mechanism of contact type which is equipped in an exposure apparatus used for the previous exposure process, for example. It is noted that, for clarity of the figure, the imaginary pins 82A–82C are illustrated enlarged and extracted to the outside of the respective observation fields 86A–86C. Those points on the sides of the imaginary pins 82A and 82B in the observation fields 86A and 86B on the circular peripheral edge of the wafer 6N, at which the peripheral edge of a wafer should contact with the imaginary pins 82A and 82B after prealignment, are referred to as imaginary points A and B, respectively. Further, the center of the imaginary pin 82C in the observation field 86C on the notch NP is referred to as an imaginary point E.

In order to determine the positions of the imaginary points A, B and E, a reference wafer having reference marks formed thereon which indicate the imaginary points may be used, for example. The reference wafer is loaded on the wafer holder 30 of the wafer stage of FIG. 4, and the wafer stage is driven based on the measured values provided from the laser interferometers 17$a$ and 17$b$, with the design positions of the three reference pins of the contact-prealignment mechanism being used as the target values, such that the reference marks may be sequentially moved into the respective observation fields 86A–86C. Then, the positions of the reference marks in the respective observation fields 86A–86C are detected by the corresponding image processing units 50–52 and stored. In this manner, the imaginary pints A, B and E have been determined. The reference wafer may comprise a wafer with suitable notches formed in the peripheral edge thereof, or a glass wafer having suitable patterns formed thereon.

As previously described with reference to FIG. 5(b), the lift support 38 is mounted for rotation about its center axis 35Z by means of the rotational drive system 36. When the lift support 38 is rotated, the position of the imaginary points A, B and E, which are the points at which the wafer edge should contact with the imaginary pins 82A–82C, respectively, are moved within the observation fields 86A–86C of FIG. 16(a). Therefore, we can determine the coordinates of the rotation center 0' of the lift support 38 in the stage coordinate system, by measuring the positions of the imaginary points A, B and E on the reference wafer which is held by vacuum suction and fixed to the lift support 38, then rotating the lift support 38 by a predetermined angle, then again measuring the positions of the imaginary points A, B and E, and using differences in the measured positions for respective imaginary points so as to determine the coordinates of the rotation center O'. Thereafter, a new coordinate system (X, Y; O') is used which is the same as the stage coordinate system (X, Y) (which is the coordinate system fixed to the wafer stage and represented by the measured values from the laser interferometers 17a and 17b) translated such that the rotation center O' is taken as the origin thereof. That is, the coordinates of the rotation center O' in the new coordinate system (X, Y; O') are (0, 0).

It is assumed that the imaginary points A and B lie on a line parallel to the X-axis. Then, variable L is put equal to the distance in the X-direction between the imaginary points A and B. Further, the coordinates of the imaginary points A, B and E in the new coordinate system (X, Y; O') are represented by $(x_1, a)$, $(x_2, a)$ and $((x_1+x_2)/2, b)$, respectively, and the relative coordinates of the imaginary points A, B and E in the respective observation fields 86A, 86B and 86C are stored. Using y as the value of the Y-coordinate in the new coordinate system (X, Y; O), we can express that the imaginary points A and B lie on the straight line y=a, as shown in FIG. 16(a). Further, the following equation holds:

$$x_2 - x_1 = L$$

Figure 16B:
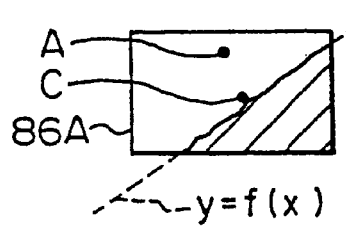
Figure 16C:
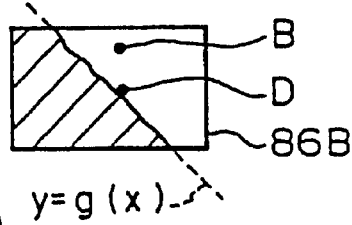
Figure 16D:
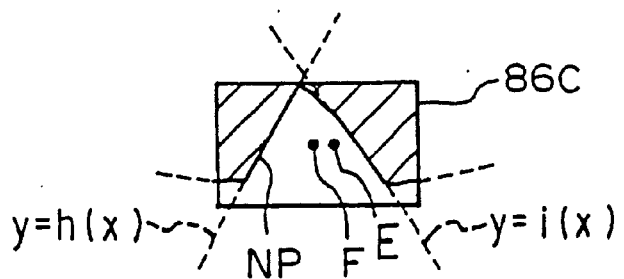

Because of the illumination by light beams from the bottom side of the wafer 6N, the images observed in the observation fields 86A, 86B and 86C are seen as shown in FIGS. 16(b), 16(c) and 16(d), respectively, wherein each image has a dark region (hatched in the figure) corresponding to the peripheral edge portion of the wafer and a bright region corresponding to the outside space of the wafer, so that the peripheral edge of the wafer 6N can be detected as the edge in the image dividing the dark and bright regions.

Next, we will describe how to detect the position and the rotational angle of an actual wafer 6N when the wafer 6N has been brought to the loading position as shown in FIG. 16(a). With respect to an image in each of the two observation fields 86A and 86B on the circular peripheral edge of the wafer 6N, the peripheral edge of the wafer corresponding to the edge in the image dividing the bright region Bi and the dark region Dk has a shape of a substantially straight line, as shown in each of FIGS. 16(b) and 17(c). Thus, using x and y for representing the values of the X- and Y-coordinates in the new coordinate system (X, Y; O'), the edges in the images in the observation fields 86A and 86B are expressed by the functions y=f(x) and y=g(x), respectively. For the purpose, the functions f(x) and g(x) may be approximated by respective linear functions each including two factors, and least-squares method may be applied to the data representing the points on the detected edge in the observation fields 86A and 86B so as to determine the two factors in each function. Alternatively, the functions f(x) and g(x) may be approximated by respective segments of a function of circle $(x-x_0)^2 + (y-y_0)^2 = r^2$, and least-squares method may be used so as to determine the factors in this function, since the peripheral edge of the wafer is substantially circular in shape.

There is a measurement point C on the line represented by one function y=f(x), whose coordinates in the new coordinate system (X, Y; O') are represented by $(x_3, y_3)$. There is a measurement point D on the line represented by the other function y=g(x), whose coordinates in the new coordinate system (X, Y; O') are represented by $(x_4, y_4)$. Then, the values of $x_3, y_3, x_4$ and $y_4$ are determined such that they meet the following two conditions: i) a straight line passing through both the measurement points C and D should extend parallel to the X-axis; and ii) the distance in the X-direction between the measurement pints C and D should equal the above mentioned distance L. This means that the values of $x_3$ and $x_4$ can be determined by solving the following simultaneous equations:

$$g(x_4) = f(x_3),$$

$$x_4 - x_3 = L$$

Then, using the determined values of $x_3$ and $x_4$, the values of the associated Y-coordinates $y_3$ and $y_4$ can be determined as:

$$y_3 = f(x_3)$$

$$y_4 = g(x_4)$$

Further, we consider a straight line passing through a midpoint of the line between the measurement points C and D and extending parallel to the Y-axis. Since the midpoint has its X-coordinate equal to $(x_4+x_3)/2$, the straight line is represented by a function $x=(x_4+x_3)/2$. Because the measurement points C and D are determined to meet the above conditions, this straight line $x=(x_4+x_3)/2$ passes through the center O of the wafer 6N. Therefore, the point of intersection between the straight line $x=(x_4+x_3)/2$ and a straight line passing through the measurement point C and perpendicular to the straight line y=f(x) will coincide with the center O of the wafer. Then, if we obtain the coordinates of the intersection (and hence the center O of the wafer) and the distance between the center O and the measurement point C (the radius r from the center O to the measurement point C is obtained). Similarly, the point of intersection between the straight line $x=(x_4+x_3)/2$ and a straight line passing through the measurement point D and perpendicular to the straight line y=g(x) will coincide with the center O of the wafer. Then, if we obtain the coordinates of the intersection (and hence the center O of the wafer) and the distance between the center O and the measurement point D, the radius r' from the center O to the measurement point D is obtained. Alternatively, if the functions f(x) and g(x) are approximated not by linear functions but by segments of a function of circle, the straight lines which are used to intersect the straight line $x=(x_4+x_3)/2$ at the center O would be lines perpendicular to the tangents to the circle at the measurement points C and D.

Further, the coordinates of the center of the reference pin when the corresponding reference pin was pressed against and engaged with the edges of the notch NP have to be determined from the picture data obtained from the observation field 86C for the notch NP. For the purpose, first, the distance LM between two imaginary contact points of the imaginary pin 82C with the edges of the notch NP is determined. Then, least-squares method is applied to the picture data so as to obtain linear functions y=h(x) and y=i(x) approximating the left and right edges of the notch NP, respectively. The center of the imaginary pin 82C when it were pressed against and engaged with the edges of the notch NP is treated as a measurement point F, whose coordinates in the new coordinate system (X, Y; O') are represented by $(x_5, y_5)$.

Then, the coordinate $(x_5, y_5)$ is determined such that the distance between tow points at which a straight line passing through the measurement point F and parallel to the X-axis intersects the straight lines represented by the linear functions y=h(x) and y=i(x), respectively, is determined as LM; and the measurement point F coincide the midpoint of the straight line between the two points of intersection. For the purpose, first, the values of the X-coordinates $x_{51}$ and $x_{52}$ of the two points of intersection are determined by solving the following simultaneous equations:

$$h(x_{51}) = i(x_{52}),$$

$$x_{52} - x_{51} = LM$$

Then, using the determined values of $x_{51}$ and $x_{52}$, the values of $x_5$ and $y_5$ can be determined as:

$$x_5 = (x_{51} + x_{21})/2,$$
$$y_5 = h(x_{51})$$

Next, in FIG. 16(a), the X-coordinate of a straight line which i) is a segment of the straight line passing through the midpoint of the line between the measuring points C and D (the line $x=(x_3+x_4)/2$) and ii) crosses the observation field 86C, is obtained as the X-coordinate of the imaginary point E (i.e., $(x_1+x_2)/2$), so that the rotational error $\Delta\theta$ of the wafer 6N with respect to the center O of the wafer 6N is determined from the distance of the measurement point F on the notch NP from the imaginary point E found in the observation field 86C, according to the following equation.

$$\Delta\theta = \{x_5-(x_1+x_2)/2\}/(r+r')$$

It is noted that this is the rotational error with respect to the center O of the wafer 6N. Actually, the wafer 6N is rotated about the center of rotation O' (0, 0) of the lift support 38. Irrespective of the center of rotation, O or O', the amount of rotational error $\Delta\theta$ is common, so that it can be accurately corrected by rotating the wafer 6N about the rotation center O', which, however, introduces translational errors to the measured values at each of the measurement points C, D and F. Accordingly, calculations are made for the rotational error $\Delta\theta$ with respect to the new coordinate system (X, Y; O'). Specifically, in FIG. 16(a), assuming that the wafer 6N has been rotated about the rotation center O' by the angle to compensate for the rotational error $\Delta\theta$, and the functions for the straight lines $y=f(x)$ and $y=g(x)$ have been transformed by the rotation into functions $y=f'(x)$ and $y=g'(x)$, respectively, calculations are made to determine the transformed functions $f'(x)$ and $g'(x)$.

Since the rotational error $\Delta\theta$ has been already corrected, the calculations may be made in the manner similar to that in the process for determining the functions $f(x)$ and $g(x)$. That is, the coordinates of a measurement point on the straight line $y=f'(x)$ are represented by C' $(x_3', y_3')$ and the coordinates of a measurement point on the straight line $y=g'(x)$ are represented by D' $(x_4', y_4')$. Then, the coordinates $x_3'$ and $x_4'$ are determined such that the measurement points C' and D' are on a straight line parallel to the X-axis and the distance between the measurement points C' and D' equals L. Therefore, the coordinates $x_3'$ and $x_4'$ are determined by resolving the following simultaneous equations:

$$g'(x_4') = f'(x_3'),$$
$$x_4' - x_3' = L$$

Then, $y_3'$ and $y_4'$, the values of the Y-coordinates, are represented as $f'(x_3')$ and $g'(x_4')$, respectively. Using these values, the average differences ($\Delta X$, $\Delta Y$) between the imaginary points A $(x_1, a)$ and B $(x_2, a)$ and the rotation-error-corrected measurement points C' $(x_3', y_3')$ and D' $(x_4', y_4')$ are expressed as:

$$\Delta X = (x_3' + x_4' - x_1 - x_2)/2,$$
$$\Delta Y = (y_3' + y_4' - 2a)/2$$
$$= (f'(x_3') + g'(x_4') - 2a)/2$$

The differences ($\Delta X$, $\Delta Y$) equal the translational or positional errors of the wafer 6N in the X- and Y-directions from the position of the wafer which would be found if the wafer 6N undergoes the prealignment process using the prealignment mechanism of contact type. In this embodiment, these translational errors are treated as offsets for the search alignment, and corrected by adjusting the displacements of the wafer stage in the course of the search alignment process.

In the above example, it is assumed that there is relatively large variations in the radius r (or r'); however, it may be alternatively assumed that the radius r is constant because a typical, maximum possible error in diameter of the wafers is as small as within ±0.1 μm.

If wafers have relatively great variations in diameter, the contact points on the imaginary pins 82A and 82B at which a wafer contact with them can no longer deemed to be constant, so that the distance L between the imaginary points A and B can not be treated as a constant distance. In such case, the contact point between the edge of a particular wafer and the imaginary pins may be determined from the slopes of the linear functions $f(x)$ and $g(x)$ (or the tangents to a circle function if it is used) as determined from the edges in the images in the observation fields 86A and 86B, and the distance between the contact points may be used as the distance L. Similarly, if wafers have relatively great variations in the shape of the notch NP, the distance LM between the contact points between the edges of a particular notch and the imaginary pin 82C may be treated as a variable, while if such variations are relatively small, the distance LM may be deemed as a constant. Further, because the peripheral edge of a wafer is nominally circular in shape, it may be convenient to approximate the peripheral edge by a quadratic curve. Further, the above arithmetic operations are usable when the light-receiving unit in the two-dimensional image processing unit is disposed to be parallel to the line $y=a$. It may be possible that the coordinate system on the light-receiving unit has been rotated due to some reason, such as the error in the positioning of the light-receiving unit or the limitations to the space for the light-receiving unit. In such case, suitable modifications may be made to the programs for the arithmetic operations so as to make required corrections.

In this manner, the rotational error $\Delta\theta$ and the offsets $\Delta X$ and $\Delta Y$ of the wafer 6N may be determined with precision with only one repetition of the sequence of calculations for correction. Further, where the coordinates $x_3'$ and $y_3'$ of the rotation-error-corrected measurement points are determined following the determination of the rotation-error-corrected functions $f'(x)$ and $g'(x)$, then, the accuracy in the matching with the contact-prealignment mechanism may be further improved by correcting the approximation errors involved in the determination of the one-dimensional (or linear) functions $f'(x)$ and $g'(x)$ such that the points at which the imaginary pins are actually engaged with the wafer edge are used as shown in FIG. 15(d).

Figure 17A:
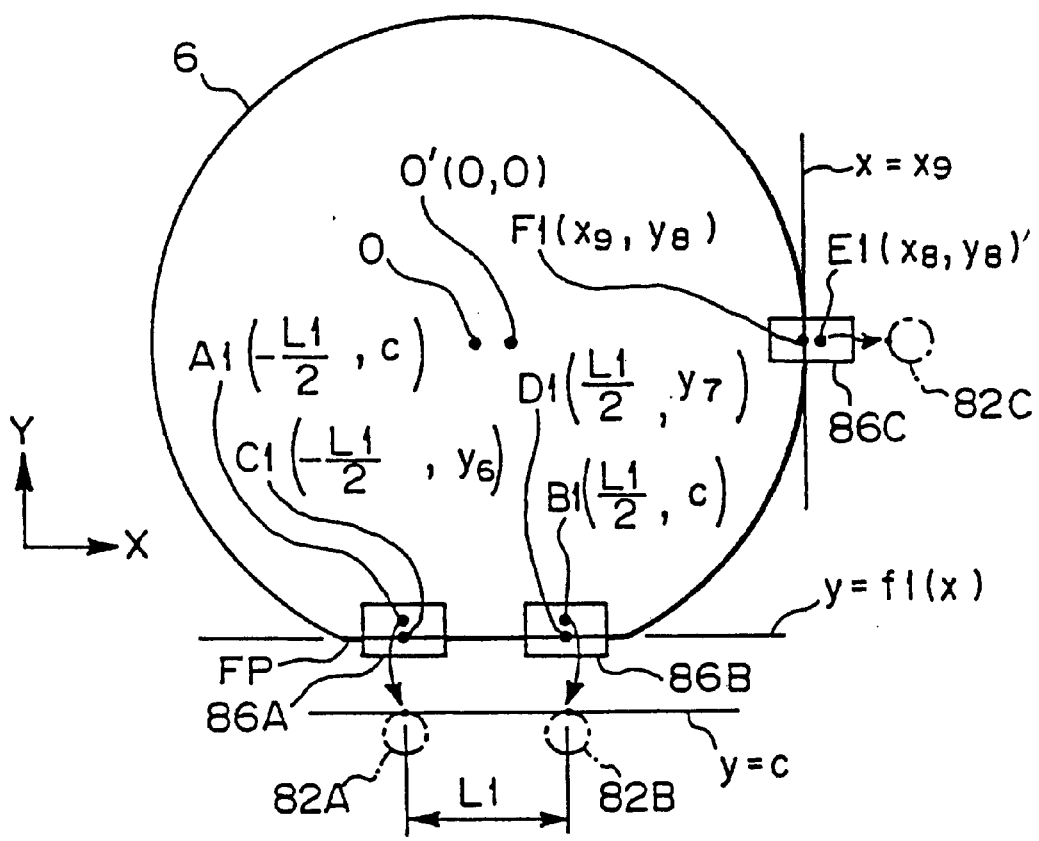
FIGS. 17(a) through 17(d) illustrate a method of detecting edge positions of an wafer 6 having an orientation flat, while maintaining the matching with a contact-prealignment mechanism.

FIG. 17(a) shows a wafer 6 having an orientation flat FP at a position of six o'clock which has been just transferred to the loading position. Again, FIG. 17(a) shows i) the observation or viewing fields 86A, 86B and 86C of the three image processing units 50, 51 and 52, respectively, (the images in the observation fields may be subjected to the actual image processing) and ii) imaginary pins 82A, 82B and 82C (indicated by imaginary line circles) corresponding to the reference pins in the prealignment mechanism of contact type which is equipped in an exposure apparatus used for the previous exposure process, for example. It is noted that, for clarity of the figure, the imaginary pins 82A–82C are illustrated enlarged and extracted to the outside of the respective observation fields 86A–86C. Those points on the sides of the imaginary pins 82A and 82B in the observation fields 86A and 86B located on the orientation flat FP at which the peripheral edge of a wafer should contact with the imaginary pins 82A and 82B after prealignment are referred to as imaginary points A1 and B1, respectively. Similarly, that point on the side of the imaginary pin 82C in the observation field 86C on the circular peripheral edge at which the edge of a wafer should contact with the imaginary pin 82C after prealignment is referred to as an imaginary point E1.

In order to determine the positions of the imaginary points A1, B1 and E1, a reference wafer having reference marks formed thereon which indicate the imaginary points may be used as with the previous example. In this example, again, the positions are determined in terms of the coordinates in the stage coordinate system of the rotation center O' of the lift support 38 of FIG. 5(b). Thereafter, a new coordinate system (X, Y; O') is used taking the rotation center O' as its origin and having X-axis parallel to the line passing through the imaginary points A1 and B1.

Then, variable L1 is put equal to the distance in the X-direction between the imaginary points A1 and B1. Further, the coordinates of the imaginary points A1, B1 and E1 in the new coordinate system (X, Y; O') are represented by $(-L1/2, c)$, $(L1/2, c)$ and $(x_8, y_8)$, respectively, and the coordinates of the imaginary points A1, B1 and E1 relative to the observation fields 86A, 86B and 86C are stored. Using y as the Y-coordinate in the new coordinate system (X, Y; O'), it can be expressed that the imaginary points A1 and B1 lie on the line y=c, as shown in FIG. 17(a).

Figure 17B:
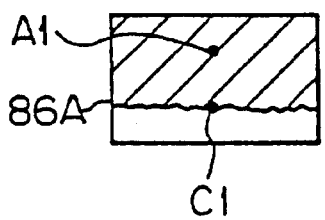
Figure 17C:
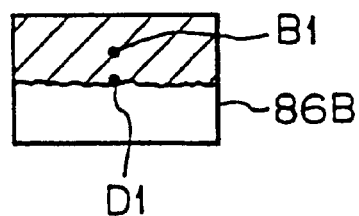
Figure 17D:
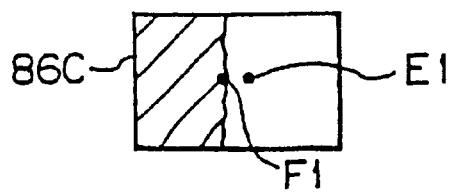

Because of the illumination by light beams illuminated from the bottom side of the wafer 6, the images observed in the observation fields 86A, 86B and 86C are seen as shown in FIGS. 17(b), 17(c) and 17(d), respectively, wherein each image has a dark region (hatched in the figure) corresponding to the peripheral portion of the wafer and a bright region corresponding to the outside space of the wafer, so that the peripheral edge of the wafer 6 can be detected as the edge in the image dividing the dark and bright regions.

Next, we will describe how to detect the position and the rotational angle of an actual wafer 6 when the wafer 6 has been brought to the loading position as shown in FIG. 17(a). With respect to an image in each of the two observation fields on the orientation flat FP, 86A and 86B, the peripheral edge of the wafer corresponding to the edge in the image dividing the bright region and the dark region has a shape of a substantially straight line parallel to the X-axis. Then, measurement points C1 and D1 are determined. The measurement point C1 is an intersection point at which the edge of the orientation flat FP intersects a line passing through the imaginary point A1 and perpendicular to that edge, and which is represented by $(-L1/2, y_6)$. The measurement point D1 is an intersection point at which the edge of the orientation flat FP intersects a line passing through the imaginary point B1 and perpendicular to that edge, and which is represented by $(L1/2, y_7)$. The detection accuracy may be improved by using the average positions of the edge within predetermined ranges about the measurement points C1 and D1, respectively, as the coordinates $y_6$ and $y_7$.

Further, with respect to the observation field 86C, a measurement point F1 is determined. The measurement point F1 is an intersection point at which the circular peripheral edge of the wafer 6 intersects a line passing through the imaginary point E1 and perpendicular to that peripheral edge, and which is represented by $(x_9, y_8)$. The coordinates $(x_9, y_8)$ are defined in the new coordinate system (X, Y; O'), and the peripheral edge of the wafer 6 within the observation field 86C may be represented by a straight line $x=x_9$.

The distance between the two measurement points C1 and D1 will equal the distance L1, so that the rotational error $\Delta\theta$ of the wafer 6 is expressed as:

$$\Delta\theta = (y_7 - y_6)/L1$$

Because the rotational error $\Delta\theta$ of the wafer 6 is determined from the data obtained only the orientation flat FP, the rotational error $\Delta\theta$ can be corrected by making the correction by rotating the lift support 38 about its rotation center O', and thus it is unnecessary to know the center O of the wafer 6. However, by rotating the wafer about the rotation axis O' of the lift support 38, a corresponding offset is introduced in the coordinates $(x_9, y_8)$ of the measurement point F1. Accordingly, the new coordinate system (X, Y; O') is rotated by $\Delta\theta$, and then, in the rotated coordinate system, points C1', D1' and F1' are determined as the intersections between the respective perpendiculars from the imaginary points A1, B1 and E1 to the corresponding edge portions of the wafer 6 and those edge portions, and the coordinates $(-L/2, y_6')$, $(L/2, y_7')$ and $(x_9', y_8)$ are determined by repeating the above arithmetic operations. Thereafter, the translational or positional errors (offsets) in the X- and Y-directions $\Delta X$ and $\Delta Y$ are determined by calculations according to the following equations:

$$\Delta X = x_9' - x_8,$$
$$\Delta Y = (y_6' + y_7')/2 - c$$

These offsets $\Delta X$ and $\Delta Y$ can be corrected in the subsequent search alignment process by adjusting the wafer stage, as with the example of FIGS. 16(a) to 16(d) described above. Further, as described in connection with the detection of the position for the wafer having a notch as shown in FIG. 16(a), if there are errors between the positions of the edge of the wafer 6 as determined from the average value of the image data and the positions of the actual contact points between the imaginary pins and the edge of the wafer, such errors may be reduced by choosing the data to be finally used, as shown in FIG. 15(d).

As described, in the embodiment described here, the procedure includes the steps of detecting the peripheral edge of a wafer, then correcting the rotational error of the wafer by means of the rotatable lift support 38, and performing calculations in order to obtain the offsets which will be introduced by the rotation of the lift support 38, so as to eliminates another detection process for checking the correction results. Thus, the detection process need not be repeated, resulting in that the noncontact-type wafer prealignment may be quickly performed.

Nevertheless, a limited positional offset and/or rotational offset may be introduced in the position of the wafer when the lift support 38 is rotated to place the wafer onto the wafer holder 30, for some reason such as possible vibrations at starting the vacuum-holding or possible failure of parallelism between the surfaces of the wafer and the wafer holder 30. This may be accommodated by detecting the difference between the edge position of the wafer which is detected and stored with respect to the reference wafer and the edge position of the actual wafer, by means of an off-axis-type alignment sensor system, and the detected difference is used as the system offset so as to add the system offset to the determined results of the translational offsets ΔX and ΔY and the rotational offset Δθ during the search alignment process subsequent to the placement of the wafer on the wafer holder 30.

Referring next to a flow chart divided into three pieces shown in FIGS. 2, 3A and 3B, an exemplified sequence of operations in the entire positioning process in the projection exposure apparatus will be described.

Figure 2:
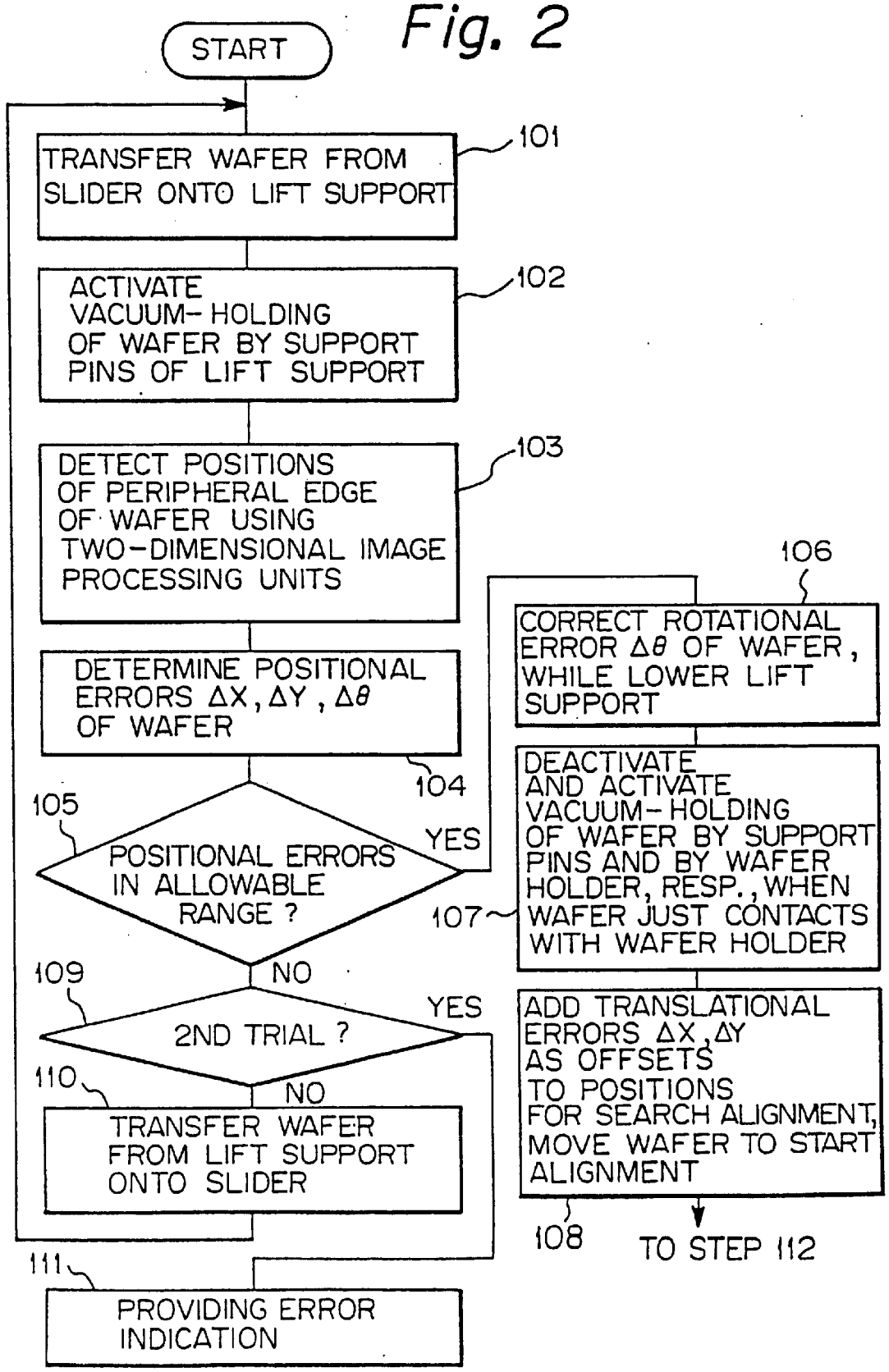
FIG. 2 is a flow chart illustrating a prealignment process in a positioning method according to an embodiment of the present invention.

To begin with step 101 in FIG. 2, a wafer 6 is held by vacuum suction on and transferred by the transfer arm 21 along the slider 23 of FIG. 5(b) onto the loading position, at which the vacuum-holding by the transfer arm 21 is released and at the same time the lift support 38 is raised by the linear actuator 35, and the wafer is transferred onto the raised lift support 38. At the same time, the vacuum-holding by the support pins 38a–38c of the lift support 38 is activated (step 102). By this point of time, a process for rough prealignment of the wafer 6 in the X-, Y- and rotational (or θ-) directions has been established on an outer contour basis by means of mechanisms including the turn table 60 of FIG. 5(c), resulting in that there may be errors in the X- and Y-directions only within about 2 mm and a rotational error only within about 5° (5 degrees), in the positioning of the wafer 6 on the lift support 38.

For establishing this rough prealignment, the turntable 60 is used to rotate the wafer 6 to make a rough correction of any rotational error of the wafer 6, and the loading position of the transfer arm 21 for transferring the wafer 6 onto the lift support 38 is adjusted in the X- and Y-directions to make a rough correction of any errors in the X- and Y-directions. Relatively large translational and rotational errors may remain after this rough prealignment because the mechanical unit including the turntable 60, as well as the mechanical unit including the slider 23, are arranged to have no direct mechanical connection with the remaining part (or main part) of the exposure apparatus in order to prevent any vibrations from transmitting from the mechanical units to the main part of the exposure apparatus. Thus, for example, the main part of the exposure apparatus and the mechanical unit including the slider 23 may shake independently with different vibration modes resulting in a possible, large relative displacement between them, which may cause a relatively large positioning errors (transfer errors) upon transfer of the wafer from the slider 23 to the lift support 38.

Thereafter, in step 103, the position detection of the peripheral edge of the wafer 6 is carried out using the three two-dimensional image processing units 50–52 of FIG. 4. In this example, the position of the edge is measured within the two observation fields 86A and 86B on the orientation flat FP of the wafer 6 as well as within the observation field 86C on the circular peripheral edge of the wafer 6. This position detection of the wafer edge is carried out for the prealignment of the wafer. In a typical, conventional prealignment process, three reference pins mounted on a wafer holder have been used, and the edge of a wafer is pressed against and engaged with the reference pins. Such prealignment is referred to as the contact-type prealignment. In contrast, the prealignment process of the present invention is of noncontact-type.

The locations of the three observation fields 86A, 86B and 86C are selected to include therein the imaginary points A1, B1 and E1, respectively, which are coincident with the contact points of three reference pins at which they contact with a wafer, the three reference pins being used in some other, particular exposure apparatus for the contact-type prealignment. By virtue of this selection of the locations of the observation field, an advantage is obtained: when a previous photosensitive layer on a wafer (the layer immediately below the layer which is going to be exposed) has been exposed by using that particular exposure apparatus in which contact-type prealignment is performed, a high degree of matching between the prealignment processes may be obtained, and hence there remain relatively small positioning errors after the prealignment. As previously mentioned, when the locations of the observation fields 86A–86C can not be selected to include the imaginary points due to the interference by other sensors and devices disposed around the projection optical system 3, the positions of the edge of the wafer at the position of the reference pins may be determined with precision from the measurement results of the contour of the wafer obtained through the turntable 60 and the eccentricity sensor 61 of FIG. 5(c).

Alternatively, if the wafer is of the type having a notch, such as the wafer 6N with the notch NP as shown in FIG. 16(a), matching with the contact-type prealignment may be obtained by determining offsets between the peripheral edge of the wafer 6N and each of the imaginary points A, B and E through the image processing, as described with reference to FIGS. 16(a) to 16(d).

If the wafer has a notch and it in unnecessary to obtain matching with any other exposure apparatus in which contact-type prealignment is performed, then the method described above with reference to FIG. 8(b) may be used, which includes obtaining position data on all the points on the two edges 65A and 65B of the notch NP and applying least-squares method to the position data so as to obtain an imaginary notch shape (V-shape defined by two approximated straight lines), and uses the point of intersection between the two approximated straight lines as the notch detection point. In this manner, the position detection of the wafer may be achieved with precision irrespective of the error in the geometry of the notch NP.

In the operation sequences described above with reference to FIGS. 16 and 17, the positions of the imaginary points A, B and E, as well as those of the imaginary points A1, B1 and E1, are determined by using a reference wafer having reference marks formed thereon. Alternatively, the positions of the imaginary points may be determined by calculations, and several process sequences using such determination method will be described below in detail.

[Process Sequence 1]

First, a process sequence for achieving prealignment of a wafer 6 having an orientation flat FP will be described with reference to schematic plan views of the wafer shown in FIGS. 19 and 20 as well as a flow chart shown in FIG. 21.

Figure 19:
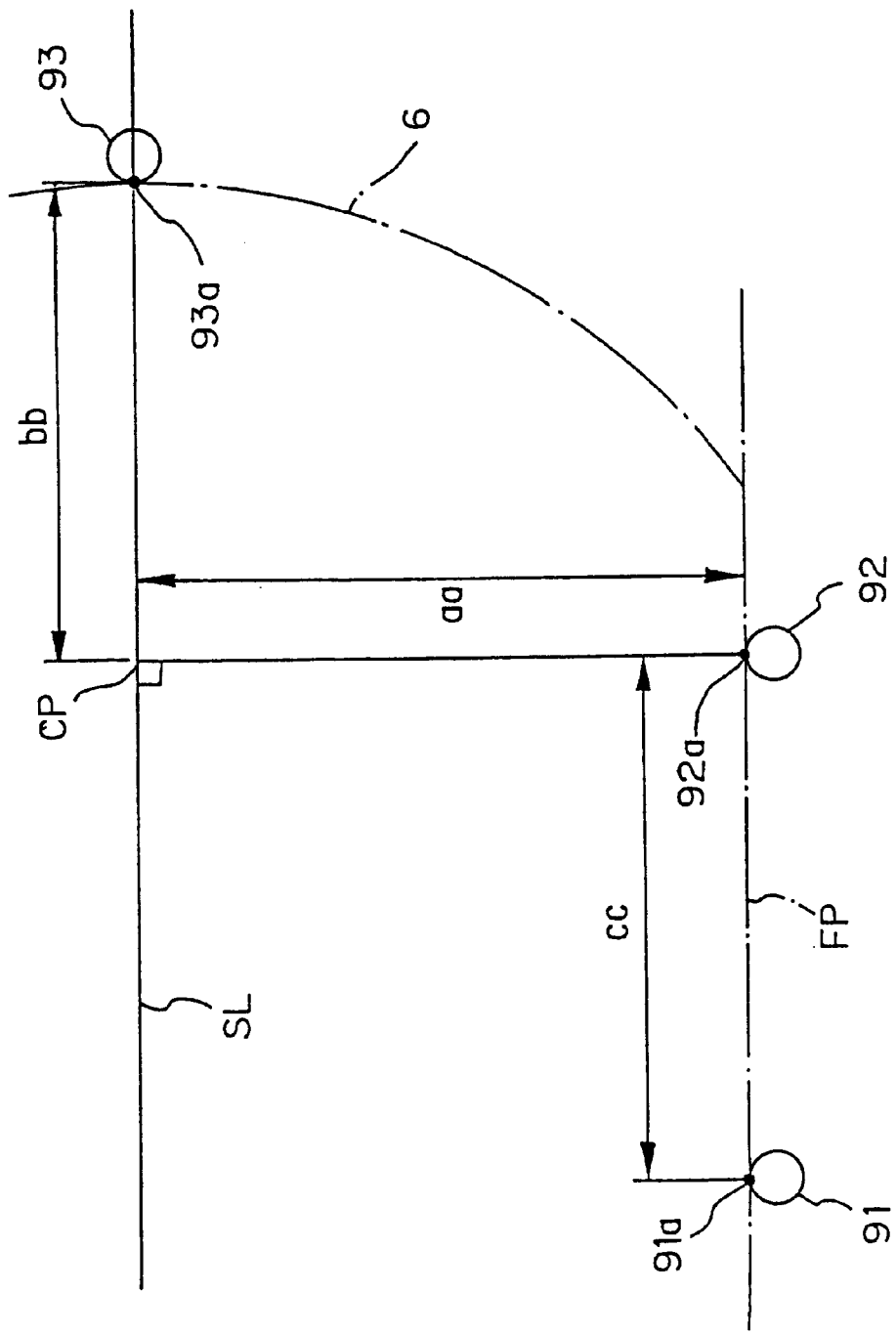
FIG. 19 is a schematic illustrating the relationship among the positions of three fixed pins used in a conventional prealignment mechanism.

FIG. 19 is a schematic illustrating the relationship among the positions of three fixed pins 91, 92 and 93 used in a typical, conventional prealignment mechanism. As seen from FIG. 19, two of the pins, 91 and 92, are in contact with the edge of the orientation flat FP of the wafer 6 at contact points 91a and 92a, respectively, while the remaining pin 93 is in contact with the edge of the circular periphery of the wafer 6 at a contact point 93a. SL represents a straight line extending through the point 93a and parallel to a line joining points 91a and 92a. CP represents a point at which a line extending through the point 92a and perpendicular to the line SL meets this line SL. Further, aa represents the distance between the point 92a and the point CP, bb represents the distance between the point 93a and the point CP, and cc represents the distance between the point 91a and the point 92a. The values of aa, bb and cc are design values which are predetermined by the arrangement of the set of the three pins 91, 92 and 93.

Figure 20:
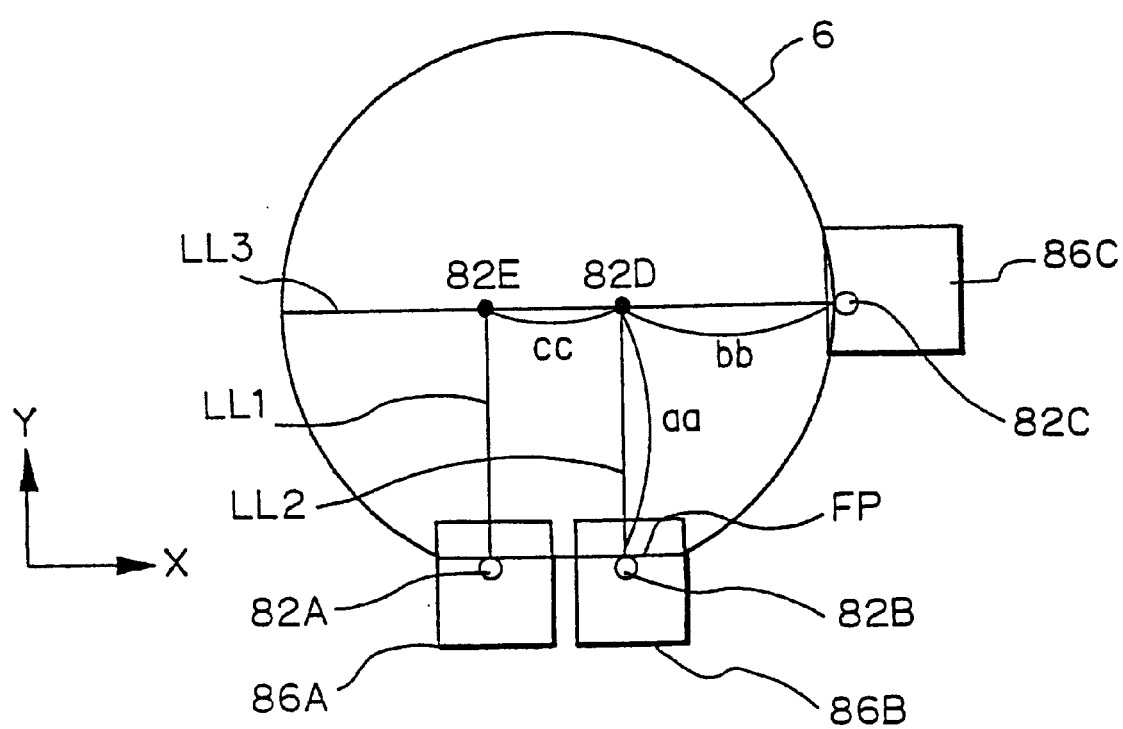
FIG. 20 is a schematic illustrating the relationship of the positions of observation or viewing fields of image processing units relative to a wafer.
Figure 21:
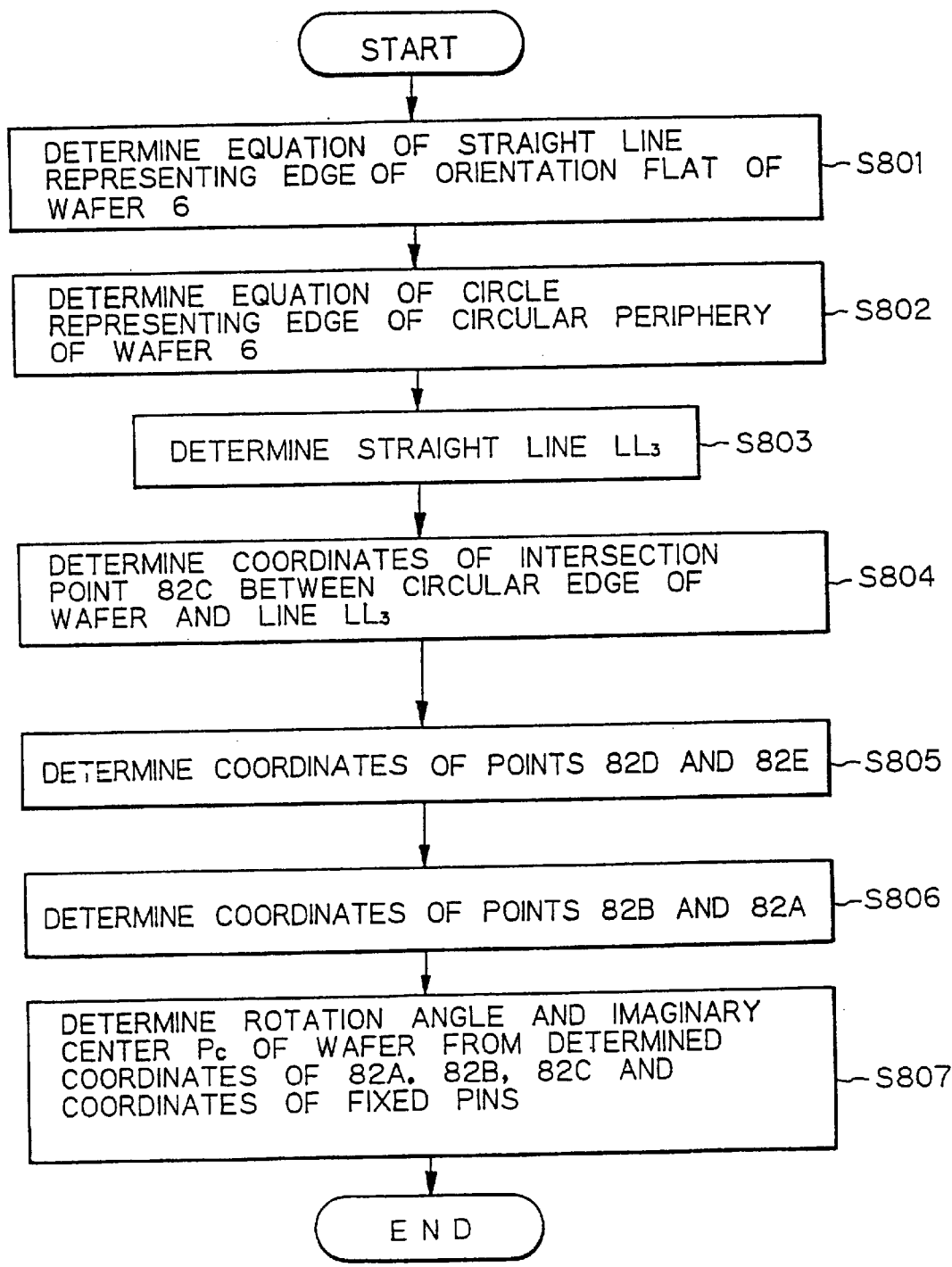
FIG. 21 is a flow chart showing a process sequence for establishing prealignment of a wafer.

FIG. 20 illustrates the relationship between (i) the positions of the observation or viewing fields 86A, 86B and 86C (which are fixed relative to the wafer stage) of the three image processing units 50, 51 and 52, respectively, incorporated in the projection exposure apparatus shown in FIG. 4 and (ii) the position of the wafer 6 held on the lift support 38. As shown in FIG. 20, two observation fields 86A and 86B associated with the image processing units 50 and 51 are situated on the edge of the orientation flat FP of the wafer 6, while the remaining one observation field 86C associated with the image processing unit 52 is situated on the edge of the circular periphery of the wafer 6. The positions of the observation fields 86A, 86B and 86C are known constants predetermined for the particular exposure apparatus.

In FIG. 20, reference numerals 82A, 82B and 82C designate imaginary pins. These imaginary pins 82A, 82B and 82C have the same positional relationship among them as the fixed pins 91, 92 and 93 used in the above mentioned conventional prealignment mechanism; however, as suggested by the term "imaginary", the pins 82A, 82B and 82C do not actually exist on the wafer stage.

At the first step in this sequence, the image processing units 50 and 51 having their observation fields situated on the edge of the orientation flat FP of the wafer 6 are used in order to determine an equation expressing a straight line representing the edge of the orientation flat FP (S801). This equation may be obtained by averaging Equations (1) and (2) below, wherein Equation (1) expresses a straight line representing this edge as determined based on the measurement results from the image processing unit 50 having the observation field 86A, while Equation (2) expresses a straight line representing this edge as determined based on the measurement results from the image processing unit 51 having the observation field 86B. The averaged equation is given below as Equation (3). Of course, either Equation (1) or (2) may be used in place of Equation (3).

$$Y = A_1 X + B_1 \quad (1)$$

$$Y = A_2 X + B_2 \quad (2)$$

$$Y = AX + B$$

where $$A = (A_1 + A_2)/2, \quad B = (B_1 + B_2)/2 \quad (3)$$

Next, an equation which expresses a circle representing the edge of the circular periphery of the wafer 6 is determined based on the measurement results from the image processing unit 52 having its observation field 86C situated on this edge (S802). This equation is formulated as Equation (4) below.

$$(X - X_0)^2 + (Y - Y_0)^2 = R_0^2 \quad (4)$$

Thereafter, we determine a straight line $LL_3$ which extends parallel to the line expressed by Equation (3) above and is spaced from that line by the distance aa toward the center of the wafer 6 (S803). This line $LL_3$ is determined according to Equation (5) below.

$$Y = AX + B + aa(1 + A^2)^{1/2} \quad (5)$$

Then, we determine an intersection point 82C ($X'_3$, $Y'_3$) between the circle expressed by Equation (4) above, which represents the circular edge of the wafer 6, and the line $LL_3$ expressed by Equation (5) above (S804). This intersection point 82C is determined according to Equations (6) below.

$$X'_3 = [X_0 - AC + [(X_0 - AC)^2 - (1 + A^2)(X_0^2 + C^2 - R_0^2)]^{1/2}]/(1 + A^2)$$

$$Y'_3 = AX_3 + B + aa(1 + A^2)^{1/2}$$

where $$C = B + aa(1 + A^2)^{1/2} - Y_0 \quad (6)$$

Then, we determine a point 82D ($X'_4$, $Y'_4$) which lies on the line $LL_3$ and is distant from the intersection point 82C by the distance bb, as well as a point 82E ($X'_5$, $Y'_5$) which lies on the line $LL_3$ and is distant from the point 82D by the distance cc (S805). These points 82D and 82E are determined according to Equations (7) below.

$$X'_4 = X'_3 - bb/(1 + A)$$

$$Y'_4 = A \times X'_3 - A \times bb/(1 + A) + B + aa(1 + A^2)^{1/2}$$

$$X'_5 = X'_3 - (bb + cc)/(1 + A)$$

$$Y'_5 = A \times X'_3 - A(bb + cc)/(1 + A) + B + aa(1 + A^2)^{1/2} \quad (7)$$

Next, we determine an intersection point 82B ($X'_2$, $Y'_2$) between (i) a line $LL_2$ extending through the point 82D and perpendicular to the line $LL_3$ and (ii) the edge of the orientation flat FP, as well as an intersection point 82A ($X'_1$, $Y'_1$) between (iii) a line $LL_1$ extending through the point 82E and perpendicular to the line $LL_3$ and (iv) the edge of the orientation flat FP (S806). These intersection points 82B and 82A are determined according to Equations (8) below.

$$X'_2 = X'_4 + aa \times A/(1 + A^2)^{1/2}$$

$$Y'_2 = A \times X'_4 - aa \times A^2/(1 + A^2)^{1/2} + B$$

$$X'_1 = X'_5 + aa \times A/(1 + A^2)^{1/2}$$

$$Y'_1 = A \times X'_5 - aa \times A^2/(1 + A^2)^{1/2} + B \quad (8)$$

These coordinates 82A ($X'_1$, $Y'_1$), 82B ($X'_2$, $Y'_2$) and 82C ($X'_3$, $Y'_3$) thus determined represent the coordinates of such points at which the pins 91, 92 and 93 used in the above mentioned conventional prealignment mechanism should be in contact with the wafer 6, respectively.

[Process Sequence 2]

Now, another process sequence for achieving prealignment of a wafer 6 having an orientation flat FP will be described with reference to a schematic plan view of the wafer shown in FIG. 22 and a flow chart shown in FIG. 23.

Figure 22:
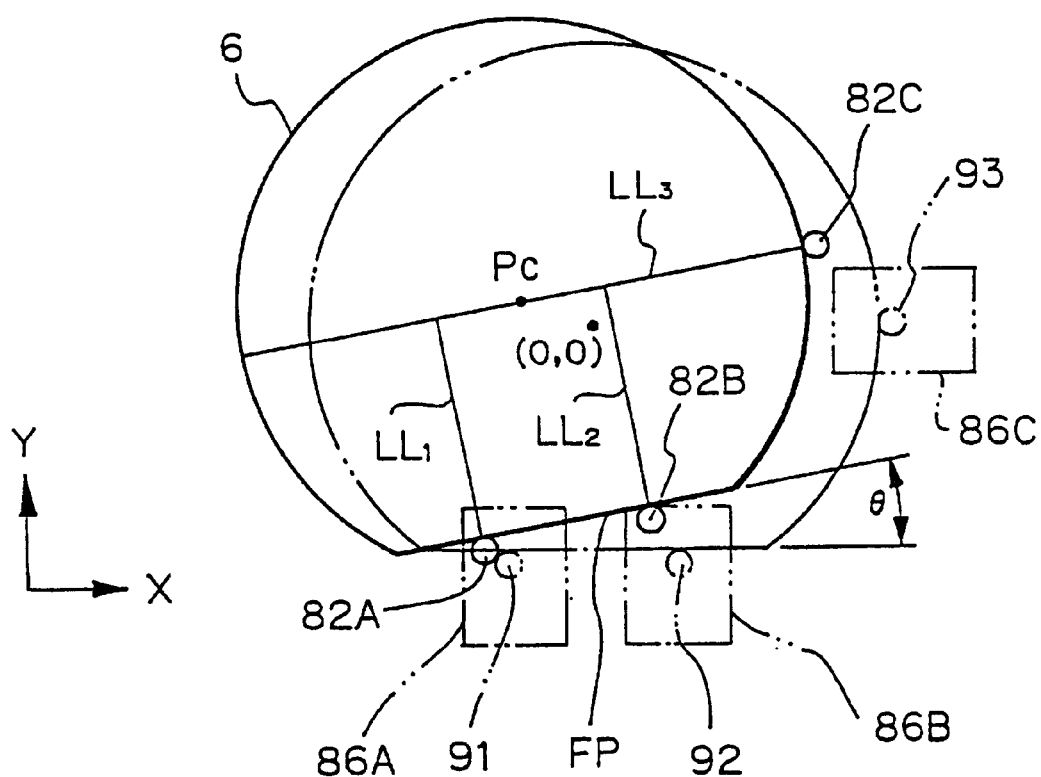
FIG. 22 is a schematic plan view showing an arrangement of a wafer useful for illustrating the process sequence.
Figure 23:
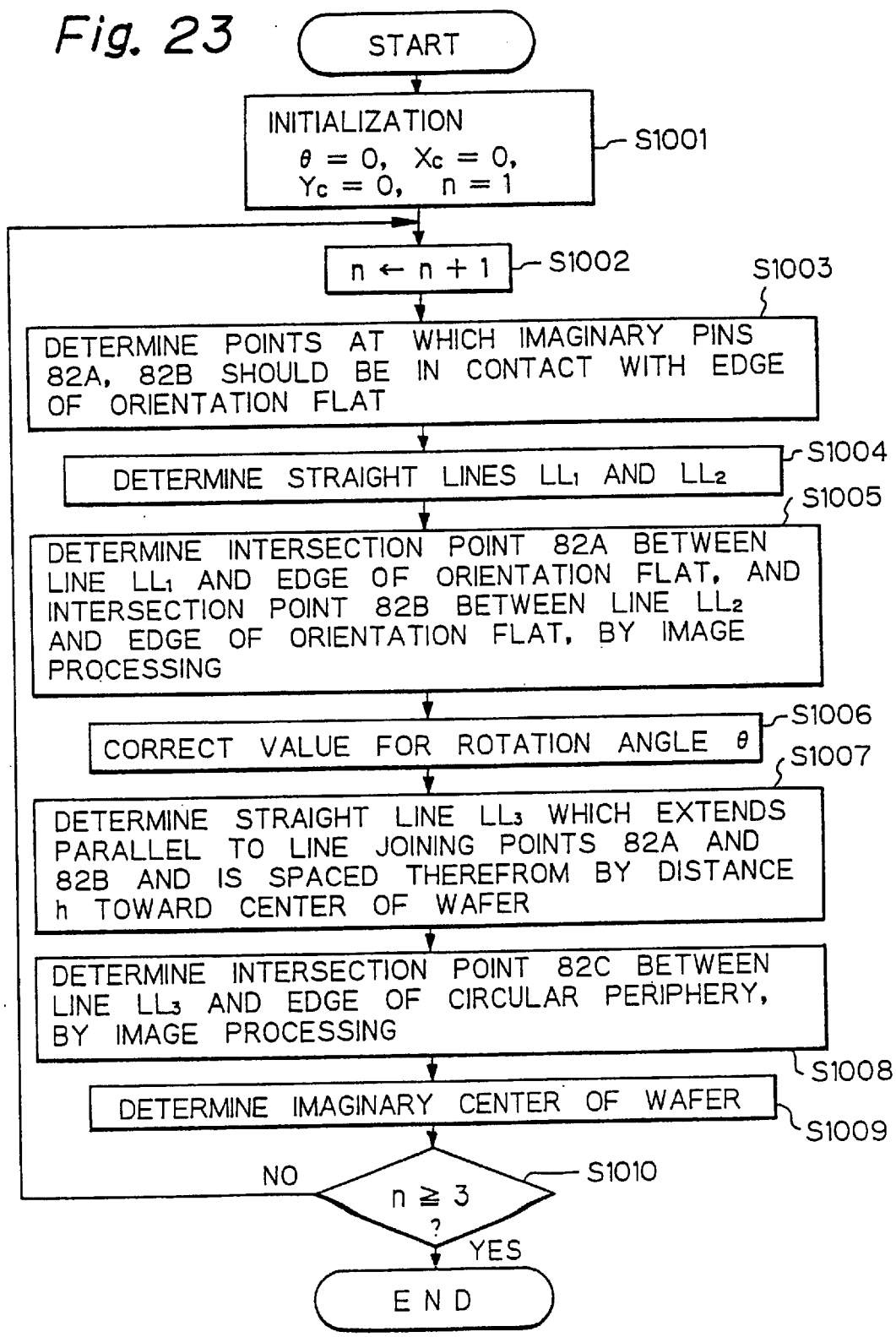
FIG. 23 is a flow chart showing said another process sequence for establishing prealignment of a wafer.

In FIG. 22, the wafer 6 outlined by a solid line represents a wafer which is held on the lift support of the wafer stage but has not yet undergone prealignment sequence, while the wafer outlined by a phantom line represents a wafer which has undergone prealignment through a conventional prealignment mechanism using three fixed pins. The relationship among the positions of the fixed pins 91, 92 and 93, as well as that among the positions of the imaginary pins 82A, 82B and 82C, are identical to those described with reference to FIGS. 19 and 20. In the situation shown in FIG. 22, the wafer 6 is held on the lift support with its orientation or angular position rotated by an angle è from the desired orientation which should be established after prealignment, and with its imaginary center located at a point $P_C$ having coordinates $P_C$ ($X_C$, $Y_C$), or sifted by $X_C$ to the X-direction and by $Y_C$ to the Y-direction.

At the first step in this sequence, initialization is performed, in which each of the values for the rotation angle θ of the wafer and for the coordinates $X_C$ and $Y_C$ of the imaginary center of the wafer is set to "0" as the initial value (i.e., θ=0, $X_C$=0 and $Y_C$=0), and the count n of a counter is set to "1" (i.e, n=1) (S1001). Then, we increment the count n by "1" (S1002) and determine points 82A ($X'_1$, $Y'_1$) and 82B ($X'_2$, $Y'_2$) at which the imaginary pins 82A and 82B, respectively, should be in contact with the edge of the orientation flat FP (S1003). These points 82A and 82B are determined according to Equations (9) below.

$$X'_1 = -d_0 \cos\theta + h\sin\theta + X_C$$
$$Y'_1 = -d_0 \sin\theta - h\cos\theta + Y_C$$
$$X'_2 = d_0 \cos\theta + h\sin\theta + X_C$$
$$Y'_2 = d_0 \sin\theta - h\cos\theta + Y_C$$

where $$2 \times d_0 = c, \; h = a \quad (9)$$

Then, we determine a straight line $LL_1$ extending through the point 82A and having an inclination equal to θ with respect to the Y-axis, as well as a straight line $LL_2$ extending through the point 82B and having an inclination equal to θ with respect to the Y-axis (S1004). These lines $LL_1$ and $LL_2$ are determined according to Equations (10) below.

$$\text{Line } LL_1: (X-X'_1) = -\tan\theta\, (Y-Y'_1)$$
$$\text{Line } LL_2: (X-X'_2) = -\tan\theta\, (Y-Y'_2) \quad (10)$$

Next, we determine an intersection point 82A ($X'_1$, $Y'_1$) between the line $LL_1$ and the edge of the orientation flat FP, as well as an intersection point 82B ($X'_2$, $Y'_2$) between the line $LL_2$ and the edge of the orientation flat FP, by performing image processing with respect to the observation fields 86A and 86B, respectively (S1005). Then, correction is made to the value for the rotation angle θ according to Equation (11) below, using the coordinates of the intersection points 82A and 82B just determined by the image processing.

$$\theta = \tan^{-1}[(Y'_2 - Y'_1)/(X'_2 - X'_1)] \quad (11)$$

Next, we determine a straight line $LL_3$ which extends parallel to a line joining points 82A and 82B and is spaced from that line by the distance h toward the center of wafer (S1007). This line $LL_3$ is expressed by Equation (12) below.

$$\text{Line } LL_3: (Y'_2-Y'_1)X - (X'_2-X'_1)Y - X'_1 Y'_2 + X'_2 Y'_1 + h[(Y'_2-Y'_1)^2 - (X'_2-X'_1)^2]^{1/2} = 0 \quad (12)$$

Then, we determine an intersection point 82C ($X'_3$, $Y'_3$) between the line $LL_3$ and the edge of the circular periphery of the wafer, by performing image processing (S1008). Thereafter, the coordinates $P_C$ ($X_C$, $Y_C$) of the imaginary center of the wafer are determined according to Equations (13) below (S1009).

$$X_C = X'_3 - R_0 \cos\theta$$
$$Y_C = Y'_3 - R_0 \sin\theta \quad (13)$$

[Process Sequence 3]

Now, a process sequence for achieving prealignment of a wafer 6N having a notch will be described with reference to schematic plan views of the wafer shown in FIGS. 24 and 25, a flow chart shown in FIG. 26 and the illustrative view shown in FIGS. 8(a) and 8(b) illustrating the position of the notch.

Figure 24:
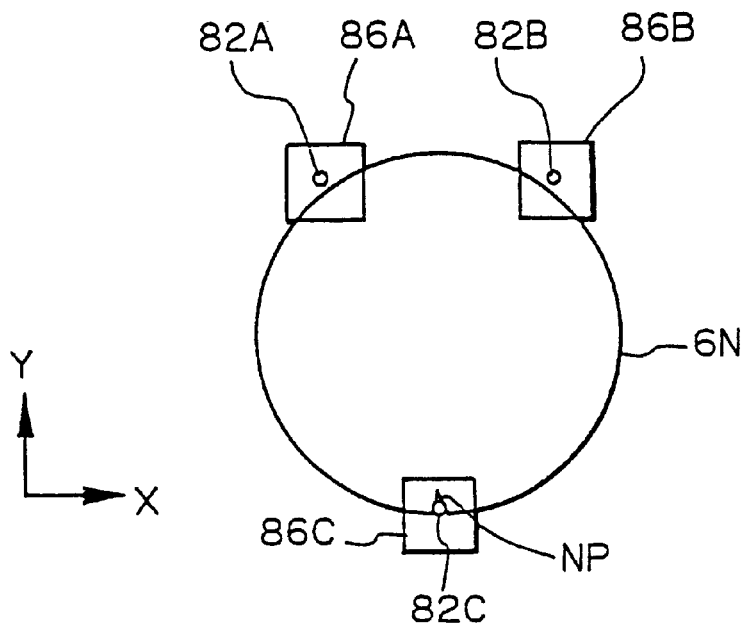
FIG. 24 is a schematic illustrating the relationship of the positions of observation or viewing fields of image processing units relative to a wafer.

FIG. 24 illustrates the relationship between (i) the positions of the observation or viewing fields 86A, 86B and 86C (which are fixed relative to the wafer stage) of the three image processing units 50, 51 and 52, respectively, incorporated in the projection exposure apparatus shown in FIG. 4 and (ii) the position of the wafer 6N held on the lift support 38. As shown in FIG. 24, the observation field 86C of the image processing unit 50 is situated on the notch NP of the wafer 6N, while the remaining two observation fields 86A and 86B of the image processing units 51 and 52 are situated on the edge of the circular periphery of the wafer 6N at positions opposite to the notch NP. The positions of the observation fields 86A, 86B and 86C are known constants predetermined for the particular exposure apparatus.

In FIG. 24, reference numerals 82A and 82B designate imaginary fixed pins, and 82C designates an imaginary movable pin. These imaginary pins 82A, 82B and 82C have the same positional relationship among them as the set of two fixed pins and one movable pin used in a typical, conventional prealignment mechanism; however, as suggested by the term "imaginary", the pins 82A, 82B and 82C do not actually exist on the wafer stage. The distance between the imaginary pins 82A and 82B is $2 \times d_0 = 2^{1/2} \times R_0$.

Figure 25:
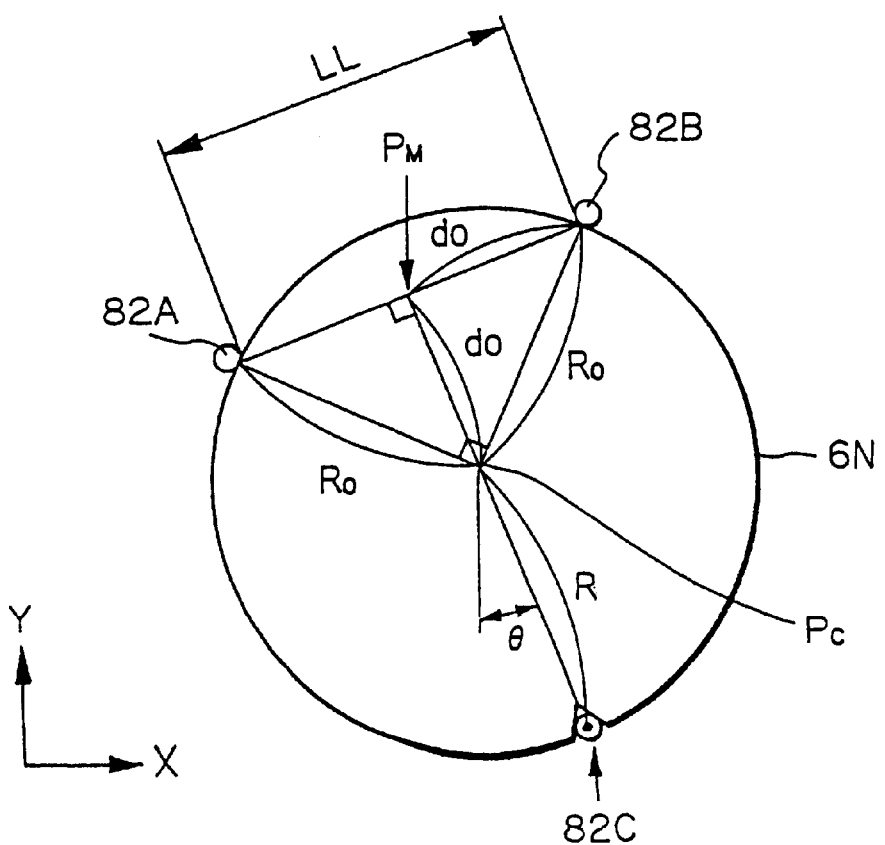
FIG. 25 is a schematic plan view of a wafer useful for illustrating a further process sequence.
Figure 26:
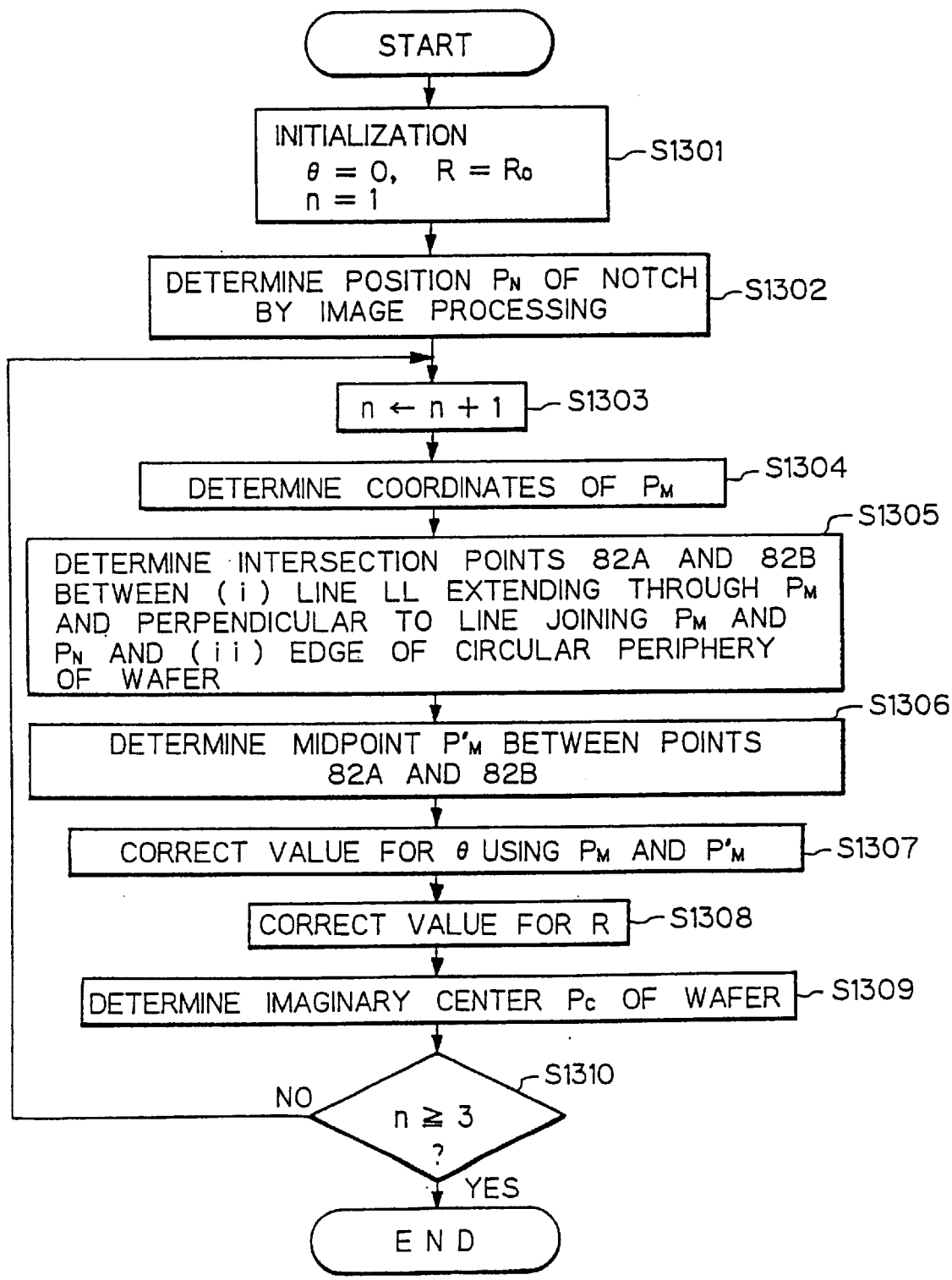
FIG. 26 is a flow chart showing said further process sequence for establishing prealignment of a wafer.

FIG. 25 is a schematic illustrating the wafer 6N held on the lift support with its orientation or angular position rotated by an angle è with respect to the prealignment coordinate system, and further illustrating the imaginary pins 82A, 82B and 82C in contact with the edge of the wafer 6N. Here, imaginary center $P_C$ of the wafer 6N is defined as a point which forms together with the points of the imaginary pins 82A and 82B a rectangular equilateral triangle having its right angle corner formed at the imaginary center $P_C$. Further, R represents the distance between the imaginary center $P_C$ and the position 82C of the notch NP (which is the position of the center O of the imaginary pin 82C in contact with both edges of the notch NP).

At the first step in this sequence, initialization is performed, in which the value for the rotation angle θ of the wafer is set to "0" and the value for the radius R of the wafer is set to "$R_0$" as respective initial values (i.e., θ=0 and R=$R_0$), and the count n of a counter is set to "1" (i.e., n=1) (S1301). Then, the position 82C ($X_N$, $Y_N$) of the notch NP is determined based on the measurement results from the image processing unit 50 (S1302).

Thereafter in this sequence, the count n of the counter is incremented (S1303), and the coordinates $P_M$ ($X_M$, $Y_M$) of $P_M$ are determined according to Equations (14) below (S1304).

$$X_M = X_N - (R+d_0)\sin\theta$$
$$Y_M = Y_N + (R+d_0)\cos\theta \quad (14)$$

Next, we determine two intersection points 82A ($X'_1$, $Y'_1$) and 82B ($X'_2$, $Y'_2$) between (i) a straight line LL extending through $P_M$ and perpendicular to a line joining $P_M$ and 82C and (ii) the edge of the circular periphery of the wafer 6N as determined based on the measurement results from the image processing units 51 and 52 (S1305). The line LL is expressed by Equation (15) below.

$$\text{Line } LL: (Y-Y_M) = A(X-X_M)$$

where $$A = -(X_M - X_N)/(Y_M - Y_N) \quad (15)$$

Then, the midpoint $P'_M$ ($X'_M$, $Y'_M$) between the intersection points 82A and 82B is determined according to Equations (16) below (S1306).

$$X'_M = (X'_1 + X'_2)/2$$
$$Y'_M = (Y'_1 + Y'_2)/2 \qquad (16)$$

Then, the value for the rotation angle θ is corrected according to Equation (17) below, using the values of the coordinates of points $P_M$ and $P'_M$ (S1307).

$$\theta \rightarrow \theta + (X_M - X'_M)/[R_0(1+A^2)^{1/2}] \qquad (17)$$

Next, distance D between the points 82A and 82B is determined, and the value for R is corrected according to Equation (18) below, using the predetermined design value $D_0 = 2 \times d_0$ (S1308).

$$R \rightarrow R + (D - D_0)/2 \qquad (18)$$

Then, coordinates $P_C$ ($X_C$, $Y_C$) of the imaginary center of the wafer 6N are determined according to Equations (19) below (S1309).

$$X_C = X_N - R \sin \theta$$
$$Y_C = Y_N + R \cos \theta \qquad (19)$$

Thereafter, steps S1303–S1309 are repeated (S1310).

Thereafter, in step 104, the positional errors in the X- and Y-directions, ΔX and ΔY, and the rotational error Δθ of the wafer 6 are determined by calculation from the measurement results obtained in step 103. In this case the rotational error is referred to as the positional errors of the wafer in a broad sense. If the wafer has an orientation flat FP, the rotational error Δθ is determined from the detection results obtained from the observation fields 86A and 86B located on the orientation flat FP, and the translational errors in the X- and Y-directions, ΔX and ΔY, are determined from the detection results obtained from the observation fields 86A and 86B, as described above with reference to FIGS. 17(*a*) to 17(*d*).

On the other hand, if the wafer undergoing the prealignment process has a notch, such as the wafer 6N with the notch NP as shown in FIGS. 16(*a*) to 16(*d*), the translational or positional errors in the X- and Y-directions, ΔX and ΔY, and the rotational error Δθ of the wafer are determined by processing the detection results obtained from the observation field 86C on the notch NP as well as the other two observation fields 86A and 86B.

In the next step 105, the positional errors are examined as to whether the determined rotational error Δθ falls in an allowable range within which it can be corrected by the rotation of the lift support 38 and as to whether both the determined positional errors ΔX and ΔY fall in an allowable range within which they allow the wafer to be vacuum-holding on the wafer holder 30. If at least one of them is out of the corresponding allowable range, then the procedure proceeds to step 109 where it is determined whether this out-of-range event of the positional errors ΔX, ΔY and Δθ has occurred at the first trial of prealignment for that wafer. If so, in order to redo the process for rough prealignment, the procedure proceeds to step 110 where the wafer 6 is transferred from the lift support 38 back to the slider 23 (transfer arm 21) and thence to the turntable 60 of FIG. 5(*c*) to perform the process for rough prealignment. Then, the procedure returns to step 101 to repeat the operations in steps 101 through 105.

Then, if step 105 again determines that at least one of the positional errors ΔX, ΔY and Δθ is out of the corresponding allowable range, then it is considered that there may exist not only positional errors but also some other failure, and the procedure proceeds to step 109 and thence to step 111, where an error indication is given to a human operator and wait state is held for his/her instructions.

On the other hand, if step 105 determines that all the positional errors ΔX, ΔY and Δθ are within the corresponding allowable ranges, then the lift support 38 is lowered, during which the rotational error Δθ of the wafer is corrected (step 106). No sooner the wafer 6 is placed onto the wafer holder than the vacuum-holding of wafer by the support pins 38*a*–38*c* is deactivated and the vacuum-holding of the wafer by the wafer holder 30 is activated, so that the wafer 6 is held on the wafer holder 30 (step 107). Then, the positional errors ΔX and ΔY are added to the search alignment positions (described later) as offsets, and the wafer stage is driven to move the wafer (step 108), to complete the sequence of operations-for the prealignment process. Then, the procedure proceeds to the alignment sequence of FIG. 3A (including the search alignment process and the fine alignment process).

The comparison of the prealignment process according to the present invention with the prior art prealignment process described with reference to FIG. 1 above has proven the following. In the prior art process of FIG. 1, the rotational error of the wafer 6 is measured by, for example, a contact-type measurement system, and then the rotation of the wafer is corrected by the θ-rotation correction mechanism 8 mounted on the material support 9. It takes about 1 to 2 seconds to perform the above operation. In contrast, according to the process of the present invention, since the corrective rotation of the wafer for reducing the rotational error to a value within an acceptable range is effected during lowering the lift support 38, no additional time exclusively used for the corrective rotation is required. However, when wafers in one lot are sequentially processed, several wafers at the beginning of the lot need to be replaced on the wafer holder, which consumes a certain length of time. Nevertheless, learning effects are obtained by making corrections with the errors averaged, so that the greater number of wafers are included in one lot, the smaller number of wafer replacement process are required and thus a shorter time is required for performing wafer replacement process, so that more effective results may be obtained.

Next, the wafer replacement process will be described. Generally, in the case where different exposure apparatuses are used to perform respective exposure processes for forming a level of layer and the next level of layer on a wafer, if a matching between the prealignment processes in the exposure apparatuses is established, there would not occur an error of missing a search mark in the search alignment process for forming the subsequent level of layer. Therefore, the procedure may proceed from step 108 in FIG. 2 to step 112 in FIG. 3A.

However, under any of the following situations a) to c), positional errors found in the prealignment process may be relatively great, so that an error may possibly occur in the subsequent search alignment process.

a) The parallelism between the top surfaces of the lift support 38 and the wafer holder 30 is deteriorated for some reason, so that rotational error and/or translational or positional errors (or offset errors) may occur on a wafer when the wafer is transferred onto the wafer holder 30.

b) The matching between the prealignment processes in the exposure apparatuses is not established, so that a limited rotational error and/or offset errors (such as relative rotation and/or offsets between the peripheral edge of a wafer and a search mark) may occur on the wafers in a particular lot.

c) The peripheral edge of a wafer chips at one of the measurement points after the wafer has been undergone the exposure process for a first level of layer, so that rotational error and/or offset errors may occur on that particular wafer.

Figure 18B:
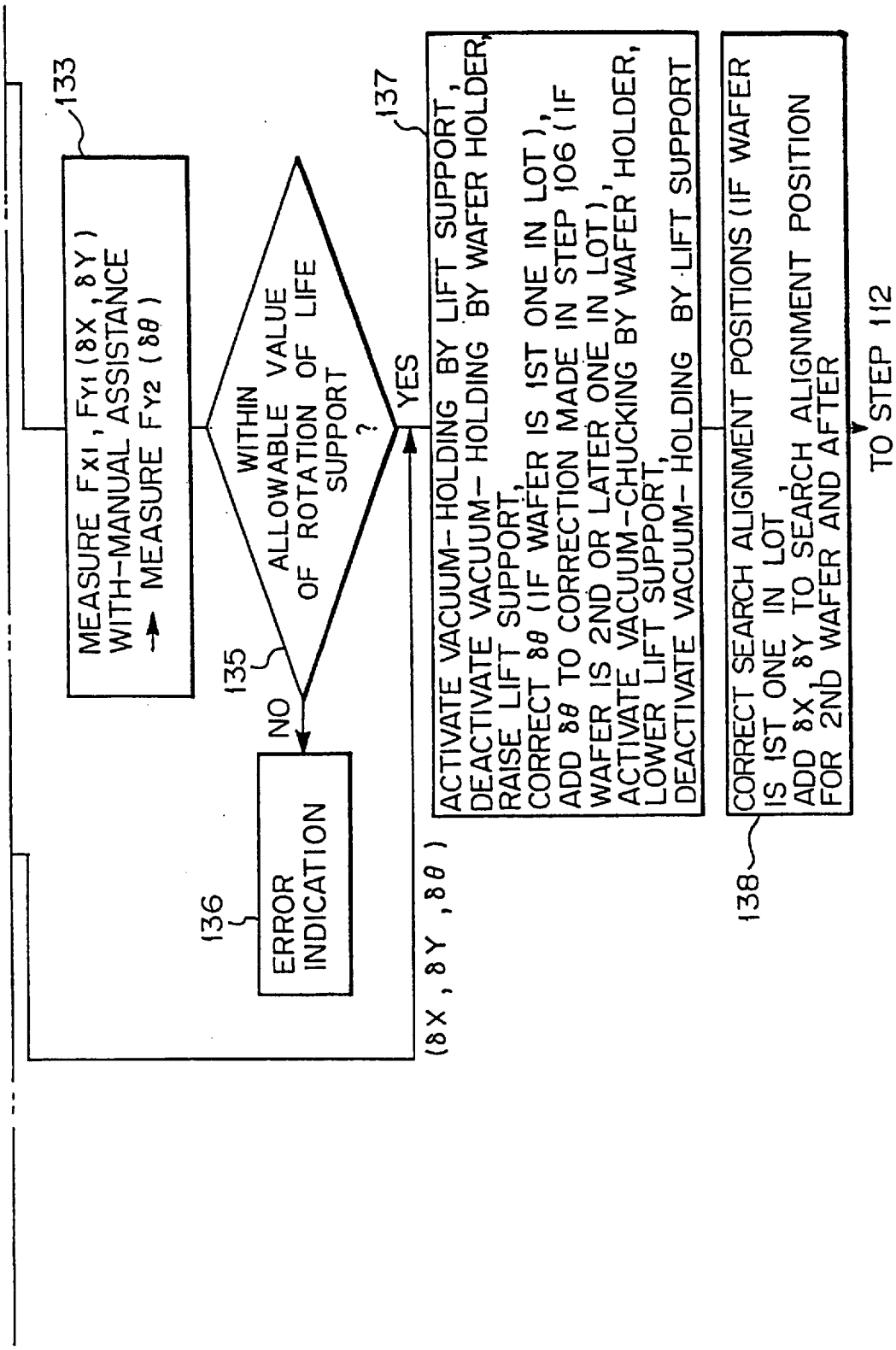

If any of these situations is possible, it is desirable that the procedure proceeds from step 108 in FIG. 2 to step 130A in FIG. 18A where it is determined whether an error occur in the search alignment process, and if so, the wafer replacement process is performed wherein the wafer is transferred from the wafer holder 40 onto the lift support 38 to perform corrective rotation and return back onto the wafer holder 30. The wafer replacement process of FIGS. 18A and 18B will be described in the following.

To begin with step 130A in FIG. 18A, a high magnification search alignment process is performed. Each wafer has first and second search marks 47A and 14B formed thereon, as shown in FIG. 5(*a*). In the high magnification search alignment, the FIA-type alignment sensor system 5A of FIG. 4 is used to detect the first and second search marks 47A and 47B on the wafer, with the magnification of the image-forming optical system in the alignment sensor system 5A being set to a high magnification to process only one frame of picture data. Then, in step 130B, it is determined whether the offsets of the wafer in the X- and Y-directions, $\delta X$ and $\delta Y$, and the rotational error $\delta \theta$ of the wafer can be measured. This is determined by examining the one frame of picture data obtained in step 130A to determine whether two search marks 47A and 47B are detectable. If the search marks 47A and 47B are detectable, the procedure proceeds to step 112 in FIG. 3A. Therefore, in many cases, only the high magnification search alignment process on a frame is performed before proceeding to step 112, resulting in a minimum decrease in the throughput.

On the other hand, if the search marks 47A and 47B can not be detected in step 130B, the procedure proceeds to one of step 131 (mode 1), step 132 (mode 2) and step 133 (mode 3) depending on the mode previously selected. In step 131 for mode 1, the detection of the search marks 47A and 47B is performed, with the magnification of the alignment sensor system 5A being set to a low magnification so as to make the view field thereof sufficiently wide. This is called a low-magnification image-processing search alignment process. In step 132 for mode 2, the detection of the search marks 47A and 47B is performed, with the magnification of the alignment sensor system 5A being set to a high magnification, and with the wafer stage being operated to make steps for frame continuation. In step 133 for mode 3, the rotational error $\delta \theta$ is determined with operator's assistance (manual assistance). This is done, for example, by measuring the coordinates $(F_{X1}, F_{Y1})$ of the first search mark 47A to determine the offsets $\delta X$ and $\delta Y$ and measuring the Y-coordinate $F_{Y2}$ of the second search mark 47B to obtain the difference between the Y-coordinates of the two search marks to determine the rotational error $\delta \theta$. From either of steps 131 and 132, the procedure proceeds to step 134, where it is determined again whether the offsets $\delta X$ and $\delta Y$ and the rotational error $\delta \theta$ can be determined, i.e., whether the search marks 47A and 47 have been detected. If not, the procedure proceeds to step 133 for the mode 3 operation. Otherwise if they have been detected, then $\delta X$, $\delta Y$ and $\delta \theta$ are determined and the procedure proceeds to step 137.

In step 135 following step 133, it is determined that the obtained rotational error $\delta \theta$ falls in the allowable range within which it can be corrected by the rotation of the lift support 38. If it can not be corrected (i.e., the rotational error $\delta \theta$ exceeds the allowable limit), the procedure proceeds to step 136 where an error indication is provided. Otherwise if it can be corrected, the procedure proceeds to step 137, where the vacuum-holding of the wafer by the lift support 38 and that by the wafer holder 30 are activated and deactivated, respectively, and thereafter the lift support 38 is raised with the wafer held thereon, so as to perform the correction of the rotational error $\delta \theta$ of the wafer. It is noted that the above operation sequence is for the first wafer in one lot, i.e., the wafer which is processed first among the wafers in the lot. For any of the second and later wafers in the lot, the rotation of the lift support 38 required for correcting the rotational error $\delta \theta$ is added to the rotation of the lift support 38 for correction performed in step 106. The operation in step 137 is continued in which the vacuum-holding of the wafer by the wafer holder 30 is activated, the lift support 38 is lowered, and the vacuum-holding of the wafer by the lift support 38 is deactivated. The wafer has been now replaced on the wafer holder 30. Then, in step 138, the search alignment positions are corrected for the offsets $\delta X$ and $\delta Y$ if the wafer is the first one in the lot. Otherwise, if the wafer is any of the second and later ones, the offsets $\delta X$ and $\delta Y$ are added to the search alignment positions used in step 108 in FIG. 1, for example. Thereafter, the procedure proceeds to step 112 in FIG. 3.

It is noted that each of the situations a) and c) varies between wafers, so that the correction in step 106 is omitted (error correction process for the second and later wafers is performed instead). On the other hand, the situation b) above may be identified when the first wafer is processed, so that the process for the second and later wafers in step 137 in FIG. 18 is performed in such case. However, if there exists a complex situation including the situations a) to c), it is possible that errors occur only on the first wafer, so that the search alignment operation is inhibited by feeding back the measurement results to the process for the second and later wafers. In such case, it is preferable to perform the process utilizing the learning mechanism as described above.

Figure 1:
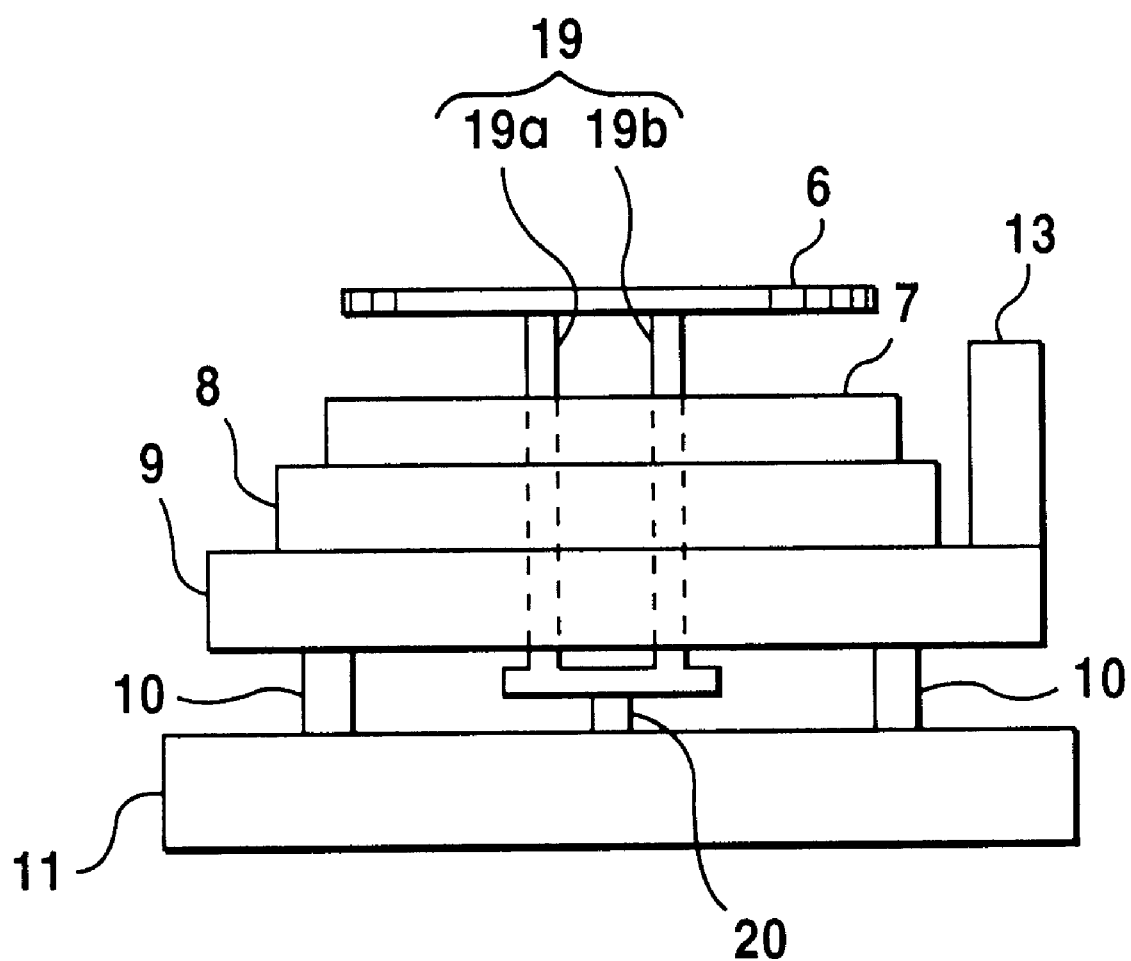
FIG. 1 is a schematic representation of a prior art wafer loading mechanism used in a projection exposure apparatus.

Further, the prior art projection exposure apparatus with a part thereof shown in FIG. 1 includes the $\theta$-rotation correction mechanism 8 for corrective rotation of a wafer 6. This mechanism 8 is a drive system and disposed between the material support 9 having a movable mirror 13 mounted thereon and the wafer 6. In contrast, the projection exposure apparatus used with the method of the present invention need not to have any drive system disposed between the movable mirror 13 and a wafer 6, so that the stability in stepping movement of the wafer is improved.

In the sequence of the alignment processes in FIGS. 3A and 3B, the search alignment process precedes the fine alignment process. However, if the alignment sensor system used has a wide detectable range (capture range) and the prealignment is performed with good accuracy, the search alignment may be passed over, and the procedure may go to the fine alignment process. For example, the LSA-type and FIA-type alignment sensor systems have relatively wide detectable ranges, such as up to ±25 μm. In contrast, the LIA-type alignment sensor system has a much smaller detectable range, such as only about ±1 to ±2 μm. Accordingly, if the accuracy in the prealignment is within a range of ±25 μm and either the LSA-type or the FIA-type alignment sensor system is used, the procedure may pass over the search alignment process to go to the fine alignment process.

More specifically, in step 112 in FIG. 3A, the type of the alignment sensor system used is determined. If it is of the LIA type, the sequence of operations in step 103 and the subsequent steps thereto are performed for the search alignment process. If it is either of the LSA or the FIA type, the procedure proceeds to step 121, where it is determined whether the accuracy in the prealignment is within the detectable range of the alignment sensor system used, i.e., whether the search alignment process has to be performed. If it has, the procedure proceeds to step 113, otherwise to step 126.

Now, the search alignment process will be described in detail. Typically, a wafer has marks for the search alignment formed thereon. The wafer 6 to be processed here has the first and second search marks 47A and 47B formed thereon, which are search marks for the FIA-type alignment and spaced a predetermined distance nominally in the Y-direction. As shown in FIG. 5(a), the first search mark 47A comprises an X-axis search mark 45X of a line-and-space pattern consisting of parallel straight lines spaced each other in the X-direction and an overlaid Y-axis search mark 45Y of a line-and-space pattern consisting of parallel straight lines spaced from each other in the Y-direction. The second search mark 47B is similar to the first search mark 47A and comprises an X-axis search mark 44X and an overlaid Y-axis search mark 44Y. Here, one FIA-type alignment sensor system 5A in FIG. 4 is used to detect the positions of the two search marks 47A and 47B. Further, as described later, another FIA-type alignment sensor system 5B in FIG. 4 is used to detect the rotational angle of the wafer 6. In order to more clearly distinguish these alignment sensor systems, the alignment sensor system 5A is referred to as "FIA-microscope 5A" and the alignment sensor system 5B as "θ-microscope 5B" hereinafter.

Each shot area defined on one wafer 6 has wafer marks for the fine alignment associated therewith, which are referred to as "fine marks" hereinafter. For example, FIG. 5(a) shows a shot area SA as the representative of any of the shot areas on the wafer 6, which has an X-axis fine mark 46X consisting of a liner array of dots extending in the Y-direction and a Y-axis fine mark 46Y consisting of a linear array of dots extending in the X-direction associated therewith. These fine marks 46X and 46Y are detected by the LSA-type alignment sensor system in the TTL-type alignment sensor system 4 in FIG. 4. The usable fine marks include those for the LIA-type alignment process and those for the FIA-type alignment process.

Figure 9A:
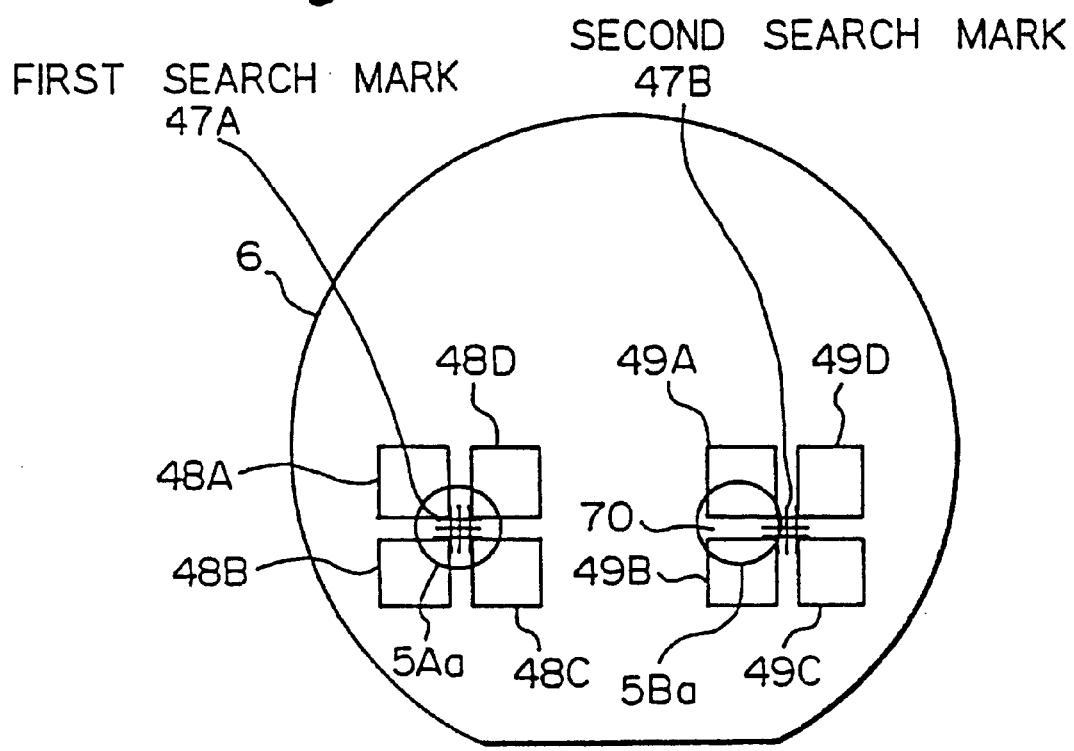
FIG. 9(a) is a plan view of a wafer with a first search mark 47A located in the observation field of the FIA-microscope 5A.
Figure 9B:
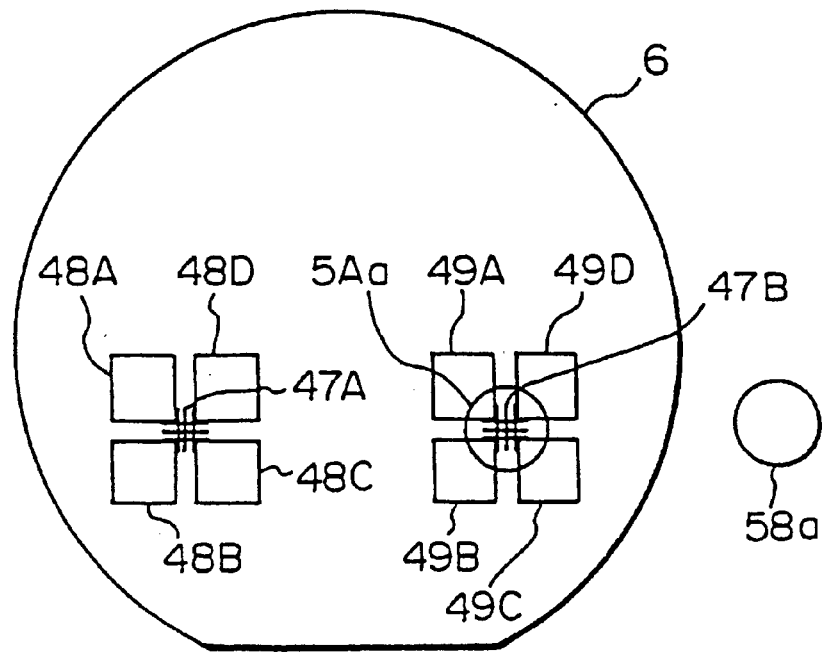
FIG. 9(b) is p plan view of the wafer with a second search mark 47B located in the observation field 5A of the FIA-microscope 5A.

FIGS. 9(a) and 9(b) show an exemplified arrangement of the first and second search marks on the wafer 6. As shown, the first search mark 47A is located within the street-line area at a position surrounded by four shot areas 48A, 48B, 48C and 48D, and the second search mark 47B is located also within the street-line area at a position surrounded by four shot areas 49A, 49B, 49C and 49D. Also, two circular observation or viewing fields 5Aa and 5Ba are shown. One circular observation field 5Aa is the effective observation field of the FIA-microscope 5A in FIG. 4, and the other circular observation field 5Ba, which is distant from the circular observation field 5As to the +X-direction, is the effective observation field of the θ-microscope 5B in FIG. 4.

In order to perform the search alignment process, in step 113, the wafer stage is driven to move the first search mark 47A into the observation field 5Aa of the FIA-microscope 5A as shown in FIG. 9(a), when the second search mark 47B is not found in the observation field 5Ba of the θ-microscope 5B, and only edge portions of the shot areas 49A and 49B and the street line area 70 are found there. Then, it is determined whether the wafer now undergoing the exposure process is the first wafer in the lot (step 114). If so, the procedure proceeds to step 115, where the FIA-microscope 5A is used to detect the X- and Y-coordinates ($F_{X1}$, $F_{Y1}$) of the first search mark 47A.

Figure 10A:
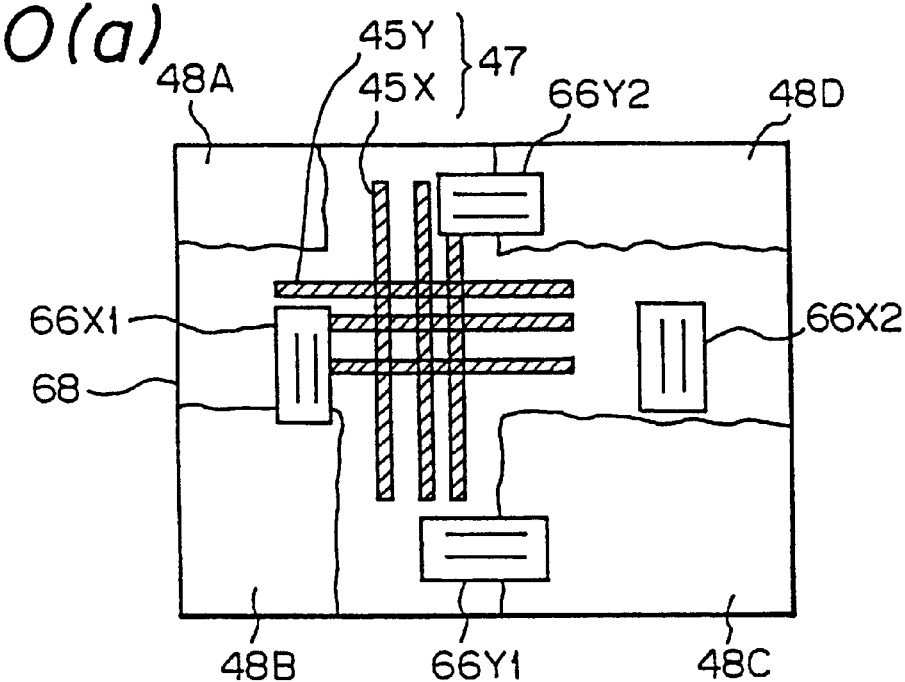
FIG. 10(a) shows an image of the first search mark 47A which may be observed for the first wafer in one lot in the course of the process for the positioning method according to the embodiment of the present invention.

Now, an example of detection method which may be used in step 115 will be described with reference to FIGS. 10(a) to 10(c). FIG. 10(a) shows a detection area 68 actually taken by the image pick-up device in the observation field of the FIA-microscope. As shown in FIG. 10(a), In the detection area 68 are found two independent indicator marks 66X1 and 66X2 for the X-direction position detection and two independent indicator marks 66Y1 and 66Y2 for the Y-direction position detection. These indicator marks 66X1, 66X2, 66Y1 and 66Y2 are disposed in such a plane in the FIA-microscope in FIG. 4 which is conjugate to the surface of the wafer, and illuminated by illumination beam independent from the illumination beam for illuminating the marks formed on the wafer. In the FIA-microscope 5A, an X-axis image pick-up device which scans the detection area 68 in the direction corresponding to the X-direction and a Y-axis image pick-up device which scans the detection area 68 in the direction corresponding to the Y-direction are provided in parallel. The X-axis image pick-up device scans the detection area 68 in the direction traversing the indicator marks 66X1 and 66X2 to produce an image or picture signal SX1 such as shown in FIG. 10(c). The signal segment 67X in FIG. 10(c) corresponds to the X-axis search mark 45X. The image-sensing signal SX1 is digitized and subjected to the image processing so as to detect the X-coordinate of the first search mark 47A relative to the indicator marks 66X1 and 66X2.

Figure 10B:
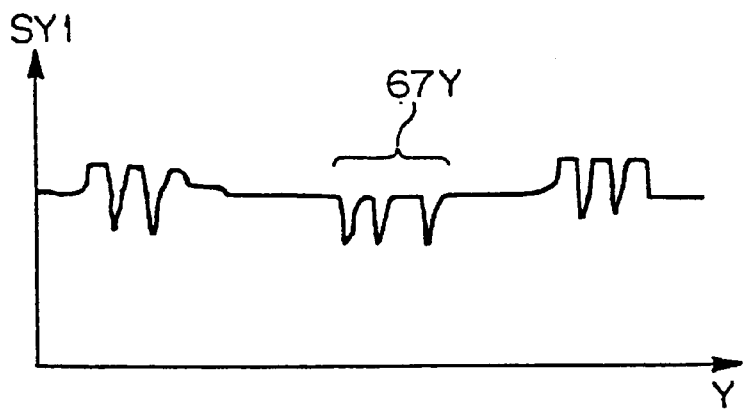
FIG. 10(b) shows a waveform of an image-sensing signal obtained by scanning the image of FIG. 10(a) in the Y-direction.
Figure 10C:
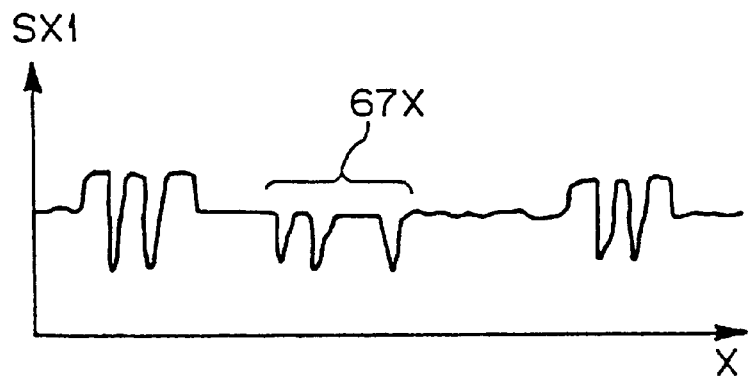
FIG. 10(c) shows a waveform of an image-sensing signal obtained by scanning the image of FIG. 10(a) in the X-direction.

Similarly, the Y-axis image pick-up device scans the detection area 68 in the direction traversing the indicator marks 66Y1 and 66Y2 to produce an image or picture signal SY1 such as shown in FIG. 10(b). The signal segment 67Y in FIG. 10(b) corresponds to the Y-axis search mark 45Y. The image signal SY1 is subjected to the image processing so as to detect the Y-coordinate of the first search mark 47A relative to the indicator marks 66Y1 and 66Y2. Instead of the indicator marks, a predetermined pixels in the image pick-up device, or the scan starting point of an image pickup tube (if it is used) may be used as the reference point for the position detection.

Then, the wafer stage is driven to move the second search mark 47B into the observation field 5Aa of the FIA-microscope 5A (step 116) as shown in FIG. 9(b), and the FIA-microscope 5A is used to detect the X- and Y-coordinates ($F_{X2}$, $F_{Y2}$) of the second search mark 47B (step 117). Then, in step 118 (FIG. 3B), a new coordinate system ($X_P$, $Y_P$) is defined which is related to the wafer stage coordinate system (X, Y) by the rotational angle θ and offsets (($F_{X1}+F_{X2}$)/2, ($F_{Y1}$, $F_{Y2}$)/2) (the coordinates in the new coordinate system are referred to as "XYθ-transformed coordinates" hereinafter). The rotational angle θ used for the transformation is obtained as:

$$\theta = \arctan((F_{Y2}-F_{Y1})/L) \tag{20}$$

where L is the distance between the two search marks 47A and 47B.

Using the coordinates (X, Y) in the wafer stage coordinate system, the XYθ-transformed coordinates ($X_P$, $Y_P$) in the new coordinate system are expressed as:

$$\begin{bmatrix} X_P \\ Y_P \end{bmatrix} = \begin{bmatrix} \cos\theta & -\sin\theta \\ \sin\theta & \cos\theta \end{bmatrix} \begin{bmatrix} X \\ Y \end{bmatrix} + \begin{bmatrix} (F_{X1}+F_{X2})/2 \\ (F_{Y1}+F_{Y2})/2 \end{bmatrix} \tag{21}$$

Then, in step 119, the wafer stage is driven according to the XYθ-transformed coordinates ($X_P$, $Y_P$) to move again the first search mark 47A into the observation fields 5A*a* of the FIA-microscope 5A as shown in FIG. 9(*a*). In the next step 120, the image within the observation fields 5B*a* of the θ-microscope 5B (including street-lines and other patterns) are taken under the condition existing when step 119 has been just completed, and the image taken itself or some characterizing features in the image are stored. This process will be described with reference to FIGS. 11(*a*) and 11(*b*) in more detail.

Figure 11A:
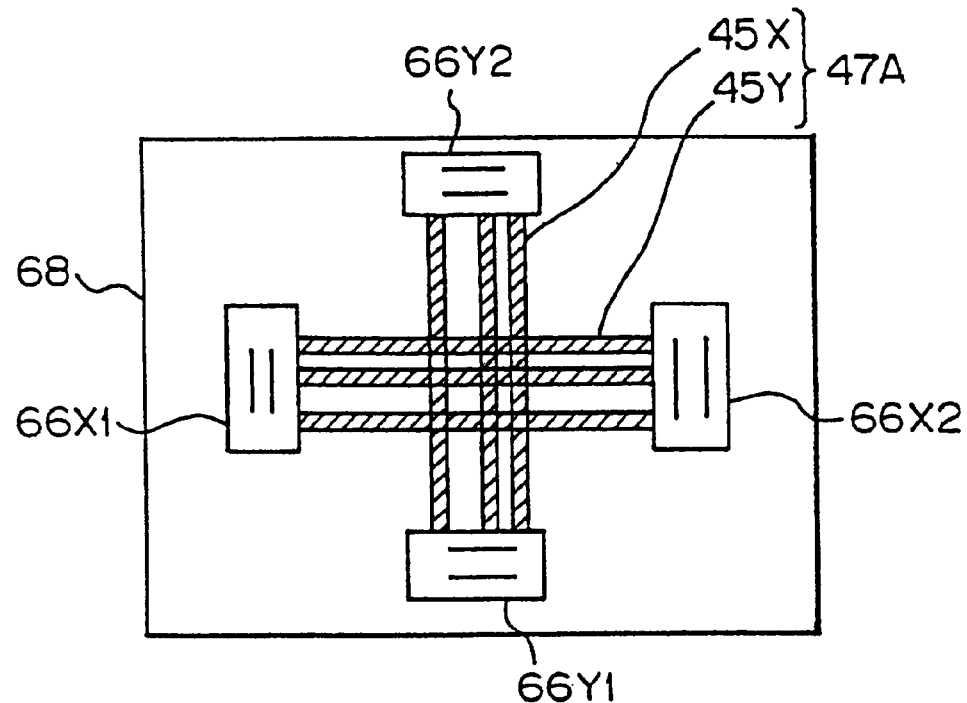
FIG. 11(a) shows an image of the first search mark 47A which may be observed for any of the second and later wafers in the lot.
Figure 11B:
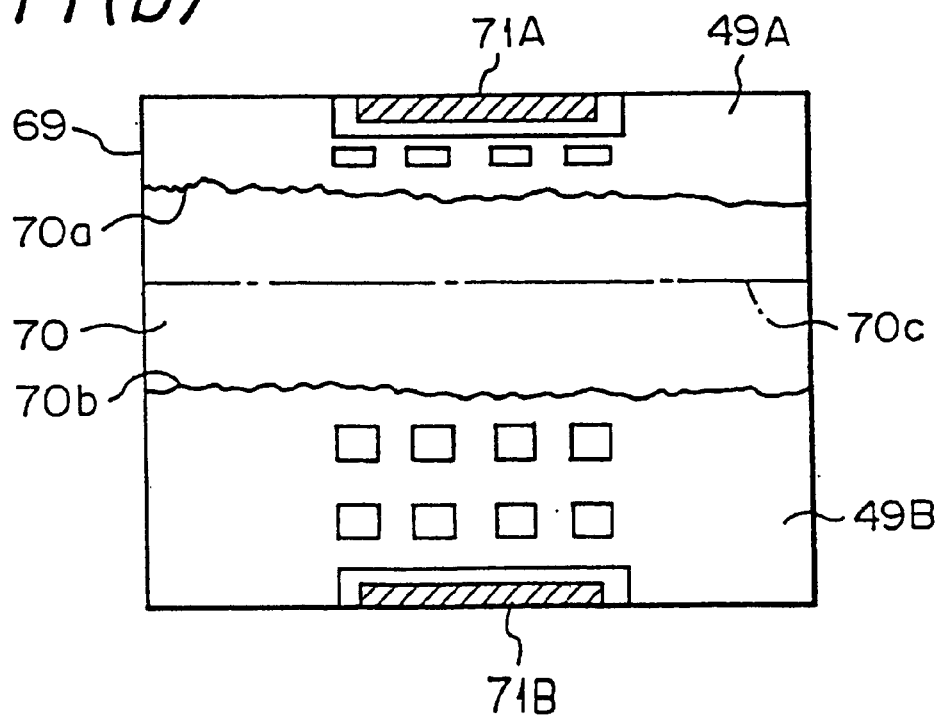
FIG. 11(b) shows an image which may be observed in the observation field of the θ-microscope 5B at the same time when the image of FIG. 11(a) is observed.
Figure 12A:
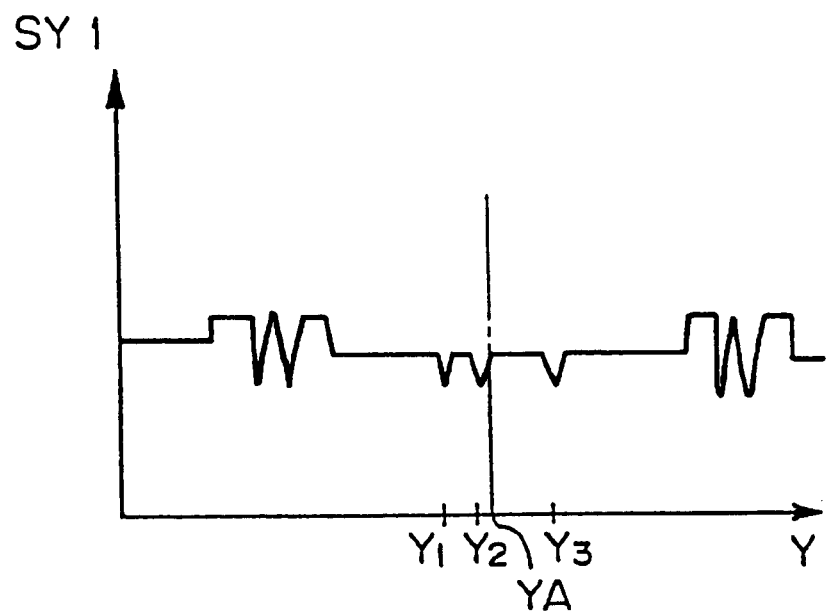
FIG. 12(a) shows a waveform of an image-sensing signal corresponding to the image of FIG. 11(a)
Figure 12B:
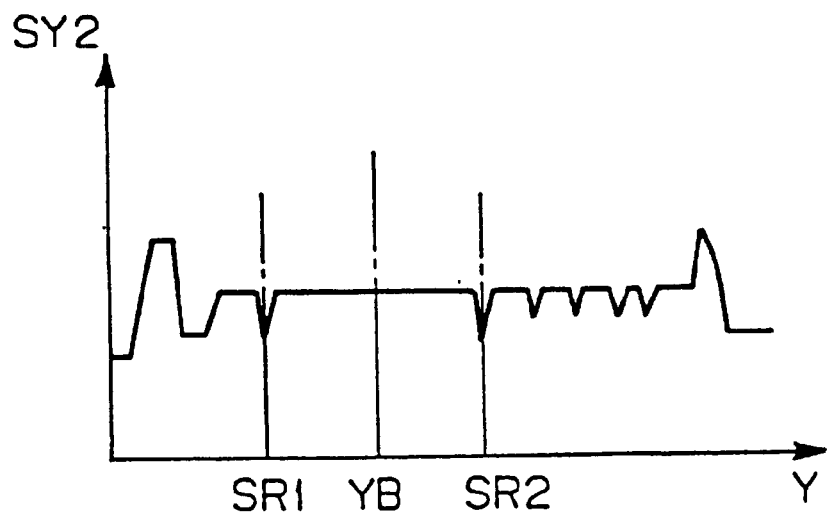
FIG. 12(b) shows a waveform of an image-sensing signal corresponding to the image of FIG. 11(b)

FIG. 11(*a*) shows an image in the detectable area 68 of the FIA-microscope 5A when step 119 has been just completed. FIG. 12(*a*) shows the image signal SY1 obtained from the Y-axis image pick-up device scanning the image of FIG. 11(*a*) in the Y-direction. As seen, the center of the first search mark 47A is located to the center of the detectable area 68 of the FIA-microscope 5A when the wafer stage has been driven according to the XYθ-transformed coordinates. Further, as seen, the image signal SY1 has three negative peaks at positions $Y_1$, $Y_2$ and $Y_3$ corresponding to the respective lines of the Y-axis search mark 45Y in the first search mark 47A. Thus, the Y-coordinate YA obtained by means of the average $(Y_1+Y_2+Y_3)/3$ of the three positions is determined as the position of the first search mark 47A in the Y-direction.

FIG. 11(*b*) shows an image in the detectable area 69 of the θ-microscope 5B when step 119 has been just completed. As shown, a pattern 71A in the shot area 49A and a pattern 71B in the shot area 49B are found above and below, respectively, of the street-line area 70 defined between the edges 70*a* and 70*b* of the shot areas 49A and 49B. By virtue of the use of the XYθ-transformed coordinates $(X_P, Y_P)$ defined as described above, the $X_P$-axis for the XYθ-transformed coordinates, or the straight line on which the coordinate $Y_P$=0, exists within the street-line area 70, and this straight line is shown by a dash-and-dot line and called the imaginary line 70*c*. Here, the image of FIG. 11(*b*) is scanned in the direction corresponding to the Y-direction (which may be deemed to be substantially parallel to the $Y_P$-direction) to produce the image or picture signal SY2 shown in FIG. 12(*b*). As shown in FIG. 12(*b*), the image or picture signal SY2 has two negative peaks at positions SR1 and SR2, which corresponds to the Y-coordinates of the edges 70*a* and 70*b* in FIG. 11(*b*). Then, such position YB on the image signal SY2 in FIG. 12(*b*) that corresponds to the imaginary line 70*c* in FIG. 11(*b*) (i.e., the position at which $Y_P$=0) is determined.

Then, the distances ΔSR1 and ΔSR2 between the position YB and the respective positions SR1 and SR2 are determined to obtain the distances in the Y-direction between the imaginary line 70*c* and the respective edges 70*a* and 70*b* defining the street-line area 70 and store the obtained distances in the central control system 18 of FIG. 4. Further, in order to clearly distinguish the edges 70*a* and 70*b* from the other patterns (such as patterns 71A and 71B), various useful characterizing features of the image signal SY2, including its signal intensities at the positions SR1 and SR2 as well as at other positions corresponding to other patterns, and the distances from the positions SR1 and SR2 to such other patterns, are determined and stored in the central control system 18. The positions of the search marks 47A and 47B relative to the street-line area 70 are considered the same among the wafers in the same lot, so that for any of the second and later wafers the positions SR1 and SR2 are determined from the image signal SY of FIG. 12(*b*) and from the positions SR1 and SR2 the position YB at which the coordinate $Y_P$ equals zero is determined.

As described, in this embodiment, the positions SR1 and SR2 of the negative peaks of the two edges are determined from the image signal SY2 and from them the position YB is determined; however, it is also contemplated that the image signal SY2 is digitized and stored, and the correlation between the stored signal SY2 and an image signal obtained for the next wafer is used to determine the position YB at which the coordinate $Y_P$ equals zero. Further, in this embodiment, the center of the first search mark 47A is moved to the center of the detection area 68 of the FIA-microscope 5A as shown in FIG. 11(*a*); however, such other new coordinate system may be defined in that the imaginary line 70*c* on which the coordinate $Y_P$ equals zero will be located at the center of the detection area 69 of the θ-microscope 5B.

Then, the procedure proceeds to step 122, where the fine alignment process is performed by detecting the positions of the fine marks 46X and 46Y associated with a predetermined shot area on the wafer 6. Here, the fine alignment process is performed using enhanced global alignment (EGA) technique, such as disclosed in Japanese Laid-Open Patent Publication No. Sho 61-44429 (44429/1986). More specifically, the wafer stage is driven according to the XYθ-transformed coordinates to detect the coordinates of the X-axis and Y-axis fine marks associated with a predetermined number of shot areas (sample shot areas) selected from among the shot areas on the wafer 6 by means of the alignment sensor system 4, and the detection results are subjected to a statistical processing so as to determine the coordinates of the positions of all the shot areas on the wafer in terms of the XYθ-transformed coordinates.

Then, in step 123, the wafer stage is driven according to the coordinates of the positions of the shot areas determined by the fine alignment process, so as to sequentially position the shot areas to the exposure location to enable exposure operations to print an image of the pattern on the reticle 1 onto each of the shot areas by projection exposure. During this sequential positioning of the shot areas, final position adjustments may be made for each shot area by fixing the wafer stage positioned for that shot area and moving the reticle stage to correct any residual alignment error between the reticle and that shot area on the wafer. After the exposure process for the wafer 6 is completed, the wafer 6 is transferred out of the projection exposure apparatus, and then steps 101 through 108 in FIG. 2 are performed for the prealignment process for the next wafer to be exposed in the lot. Then, for the wafer, steps 112 and 113 in FIG. 3 are performed and the procedure proceeds to step 114.

This wafer is the second wafer to be processed in the lot, so that the procedure proceeds from step 114 to step 124, where the X- and Y-coordinates $(F_{X1}, F_{Y1})$ of the first search mark 47A are detected by the FIA-microscope 5A under the condition similar to that shown in FIG. 9(*a*), while at the same time the Y-coordinates SR1 and SR2 of the edges defining the street-line area 70 are detected by the θ-microscope 5B. For the purpose, the edges defining the street-line area 70 are distinguished from the other patterns using the image data stored in step 120. Further, from the Y-coordinates SR1 and SR2, the Y-coordinate YB with which the value of $Y_P$-axis in a new coordinate system will be zero are determined.

Then, in step 125, a new XYθ-transformed coordinate system $(X_P, Y_P)$ is defined which is related to the wafer stage coordinate system (X, Y) by the rotational angle θ and offsets (Ox, Oy). The rotational angle θ used here is obtained from the distance L' between the detection centers of the FIA-microscope 5A and the θ-microscope 5B and the above determined values as:

$$\theta = \arctan((YB - F_{Y1})/L') \tag{22}$$

Using the distance L between the two search marks 47A and 47B, the fist order approximation of the coordinates $(F_{X2}, F_{Y2})$ are obtained as $(F_{X1}+L, F_{Y1}+\theta \times L)$. Therefore, using the coordinates of the midpoint between the two search marks 47A and 47B as the offsets (Ox, Oy), the new XYθ-coordinates $(X_P, Y_P)$ are expressed in terms of the wafer stage coordinates (X, Y) as shown in Equation (21) above. Thereafter, the wafer undergoes the alignment and exposure processes in steps 122 and 123. In this manner, for any of the second and later wafers in the lot, simultaneous measurements by the FIA-microscope 5A and the θ-microscope 5B are performed during the search alignment process to determine the positions in the X- and Y-directions and the rotational angle of the wafer at one time, resulting in a reduced measurement time and an improved throughput.

Next will be described the procedure in the case where the alignment sensor system used is either of the LSA-type or the FIA-type, and hence no search alignment process is performed. In such case, the procedure proceeds from step 121 to step 126 where mode selection is performed. In this embodiment, options include rough mode and fine mode. It is assumed that the accuracy achievable by the prealignment process shown in FIG. 2 is such that three times the standard deviation (3 σ) of the prealignment errors is of the order of 20 μm. Thus, the achieved accuracy may be sufficient for the initial accuracy for the fine alignment process (rough mode) or may not sufficient for it (fine mode). Accordingly, if rough mode is selected, the procedure proceeds to step 122 where, with that prealignment accuracy achieved at this point time, the EGA-type fine alignment process is performed by measuring a predetermined number of sample shot areas for example.

On the other hand, if fine mode is selected, the coordinates of respective pairs of X-axis and Y-axis fine marks associated with two spaced shot areas on the wafer, by means of selected one of the alignment sensor systems (step 127), and from the results of this measurement the XYθ-transformed coordinates are determined in the same manner as in step 118. Then, the wafer stage is driven according to the XYθ-transformed coordinates to locate the centers of the fine marks associated with the third or later shot areas (the first two shot areas may be included as well) to a position about the center of the detection area of the alignment sensor system so as to perform measurement (step 129). After the measurement, exposure process is performed in step 123.

Generally, since the LSA-type and the FIA-type alignment processes have relatively wide detectable areas, the rough mode which is superior in throughput is selected. However, if it is required to eliminate any distortions in the frame of the image processing system of the FIA-type alignment system and/or the effects of any magnification errors so as to achieve precision measurement, it is desirable to measure and correct any distortions in the frame, or to select the fine mode. Further, the mode selection may be made depending on the implementation of the processes in the procedure, or may be arranged to be automatically made depending on the degree of the achieved accuracy of the prealignment process. Regarding the step 124 in FIG. 3B, if no pattern is found in the detection area of the θ-microscope 5B, it is determined that there exists no detectable pattern, and the procedure automatically select the sequence in which steps 115 through 118, which have been performed for the first wafer, are again performed and from step 118 the procedure proceeds to step 122.

In the embodiment described above, it is assumed that when the prealignment process is completed the procedure can unconditionally proceeds to the search alignment process and/or the fine alignment process. In fact, however, it is possible that the procedure may not do it. For example, if the exposure process for the first layer has been done with a first exposure apparatus and the exposure process for the second layer is to be done with a second exposure apparatus, and the matching in the arrangement of the alignment sensor between the first and second exposure apparatus is not established, then the positions of the search marks 47A and 47B prealigned in the second exposure apparatus may be so different from those prealigned in the first one that the search marks 47A and 47B may not found in the observation field in the second exposure apparatus, even though the wafer is accurately prealigned on a wafer contour basis. In such a case, when the first wafer in the lot is to be processed, operator's instructions may be waited after the prealignment process shown in FIG. 2 is completed, in order to cause the operator to manually measure the positions of the search marks 47A and 47B on the first wafer. Thereafter, the measurement results may be used to determine and correct any offset of the rotational angle of the rotational drive unit for the lift support and the offsets of the search alignment position in the X- and Y-directions. Thereafter, for any of the second and later wafers in the lot, the procedure can automatically proceed from the prealignment process in FIG. 2 to either the search alignment process or the fine alignment process.

In the embodiment described above, the sensor systems for the positions of the wafer edge, or the two-dimensional image processing units, are disposed above the loading position of the wafer; however, it may possibly difficult in some cases to disposes the sensor systems for the positions of the wafer edge at such locations due to some cause such as the size of the wafer. In such a case, the wafer stage may be driven to move a wafer to such a position that allows the measurement of the positions of the peripheral edge of the wafer, with the wafer being held on the lift support 38 or being placed on the wafer holder 30.

It is to be understood that the present invention may be applied not only the step-and-repeat type of exposure apparatus but also to other types of exposure apparatus including those of the step-and-scan type.

Therefore, the present invention is not limited to the embodiments and modifications described above, but may be embodied in various other formes and arrangements without departing from the spirit and the scope of the present invention.

In the positioning method according to the present invention, the detection of the peripheral edge of the photosensitized substrate (wafer) is performed by two-dimensional image processing units and by using a noncontact-detection technique just after the loading of the photosensitized substrate, so that the correction (prealignment) of the rotational error of the photosensitized substrate may be performed while the photosensitized substrate is lowered to be placed onto the substrate stage. Therefore, the time required for the prealignment may be reduced. Further, it is unnecessary to provide a rotational drive mechanism on the substrate stage side, so that the substrate stage may have a relatively simple construction, an improved rigidity and a reduced weight, resulting in an advantage that the alignment operation of the photosensitized substrate may be quickly performed with precision upon loading of the photosensitized substrate from, for example, a substrate loader system onto the substrate stage.

Further, the imaginary points corresponding to reference points which would be used for positioning the photosensitized substrate on the substrate stage by using a contact-positioning technique, are determined in the observation fields of the two-dimensional image processing systems. Also, the offsets, from the imaginary points, of the positions of the measurement points on the photosensitized substrate measured by the two-dimensional image processing systems are used to position the photosensitized substrate. Therefore, a high matching accuracy for the coarse alignment (prealignment) process, with another exposure apparatus in which contact-positioning (prealignment) process is performed, may be obtained.

Further, in this positioning method, if the cutout formed in the peripheral edge of the photosensitized substrate comprises a wedge-shaped or V-shaped notch, and the measurement points for the two-dimensional image processing systems are selected to include one on the cutout and two on respective portions of the peripheral edge of the photosensitized substrate other than the cutout, then the detection of the positions of the photosensitized substrate at the three measurement points enables identification of the rotational angle and the two-dimensional position of the photosensitized substrate.

On the other hand, if the cutout formed in the peripheral edge of the photosensitized substrate comprises a flat edge portion, and the measurement points for the two-dimensional image processing systems are selected to include two on the cutout and one on a portion of the peripheral edge of the substrate other than the cutout, then the detection of the positions of the photosensitized substrate at the three measurement points enables identification of the rotational angle and the two-dimensional position of the photosensitized substrate.

Furthermore, in order to make the prediction of the position of the photosensitized substrate which will be found when the substrate has been placed on the substrate stage, a rotational error and offsets are obtained, which exist between a position of the photosensitized substrate which will be found when the substrate has been placed on the substrate stage through the substrate lift means without any rotation effected thereby and a position of the substrate which would be found when the substrate had been aligned by using the contact-positioning technique. The rotational error is corrected when the photosensitized substrate is placed onto the substrate stage through the substrate lift means. Also, the offsets is corrected through the substrate stage after the substrate has been placed on the substrate stage. This enables simplification of the construction of the substrate stage and a quick positioning of the substrate.

Next, a process sequence for positioning a wafer, illustrating an embodiment of the present invention, will be described with reference to a flow diagram shown in FIG. 27. The wafer has geometrical features, such as an orientation flat and a notch, formed in its peripheral edge thereof. The process sequence includes i) a prealignment process, ii) a search alignment process and iii) a fine alignment process.

Figure 27:
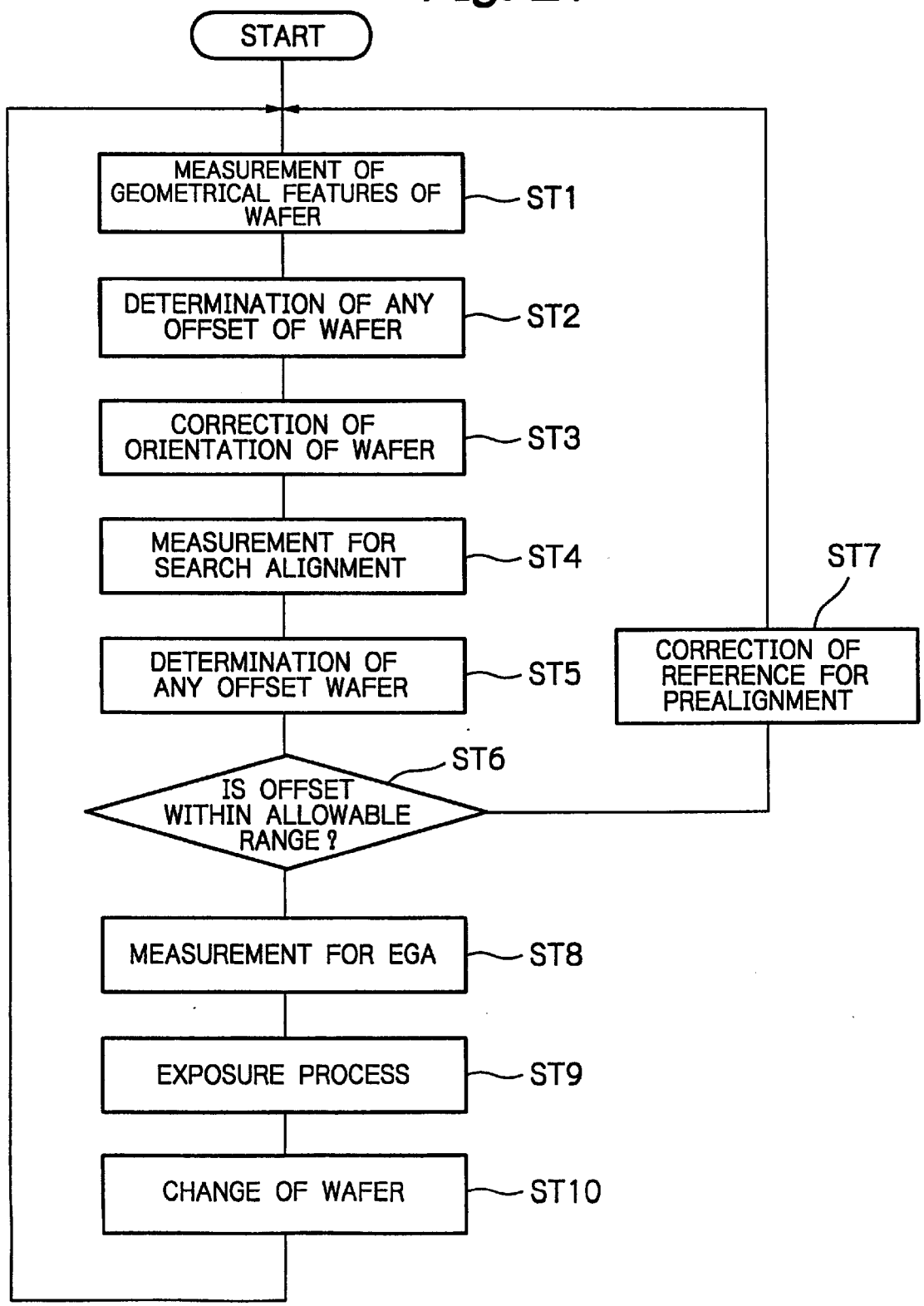
FIG. 27 is a flow chart showing further process sequence for establishing prealignment of a wafer.

(1) Prealignment Process (Steps ST1 to ST3 in FIG. 27)

Briefly, the prealignment process according to this embodiment is such a process as set forth below. In the prealignment process, preselected portions of the peripheral edge of a wafer 6 (such portions include the geometrical features, such as an orientation flat and a notch) are measured. Then, any displacement or offset of the wafer 6 (displacement or offset in a rotational direction: a rotational offset hereinafter) represented by the measurements of the geometrical features with respect to a reference (referred to as the "first reference" hereinafter) is determined. Then, the orientation of the wafer 6 is so corrected as to be coincident with the desired orientation represented by the first reference. The first reference is stored in predetermined storage locations (referred to as the "prealignment reference storage locations") in a storage device as a part of data for a control program. Such a control program may be provided for the central control system 18 or for the alignment control system 15.

More specifically, the wafer 6, which is undergoing the prealignment procedure, is transferred by the transfer arm 21 onto the lift support 38, which has been already set to the wafer loading/unloading position. The wafer 6 thus transferred onto the lift support 38 is then held on the lift support 38 by vacuum suction. Then, the image processing units 50, 51 and 52 are activated to take images of the preselected portions of the peripheral edge of the wafer 6, which portions include the geometrical features (step ST1). Thereafter, any rotational offset of the wafer 6 (referred to as the "first offset" hereinafter) relative to the orientation reference (the first reference) is determined (step ST2). In the prealignment process of this embodiment, only the rotational offset of the wafer is compensated; however, it is contemplated that the prealignment process may be modified such that both the rotational offset and the displacement or offset in a translational direction (in x- and y-directions) of the wafer are compensated. Following step ST2, the determined value of the rotational offset is used to drive the lift support 38 for rotation so as to compensate the detected rotational offset of the wafer 6 (step ST3).

The first reference is a predefined reference, which is determined in connection with the geometrical features of the wafer. The wafer is rotated in a direction which is parallel to an x-direction or a y-direction.

The prealignment procedure is completed with step ST3. Thereafter, the lift support 38 is lowered and the wafer 6 having been held on the lift support 38 by vacuum suction is released, so that the wafer 6 is transferred onto the wafer holder 30 and then held on the wafer holder 30 by vacuum suction.

(2) Search Alignment Procedure

Briefly, the search alignment process according to this embodiment is such a process as set forth below. In the search alignment process, the search alignment marks formed on the wafer 6 are measured. Then, any displacement or offset in a rotational direction (rotational offset) of the wafer 6 as well as any displacement or offset in translational direction, i.e. in x- and y-directions of the wafer 6 (referred to as "the second reference" hereinafter) with respect to another reference (a second reference) are determined. The second reference is stored in predetermined memory locations (referred to as "search alignment reference storage locations" hereinafter,) which locations may be provided in the storage device for the central control system 18 or in the storage device for the alignment control system 15. Then, it is determined whether the measured offset of the wafer 6 (the rotational offset, in this embodiment) falls within a predetermined allowable range. (This range represents an allowable angle for the rotational offset and is recorded as data of the control program.) Finally, the course of the process sequence to follow is selected in accordance with the determination.

More specifically, The positions of the search alignment marks formed on the wafer 6 held on the wafer holder 30 by vacuum suction are measured (step ST4) by using appropriate image sensor systems, such as the off-axis-type alignment sensor systems 5A and 5B or other alignment sensor systems suitable for the search alignment process (not shown), as well as using a suitable measurement method, such as LSA-method or FIA-method.

Then, any offsets of the wafer 6 with respect to the second reference (such offsets include the translational displacement or offsets X and Y in x- and y-directions, respectively, and the rotational displacement or offset θ) are determined (step ST5). The search alignment marks are formed through a previous lithographic process, such that any offsets (including the rotational offset θ and the translational offsets X and Y (in x- and y-directions) of the wafer 6 with respect to the second reference may be determined from the measurements of the marks.

Thereafter, it is determined whether the rotational offset of the wafer 6 (referred to as the "second offset" hereinafter) falls within the allowable range (step ST6). If so, the process sequence proceeds to the fine alignment process.

Otherwise, i.e., if the rotational offset of the wafer 6 relative to the second reference is determined as not falling within the allowable range, the first reference stored in the prealignment reference storage locations is so corrected as to compensate based on the second offset (the rotational offset) to rewrite or update the above-mentioned data that defines the first reference and is stored in the prealignment reference storage locations (step ST7). (The new reference defined by the updated data is referred to as the "third reference" hereinafter.) The data defining the first reference may be backed up in other storage locations before it is replaced with the data defining the third reference.

From step ST7, the process sequence returns back to step ST1 to repeat the prealignment process. Specifically, in step ST1, the vacuum suction holding the wafer 6 on the wafer holder 30 is relieved to release the wafer 6 from the wafer holder 30, and the lift support 38 is raised so that the wafer 6 is supported by the lift support 38 instead of the wafer holder 30. Then, the wafer 6 is held on the lift support 38 by vacuum suction and raised to the wafer loading/unloading position. Then, the image processing units 50, 51 and 52 are activated to take images of the preselected portions of the peripheral edge of the wafer 6 (step ST1,) and any rotational offset (the first offset) of the wafer 6 is determined in connection with the geometrical features with respect to the reference for wafer (which is the third reference at this point of time) stored in the prealignment reference storage locations (step ST2). Then, the determined value of the rotational offset is used to drive the lift support 38 for rotation so as to compensate the detected rotational offset of the wafer 6 (step ST3.)

Thereafter, the search alignment process (steps ST4 to ST6) is again performed. Because i) the prealignment process has been just completed using the third reference which is derived by correcting the first reference so as to compensate the second offset, little or no rotational offset will be detected in the second-time search alignment process while some offsets in the translational direction (in x- and/or y-directions) may be possibly detected. Therefore, the value of the rotational offset (the second offset) determined in the second-time fine alignment process will fall within the allowable range, so that the process sequence will proceed to the fine alignment process from the second-time search alignment process. In the fine alignment process, any translational offsets of the wafer 6 will be compensated by fine corrective movement of the X-stage 11 and/or the Y-stage 12. In contrast, in a typical, conventional, wafer positioning process, the prealignment procedure is not repeated for the same wafer unlike the present invention, when the second offset detected falls out of the predetermined allowable range, the second offset is simply rejected as a failure and the fine alignment process is not commenced.

(3) Fine Alignment Process

The fine alignment process is performed using enhanced-global-alignment (EGA) method. In this process, if the rotational offset of the wafer 6 is small enough to fall within the allowable range, the EGA-method is performed by using LSA-method, FIA-method and LIA-method, as well as the alignment sensor system 4 or any other alignment sensor system suitable for the fine alignment process (not shown).

More specifically, the wafer 6 has an array of shot areas defined on its top surface, some of which are preselected to the sample shot areas. Each sample shot area has an EGA alignment mark formed therein through a previous lithographic process. In the fine alignment process, the positions of the EGA alignment marks are sequentially measured. The measurements are mathematically processed using a so-called statistical arithmetic operation, such as least-squares-method operation, so as to derive position data representing positions of all the shot areas defined in array on the wafer 6. The position data thus derived is used in the following exposure process, in which the wafer 6 is sequentially aligned with accuracy to appropriate positions relative to the position of the reticle 1.

(4) Thereafter, the exposure process in which a pattern image on the reticle 1 is transferred on to the wafer through a projection optical system 3 is carried out while each of the shot area on the wafer is positioned with respect to an exposure position based on the coordinate position for each shot area and a baseline value measured in advance. The coordinate position of each shot area is determined through EGA-method as set forth above. Adjustment of translational offset of the wafer 6 is performed by fine corrective movement of the X-stage and Y-stage or the reticle stage 32 and adjustment of rotational offset of the wafer 6 is performed by fine rotational movement of the reticle stage 32.

After exposures of all the shot areas on the wafer 6 have been completed, the vacuum suction for holding the wafer 6 on the wafer holder 30 is relieved to release the wafer 6 therefrom, and the lift support 38 is raised to the wafer loading/unloading position. Then, the wafer transfer arm 22 is activated to take the exposed wafer 6 away from the lift support 38 and put a new wafer 6 on the lift support 38 for the next exposure process (step ST10). Thereafter, the process sequence returns back to step ST1 and will be repeated for the new wafer 6.

As described above, when the position of the alignment marks formed on a wafer is displaced or offset with respect to the geometrical features, such wafer can not undergo the fine alignment process but will be rejected as a failure, resulting in poor throughput of the lithography process. In contrast, according to this embodiment of the present invention, for any such wafer, the prealignment process will be repeated after the reference for the prealignment process is so corrected as to compensate the above-mentioned second displacement or offset, so that even such wafer will undergo the fine alignment process without being rejected as a failure.

In general, many wafers in the same lot are treated as a batch in a lithographic process. Further, the relationship between the set of positions of the alignment marks formed on a wafer and the geometrical features defined by the peripheral edge of the wafer tends to be substantially invariable among the wafers in the same lot. As a result, in this embodiment, it must be determined in step ST6 in the search alignment process that the offset of the alignment marks with respect to the geometrical features of the second and later wafers will be within an allowable range. Therefore, while the first wafer in one lot may possibly has to undergo the second-time prealignment process due to a possible negative decision in step ST6 in the search alignment process, it is quite improbable that any of the second and later wafers in that lot has to undergo the prealignment process more than once, leading to high throughput of the exposure process.

The embodiment described above merely presents an example for providing clear understanding of the present invention, and is not intended to limit the present invention. Indeed, any of the elements and components shown in relation to the embodiment may be modified to be various equivalents or may be embodied in various other forms without departing from the scope and spirit of the present invention.

For example, while in the prealignment process described above the reference for the prealignment process may be so corrected as to compensate only the rotational displacement or offset of the wafer, it is contemplated that the prealignment process is modified such that the correction of the reference for the prealignment process is so effected as to compensate not only the rotational offset but also the translational displacement or offset in x- and y-directions.

The present invention may be applied to any of various types of exposure apparatus including, for example, step-and-repeat demagnification-projection steppers and step-and-scan demagnification-projection steppers (also called "scanning steppers"). As known, in a step-and-repeat demagnification-projection stepper, the whole of the shot area of the reticle pattern is exposed by one-shot exposure while both the reticle and the wafer being held stationary and the whole of the reticle pattern is illuminated at a time by the shot of illumination light, so that the reticle pattern is printed and transferred onto one area (shot area) through the exposure light beam. In a step-and-scan demagnification-projection stepper, a reticle and a wafer are synchronously moved and the reticle pattern is serially transferred onto the aligned shot area by scanning and exposing a slit-shaped exposure light beam which "moves" relative to the shot area. Scanning and exposing of the exposure light are repeated with respect to other shot areas on the wafer with the wafer being moved in sequence.

The illumination light which forms the exposure light beam may comprise any of various kinds of light, including light of one of bright lines from a mercury-vapor lamp (such as g-line or i-line), light from a krypton-fluorine (KrF) excimer laser (having a wavelength of 248 nanometers (nm)), light from an argon-fluorine (RrF) excimer laser (having a wavelength of 193 nm), light from a fluorine ($F_2$) laser (having a wavelength of 157 nm), light from an argon ($Ar_2$) laser (having a wavelength of 126 nm) and a harmonic light such as a YAG laser. In addition, the illumination light may also comprise a harmonic light. Such a harmonic light may be made by amplifying an infrared or visible single-line laser through an optical-fiber amplifier comprising an optical fiber doped with erbium (or both erbium and yttrium) and converting wavelength thereof into ultraviolet rays through a nonlinear optical crystal. Such a single-line laser may be output from a distributed-feedback (DFB) semiconductor laser or from an optical-fiber laser.

Moreover, the present invention may be applied to an extreme ultraviolet (EUV) exposure apparatus. In a typical EUV exposure apparatus: the illumination light comprises EUV rays having its wavelength spectrum extending from 5 nm to 15 nm (corresponding to the region of soft X-rays); the illumination light beam may be so defined as to provide an arc-shaped illumination field on a reflection mask; the demagnification projection optical system used is composed of only reflective elements (i.e., mirrors); and the reflection mask and the wafer are moved in synchronism with their velocity ratio depending on the demagnification ratio of the demagnification optical system so as to transfer the pattern formed on the reflection mask onto the wafer.

In addition, the present invention is applicable not only to the projection exposure apparatus used for fabrication of semiconductor devices, liquid crystal displays, thin-film magnetic heads and image sensors (such as charge coupled devices), but also to those used for transferring circuit patterns onto glass substrates or silicon wafers in order to fabricate reticles or masks.

As clearly understood from the above, it is one of remarkable advantages of the present invention that even an alignment mark formed on a wafer is displaced or offset with respect to the geometrical features thereof, the wafer will not be rejected as a failure so that the fine alignment process may be surely performed for such wafer. In particular, in the case where many wafers are sequentially processed and the position of the alignment mark formed on a plurality of wafers to be processed is similarly displaced or offset with respect to the geometrical features of those wafers, all of the wafers except the first one to be processed may be processed with a short process time, leading to high throughput of the process.

What is claimed is:

1. A method to make a positioning apparatus which determines a position of a substrate stage, which holds and moves a substrate at least in a first direction, said method comprising:

providing a first transfer device which transfers said substrate to an off-position at which said substrate is not placed on said substrate stage;

providing detecting device which detects the position of said substrate at said off-position by using a V-shaped coutout formed in said substrate;

providing a second transfer device which transfers said substrate to an on-position at which said substrate is placed on said substrate stage; and providing a correction device which corrects the position of said substrate based on a detected result of the position detecting device while said substrate is transferred from said off-position to said on-position by the second transfer device.

2. A method according to claim 1, wherein said position detecting device is a noncontact-measurement type detecting device which detects the position of the substrate using a noncontact-measurement technique.

3. A method according to claim 1, wherein said off-position is above said substrate stage.

4. A method to make an exposure apparatus which exposes a substrate held on a substrate stage with a pattern, comprising:

providing an exposure system which exposes said substrate with said pattern;

providing a first transfer device which transfers said substrate to an off-position at which said substrate is not placed on said substrate stage;

providing a position detecting device which detects the position of said substrate at said off-position by using a V-shaped cutout formed in said substrate;

providing a second transfer device which transfers said substrate to an on-position at which said substrate is placed substrate stage; and providing a correction device which corrects the position of said substrate based on a detected result of the position detecting device while said substrate is transferred from said off-position to said on-position by the second transfer device.

5. An method according to claim 4, wherein said detecting device is a noncontact-measurement type detecting device which detects the position of the substrate using a noncontact-measurement technique.

6. A method according to claim 4, wherein said off-position is above said substrate stage.

7. A substrate held on a substrate stage on which a pattern has been transferred by an exposure apparatus manufactured by the method according to claim 4.

8. A positioning apparatus which determines a position of a substrate stage, which holds and moves a substrate at least in a first direction, said apparatus comprising:
- a first transfer device which transfers said substrate to an off-position at which said substrate is not placed on said substrate stage;
- a position detecting device which detects the position of said substrate at said off-position by using a V-shaped cutout formed in said substrate;
- a second transfer device which transfers said substrate to an on-position at which said substrate is placed on said substrate stage; and
- a correction device which corrects the position of said substrate base on a detected result of the position detecting device while said substrate is transferred from said off-position to said on-position by the second transfer device.

9. An apparatus according to claim 8, wherein said position detecting device is a noncontact-measurement type detecting device which detects the position of the substrate using a noncontact-measurement technique.

10. An apparatus according to claim 8, further comprising:
- a correction device which corrects the position of said substrate based on the detected position of said substrate.

11. An apparatus according to claim 8, wherein said off position is above said substrate stage.

12. An exposure apparatus which exposes a substrate held on a substrate stage with a pattern, comprising:
- an exposure system which exposes said substrate with said pattern;
- a first transfer device which transfers said substrate to an off-position at which said substrate is not placed on said substage stage;
- a position detecting device which detects the position of said substrate at said off-position by using a V-shaped cutout formed in said substrate;
- a second transfer device which transfers said substrate to an on-position at which said substrate is placed on said substrate stage; and
- a correction device which corrects the position of said substrate base on a detected result of the position detecting device while said substrate is transferred from said off-position to said on-position by the second transfer device.

13. An apparatus according to claim 12, wherein said detecting device is a noncontact-measurement type detecting device which detects the position of the substrate using a noncontact-measurement technique.

14. An apparatus according to claim 12, wherein said off position is above said substrate stage.

* * * * *